United States Patent
Welte

(10) Patent No.: US 11,385,539 B2
(45) Date of Patent: Jul. 12, 2022

(54) METHOD AND APPARATUS FOR COMPENSATING DEFECTS OF A MASK BLANK

(71) Applicant: Carl Zeiss SMS Ltd., Misgav (IL)

(72) Inventor: Joachim Welte, Darmstadt (DE)

(73) Assignee: Carl Zeiss SMS Ltd., D.N. Misgav (IL)

( * ) Notice: Subject to any disclaimer, the term of this patent is extended or adjusted under 35 U.S.C. 154(b) by 16 days.

(21) Appl. No.: 16/747,818

(22) Filed: Jan. 21, 2020

(65) Prior Publication Data

US 2020/0159111 A1 May 21, 2020

Related U.S. Application Data

(63) Continuation of application No. PCT/IB2018/055464, filed on Jul. 23, 2018.

(30) Foreign Application Priority Data

Jul. 26, 2017 (DE) .......................... 102017212848.8

(51) Int. Cl.
  *G03F 1/84* (2012.01)
  *G01N 21/88* (2006.01)
  (Continued)

(52) U.S. Cl.
  CPC ........... *G03F 1/84* (2013.01); *G01N 21/8851* (2013.01); *G01N 21/9501* (2013.01);
  (Continued)

(58) Field of Classification Search
  CPC ... B05D 5/005; G03F 1/22; G03F 1/24; G03F 1/72; G03F 1/84; G03F 7/7065;
  (Continued)

(56) References Cited

U.S. PATENT DOCUMENTS 8,592,102 B2   11/2013   Lin et al.
9,658,527 B2    5/2017   Dmitriev
               (Continued)

FOREIGN PATENT DOCUMENTS

DE   102006054820   5/2008   ............... G03F 7/20
DE   102011079382   1/2013   ............... G03F 1/72
                  (Continued)

OTHER PUBLICATIONS

Notice of Reasons for Refusal issued by the Japanese Patent Office for Japanese Application No. JP 2020-503924, dated Mar. 4, 2021 (with English Translation0.
(Continued)

*Primary Examiner* — Isiaka O Akanbi
(74) *Attorney, Agent, or Firm* — Fish & Richardson P.C.

(57) ABSTRACT

Method for compensating at least one defect of a mask blank, wherein the method includes the following steps: (a) obtaining data in respect of a position of the at least one defect of the mask blank; (b) obtaining design data for pattern elements which should be produced on the mask blank; (c) determining whether the at least one defect is arranged relative to a pattern element to be produced in such a way that it has substantially no effect when exposing a wafer using the mask blank that is provided with the pattern element to be produced; and (d) otherwise, displacing the at least one defect on the mask blank in such a way that it has substantially no effect when exposing the wafer using the mask blank that is provided with the pattern element to be produced.

20 Claims, 35 Drawing Sheets

(51) Int. Cl.
  *G01N 21/95* (2006.01)
  *G03F 7/20* (2006.01)
  *G06T 7/00* (2017.01)
(52) U.S. Cl.
  CPC .......... *G03F 7/7065* (2013.01); *G06T 7/0004* (2013.01); *G06T 2207/10061* (2013.01); *G06T 2207/30148* (2013.01)
(58) Field of Classification Search
  CPC ............ G03F 7/70033; G01N 21/8851; G01N 21/9501; G06T 7/0004; G06T 2207/10061; G06T 2207/30148
  USPC ...................... 356/237.1–237.6; 382/148–149
  See application file for complete search history.

(56) References Cited

U.S. PATENT DOCUMENTS

| | | | |
|---|---|---|---|
| 2012/0009511 | A1 | 1/2012 | Dmitriev |
| 2013/0078555 | A1* | 3/2013 | Orihara .................... G03F 1/60 430/5 |
| 2014/0106263 | A1 | 4/2014 | Utzny |
| 2014/0165236 | A1* | 6/2014 | Budach .................. G01Q 30/02 850/9 |
| 2015/0024307 | A1 | 1/2015 | Vannuffel et al. |
| 2015/0160550 | A1* | 6/2015 | Kim ......................... G03F 1/38 216/47 |
| 2015/0227038 | A1* | 8/2015 | Tu ......................... G03F 9/7069 355/53 |
| 2016/0004153 | A1* | 1/2016 | Shoki ..................... C23C 14/35 204/192.13 |
| 2017/0176851 | A1* | 6/2017 | Peters .................... B05D 5/005 |
| 2019/0170991 | A1* | 6/2019 | Seesselberg ........ G02B 21/0072 |

FOREIGN PATENT DOCUMENTS

| | | | | |
|---|---|---|---|---|
| DE | 102014217907 | | 3/2016 | ............... G03F 1/72 |
| JP | 2002-532738 | | 12/1999 | ............... G03F 1/24 |
| JP | 2012-022323 | | 2/2012 | ............... G03F 1/72 |
| JP | 2013-016720 | | 1/2013 | ........... H01L 12/027 |
| JP | 2014-90095 | | 5/2014 | ........... H01L 21/027 |
| JP | 2014-521230 | A | 8/2014 | ........... H01L 21/027 |
| KR | 1020160001988 | | 1/2016 | ........... H01L 21/027 |
| TW | 2013-10165 | | 3/2013 | |
| WO | WO 00/34828 | | 6/2000 | ............... G03F 1/00 |
| WO | WO 2013/010976 | | 1/2013 | ............... G03F 1/22 |

OTHER PUBLICATIONS

Notice of Reasons for Rejection issued by the Korean Intellectual Property Office for Korean Application No. KR 10-2020-7005630, dated Mar. 4, 2021 (with English Translation).
International Search Report and Written Opinion of the International Searching Authority for International Application No. PCT/IB2018/055464 dated Oct. 22, 2018.
German Office Action for German Application No. DE 10 2017 212 848.8 dated Mar. 7, 2018.
Taiwan Office Action and Search Report for Taiwan Application No. TW 107125911 dated Apr. 17, 2019.
Burns et al., "EUV mask defect mitigation through pattern placement", *Proceedings of the SPIE*, vol. 7823 (Sep. 2010).
Jonckheere et al "Overcoming EUV Mask Blank Defects: What We Can, and What We Should", *IMEC*, Photomask Japan 2017, Yokohama.
Negishi et al, "Using pattern shift to avoid blank defects during EUVL mask fabrication", *Proceedings of SPIE*, vol. 8701 (Jun. 28, 2013).
Seki et al., "Endeavour to Understand EUV Buried Defect Printability," *Proc. SPIE 9658, Photomask Japan 2015: Photomask and Next Generation Lithographic Mask Technology XXII*, (Jul. 2015).
Yan et al., "EUVL Multilayer Mask Blank Defect Mitigation for Defect-free EUVL Mask Fabrication", *Proceedings of SPIE*, vol. 8322, pp. 83220Z-1-83220Z-10 (Mar. 29, 2012).

* cited by examiner

Fig. 3 (Prior art)
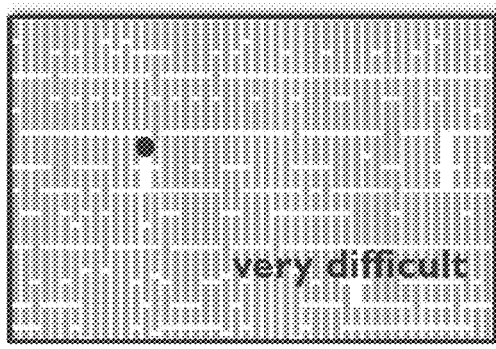
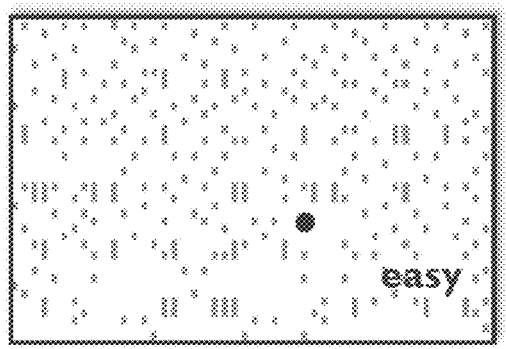
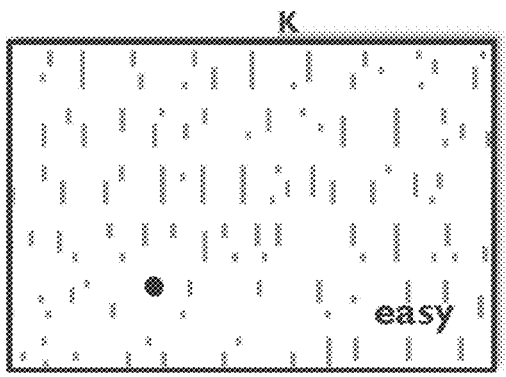

METHOD AND APPARATUS FOR COMPENSATING DEFECTS OF A MASK BLANK

CROSS-REFERENCE TO RELATED APPLICATIONS

This application is a continuation of and claims priority under 35 U.S.C. § 120 from PCT Application No. PCT/IB2018/055464, filed on Jul. 23, 2018, which claims priority from German Application No. DE 10 2017 212 848.8, filed on Jul. 26, 2017. The entire contents of each of these priority applications are incorporated herein by reference.

TECHNICAL FIELD

The present invention relates to a method and an apparatus for compensating defects of a mask blank.

BACKGROUND

As a consequence of the growing integration density in the semiconductor industry, photolithography masks have to image increasingly smaller structures on wafers. In order to take account of this trend, the exposure wavelength of lithography apparatuses is being shifted to ever shorter wavelengths. Future lithography systems will operate with wavelengths in the extreme ultraviolet (EUV) range (preferably but not exclusively in the range of 10 nm to 15 nm). The EUV wavelength range places huge demands on the precision of optical elements in the beam path of future lithography systems. These are expected to be reflective optical elements, since the refractive index of the currently known materials in the EUV range is substantially equal to one.

EUV mask blanks comprise a substrate exhibiting little thermal expansion, such as quartz, for instance. A multilayer structure comprising approximately 40 to 60 double layers comprising silicon (Si) and molybdenum (Mo), for example, is applied to the substrate, said layers acting as a dielectric mirror. Further, EUV mask blanks have a whole area layer, which absorbs the actinic wavelength. The whole-area absorption layer is structured; i.e., a structure or a pattern of absorbing pattern elements is produced in order to produce an EUV mask from the mask blank. Details are described in the context of FIG. 6.

On account of the extremely short wavelength, even tiny unevennesses of the multilayer structure are manifested in imaging aberrations of a wafer exposed by use of an EUV mask. Tiny unevennesses of the surface of the substrate typically propagate in the multilayer structure during the deposition of the multilayer structure onto the substrate. It is necessary, therefore, to use substrates for producing EUV masks whose surface roughness is less than 2 nm ($\lambda_{EUV}/4 \leq 4$ nm). At the present time it is not possible to produce substrates which satisfy these requirements with regard to the flatness of their surface. Small substrate defects ($\leq 20$ nm) are currently considered to be inherent to a chemical mechanical polishing process (CMP).

As already mentioned, unevennesses of the substrate surface propagate in the multilayer structure during the deposition thereof. In this case, the defects of the substrate can propagate through the substrate substantially without being changed. Furthermore, it is possible for a substrate defect to propagate in the multilayer structure in a manner reduced in size or else increased in size. Alongside the defects caused by the substrate, additional defects can arise in the multilayer structure itself during the deposition of the multilayer structure. This can occur for example as a result of particles which deposit on the substrate surface or between the individual layers and/or on the surface of the multilayer structure. Furthermore, defects can arise in the multilayer structure as a result of an imperfect layer sequence. Overall, therefore, the number of defects present in the multilayer structure is typically more than the number present on the surface of the substrate.

The defects of the mask blank are usually measured at the end of each process step, i.e., after the polishing process for the substrate, after depositing the multilayer structure and after depositing the whole-area absorbing layer. The defects which are visible on a wafer (printable defects) upon exposure of the EUV mask that was produced from the mask blank are typically compensated for or repaired. Compensating for a defect here means that said defect is substantially covered or overlaid by a pattern element, and so the defect is practically no longer visible upon exposure of a wafer using the EUV mask.

The publication "EUV mask defect mitigation through pattern placement" by J. Burns and M. Abbas, Photomask Technology 2010, edited by M. W. Montgomery, W. Maurer, Proc. of SPIE Vol. 7823, 782340-1782340-5, describes the search for a mask blank which matches a predefined mask layout, and the alignment of the selected mask blank relative to the predefined mask layout. The article "Using pattern shift to avoid blank defects during EUVL mask fabrication" by the authors Y. Negishi, Y. Fujita, K. Seki, T. Konishi, J. Rankin, S. Nash, E. Gallagher, A. Wagner, P. Thwaite and A. Elyat, Proc. SPIE 8701, Photomask and Next-Generation Lithography Mask Technology XX, 870112 (Jun. 28, 2013) is concerned with the question of how many defects of what size can be compensated for by shifting an absorber pattern. The publication "EUVL Multilayer Mask Blank Defect Mitigation for Defect-free EUVL Mask Fabrication" by P. Yan, Y Liu, M. Kamna, G Zhang, R. Chem and F. Martinez, in Extreme Ultraviolet (EUV) Lithography III, edited by P. P. Naulleau, O. R. Wood II, Proc. of SPIE, Vol. 8322, 83220Z-1-83220Z-10 describes a compromise between the maximum number of defects which can be covered by an absorber pattern, their defect size, the variation with which the position of the defects can be determined, and the variation in the positioning of the absorber structure. U.S. Pat. No. 8,592,102 B1 describes the compensation of defects of a mask blank by selecting, from a set of mask blanks, a defect pattern of a mask blank that fits best to an absorber pattern.

Authors R. Jonckheere et al., in the conference contribution "Overcoming EUV mask blank defects: what we can, and what we should," Apr. 5-7, 2017, Photomask, Japan 2017, describe an intended deformation of a pattern to be produced on a mask blank such that as few defects of the mask blank as possible, at best no defects of the mask blank, are visible on the mask, which has the produced deformed pattern. Then, the deformation of the pattern of the mask during the exposure of the wafer is undone by a specific setting of the parameters of the scanner such that the deformed pattern of the mask produces the intended pattern at the locations, provided therefor, in the photoresist arranged on a wafer.

The method described above makes the process flow more complicated. The information about the defects of the mask blank need already be present before producing the pattern or the pattern elements on the mask blank at the mask producer. Further, the deliberately produced deformation of the pattern of the mask must be supplied with the mask and compensated for by specific settings of the scanner prior to each exposure process carried out with the mask. Accordingly, the compensation of the deformed mask sets parameters of the scanner that are actually provided for optimizing the exposure process of the wafer. As a result, the process window of the exposure process is reduced.

The present invention is therefore based on the object of specifying a method and an apparatus for compensating at least one defect of a mask blank, which avoid the aforementioned disadvantages of the prior art at least in part.

SUMMARY

In accordance with a first aspect of the present invention, this problem is solved by a method for compensating at least one defect of a mask blank. The method includes the following steps: (a) obtaining data in respect of a position of the at least one defect of the mask blank; (b) obtaining design data for pattern elements which should be produced on the mask blank; (c) determining whether the at least one defect is arranged relative to a pattern element to be produced in such a way that it has substantially no effect when exposing a wafer using the mask blank that is provided with the pattern element to be produced; and (d) otherwise, displacing the at least one defect on the mask blank in such a way that it has substantially no effect when exposing the wafer using the mask blank that is provided with the pattern element to be produced.

The passage "that a defect has no effect when exposing a wafer using the mask blank that is provided with the pattern element to be produced" means, for a defect whose lateral dimensions are less than or equal to the dimensions of the pattern element, a modification of the position of the defect or displacement of the defect such that the latter lies under a pattern element to be produced on the mask blank, i.e., such that the latter is covered by a pattern element. Should the lateral dimensions of the defect be larger than the dimensions of a pattern element that is situated in the vicinity, the passage specified above means: modifying the position of the defect on the mask blank or displacing the defect such that the defect has a minimal effect on the exposure of the wafer with a mask produced from the mask blank. The defect preferably has a minimal effect on the exposure when the regions of the defect with the maximum deviation from a predetermined variable are covered by the pattern element.

The method according to the invention is directed to modifying defects on the mask blank in such a way that these, when producing a mask from the mask blank, do not appear as defects that are visible on a wafer, i.e., as printable defects. Hence, the described method presents a preventative compensation of defects of a mask blank. The method according to the invention precedes the mask writing process and it is completely decoupled from the latter. Likewise, the method according to the invention has no effect on the actual operation of the mask produced from the mask blank. Hence, said method does not intervene in the established process flows of either a mask production process or an exposure process carried out with the mask. In particular, the method according to the invention does not set any settings of the scanner. Consequently, a method according to the invention has no disadvantageous influence on the process window of an exposure process carried out with the mask.

Obtaining the data in respect of the position of the at least one defect may comprise: analyzing the mask blank with a mask blank inspection tool and/or reading the data in respect of the position of the at least one defect from a memory.

Carrying out the method defined above requires the positions of the defects of a mask blank as input variables. Typically, these are measured by an inspection tool for mask blanks at the actinic wavelength using optical measurement methods. For masks or mask blanks for the extreme ultraviolet (UV) wavelength range, the positions of defects can be measured currently with a measurement error in the region of approximately 10 nm. The positions of the defect are determined in respect of marks, so-called "fiducial marks," that are present on the mask blank.

The data in respect of the position of the defect may comprise: a position of maximum deviation from a predetermined variable and a lateral extent of the at least one defect. A deviation from a predetermined variable can be a local elevation of the mask blank (bump defect) or a local depression of the mask blank. Further, a deviation from a predetermined variable may comprise a local change in the phase front of the electromagnetic radiation that was reflected by the mask blank, without the defect manifesting itself in a local elevation or depression.

Determining whether the at least one defect is arranged relative to a pattern element to be produced in such a way that it has substantially no effect when exposing a wafer using the mask blank that is provided with the pattern element to be produced may comprise: superimposing the design data of the pattern elements and the data in respect of the position of the at least one defect.

The geometric relationships between the pattern elements to be produced on the mask blank and the defects present on the mask blank can be determined from the design data and the positions of the defects on the mask blank.

Displacing the at least one defect on the mask blank may comprise: determining parameters of a vector which describes a displacement of the at least one defect in such a way that the latter has substantially no effect.

Preferably, the at least one defect is displaced parallel to the surface of a substrate of a mask blank on which the multilayer structure of the mask blank is arranged. Should the displacement be carried out in this way, the displacement vector is a two-dimensional vector characterized by two parameters.

The displacement can be determined in such a way that the vector has a minimum length. This requires a minimal displacement of the defect and it is expedient, in particular, if the defect lies in isolation on the mask blank, i.e., if said defect has a large distance from other defects present on the mask blank such that the displacement of the defect lying in isolation does not substantially influence the positions of the defects lying at a distance.

Should the term "substantially" not be used in the above-defined content, it means here, as elsewhere in the present description, an indication or a numerical indication of a variable within the measurement errors customary in the prior art.

A resolution of the displacement of the at least one defect can lie in the sub-nanometer range and/or a displacement vector can have a length in the range from 0.1 nm to 500 nm. A displacement of a defect can go beyond the region of 500 nm. However, the outlay required to this end increases significantly. Further, the displacement of defects over distances that are greater than 500 nm may cause unwanted side-effects such as a curvature of the substrate, and hence of the mask blank, for example. The relative error of a displacement of a defect typically lies in the region of 5% to 10%.

The method defined above may further include the step of: producing the pattern elements on the mask blank after displacing the at least one defect. By virtue of defects on the mask blank being compensated for in preventative fashion such that these have no effect on the mask produced by the mask blank, firstly, decoupling of the defect compensation from the production and, in particular, the operation of the mask produced from the mask blank is achieved and, secondly, a subsequent repair, for example by a compensational repair, is avoided.

In this application, the terms "photolithographic mask," "photomask" or simply "mask" are used synonymously.

The parameters of the vectors of the defects present on a mask can be determined in such a way that the defects present on the mask blank have substantially no effect after producing the pattern elements to be produced.

Should a plurality of defects to be compensated for be present on a mask blank, the displacement of a defect can modify the position of one or more adjacent defects. The displacement processes of the defects to be compensated can be optimized in such a way that the outlay for displacing all defects to be compensated is minimized.

Displacing the at least one defect may comprise: introducing at least one pixel arrangement into a substrate of the mask blank. The at least one pixel arrangement can be introduced into the substrate in such a way that the at least one defect is displaced toward a pattern element to be produced and/or the at least one defect is displaced by certain distance substantially parallel to a surface of the mask blank. Introducing the at least one pixel arrangement into the substrate may comprise: producing the pixels of the pixel arrangement by focusing ultrashort laser pulses into at least one plane of the substrate of the mask blank. The ultrashort laser pulses can be radiated into the substrate from a rear side of the mask blank.

A pixel produces a local deformation element in a material. By introducing or writing a pixel into a material, the substrate of a mask blank, for instance, the material is locally molten for an extremely short period of time. This results in a local reduction in the density of the material at the position at which the pixel was produced. The deformation element produced by the pixel can produce a substantially isotropic deformation element. However, the parameters of the laser system used to write the pixels are preferably set in such a way that a deformation element in the form of a spheroid arises, the semi-major axis of which is aligned in the direction of the laser beam which writes the pixel and thereby generates the local deformation element. Often what is desired is that a pixel produces a deformation element in the form of an ellipsoid, the semi-axes of which perpendicular to the beam direction differ.

The effects of a plurality of pixels that were produced spatially close together are cumulative. What this means is that the introduction or writing of a pixel arrangement into a material stretches the entire material. A pixel arrangement typically is a two-dimensional arrangement of pixels in a plane of a material. A pixel arrangement is frequently characterized by a two-dimensional pixel density. The pixel density can be constant within a pixel arrangement or it can vary in one or both spatial directions. In order to cause large changes in a material, a plurality of pixel arrangements can be introduced in different planes of a material or of a substrate of a photomask.

Details of the processes for the local displacement of structures on photomasks by the introduction or writing of one or more pixel arrangements in the substrate thereof are described in the US patent of the applicant numbered U.S. Pat. No. 9,658,527 B2. These details are not repeated in the present application.

The method according to the invention may further include the step of: determining at least one change relative to the design data of at least one pattern element to be produced for the purposes of compensating the at least one defect.

The above-defined method can be combined with methods that modify one, several or many, for example substantially all, pattern elements of the pattern to be produced from the mask blank. By combining the displacement of the defects and the modification of the pattern, the number of defects of a mask blank to be compensated for can be significantly increased where necessary. Moreover, dividing the defect compensation among two independent compensation measures opens up the minimization of the overall outlay for compensating a number of defects of a mask blank. However, this is to the detriment of the above-described decoupling of defect compensation and mask production or operation of the mask produced by the mask blank.

Further, the method according to the invention can be combined with the various measures, specified in the introductory part, for improving the compensation of defects with the aid of a pattern to be produced on the mask blank.

Determining the at least one modification of the at least one pattern element may comprise: determining parameters for an imaging transformation relative to the design data of the pattern elements to be produced.

The imaging transformation of the pattern produced on the mask blank must be undone or compensated for by parameter settings of the scanner when exposing a wafer with the mask produced from the mask blank, the pattern of which was subjected to an imaging transformation. By virtue of the pattern to be produced on the mask blank being subjected to an imaging transformation prior to its production, the compensation of the defects of the mask blank is subdivided among two independent compensation measures and made simpler thereby. However, as already explained above, a disadvantage here lies in the fact that the defect compensation has an effect on the operation of the mask produced from a mask blank.

The imaging transformation may comprise a linear imaging transformation and the parameters of the linear imaging transformation may comprise: parameters for scaling relative to the design data the pattern elements to be produced, parameters for displacing relative to the design data the pattern elements to be produced, and parameters for rotating relative to the design data the pattern elements to be produced.

Overall, the parameter set for a linear imaging comprises six parameters: two parameters for a mask scaling, i.e., a change in size of the mask, two parameters for a mask displacement and two parameters for a generalized rotation of the mask. Details are explained in the patent document U.S. Pat. No. 9,658,527 B2 of the applicant cited above.

The imaging transformation may comprise a nonlinear imaging transformation. The nonlinear imaging transformation may comprise distortions up to the third power of the pattern produced on the mask blank. The parameters of the nonlinear imaging transformation may vary over the mask. Further, a linear and a nonlinear imaging transformation of a pattern to be produced can be combined.

The size of the parameter values of the performable imaging transformations of the pattern to be produced on the mask blank is limited by the options of the scanner for compensating the imaging transformation of the pattern of the mask when exposing a wafer.

Carrying out the imaging transformation and displacing the at least one defect can cause the at least one defect to have substantially no effect when exposing a wafer using the mask blank that has been provided with the pattern element to be produced.

Determining the parameters of the imaging transformation and the parameters of a displacement of the at least one defect can be implemented in a common optimization process.

Simultaneously determining the parameters of the two compensation measures creates an extended solution space for the common optimization process. As a result, an extent of the correction of the defects present on the mask blank is facilitated which is not achievable by a step-by-step optimization process of the two correction measures. As a result, a common optimization process of the defect compensation increases the yield when producing masks from blanks that have printable defects.

Determining the parameters of the imaging transformation and the parameters of the displacement of the at least one defect can comprise: formulating a target functional which comprises design data, data in respect of a position of the at least one defect, the parameters of the imaging transformation and the parameters of displacement of the at least one defect, and minimizing the target functional by simultaneously varying the parameters of the imaging transformation and the parameters of the displacement. Once again, details in this respect are provided in the patent document U.S. Pat. No. 9,658,527 B2 of the applicant cited above.

The method defined above may further include the step of: producing the pattern elements provided with the imaging transformation on the mask blank after displacing the at least one defect.

What is currently preferred is to determine the parameters of both compensation measures of displacing the defect on the mask blank and of carrying out an imaging transformation at the pattern to be produced in a common optimization process. In the next step, the defects of the mask blank are then subjected to a displacement process and the pattern previously subjected to an imaging transformation is finally generated on the mask blank.

The imaging transformation of the pattern to be produced and the displacement of the defects can be carried out in a step-by-step optimization process. This applies independently of the sequence of carrying out the two compensation measures. The embodiment in which at least one change of at least one pattern element in respect of the design data is carried out in the first step is currently preferred.

A disadvantage of a sequential optimization process is that an analysis step has to be carried out after carrying out the first compensation measure in order to establish the input data for the second optimization process.

Determining at least one modification of at least one pattern element relative to the design data for the purposes of compensating the at least one defect can comprise: locally modifying a contour of at least one pattern element to be produced.

In addition to the above-described global modification in the form of an imaging transformation of a pattern to be produced on a mask blank, the at least one modification of at least one pattern element to be produced may also comprise the local modification of an individual or a few pattern elements of a pattern to be produced on a mask blank. By way of example, a local modification of the contour of an individual pattern element can be used when, on account of its size, a defect cannot be completely covered by a pattern element. The local modification of one or a few pattern elements before the generation thereof, i.e., on the basis of design data, may be referred to as "pre-compensational repair".

The local modification of the contour of a pattern element to be produced requires as input data the position of the defect to be compensated with a very high spatial resolution (≤10 nm).

The method according to the invention may further include the step of: producing the pattern elements to be produced provided with the imaging transformation on the mask blank, before carrying out steps a. to d. of the method specified above.

However, after determining the two parameter sets for the two compensation measures, it is also possible to initially produce on the mask blank the pattern subjected to an imaging transformation and thereupon displace local parts of the pattern together with the defect or defects. Here, it should be noted that the sequence of the compensation measures carried out subsequently has an influence on the parameter values, determined in the common optimization process, for the displacements and the imaging transformation and therefore needs to be set before the start of the common optimization process.

Locally modifying the contour of the at least one pattern element to be produced and displacing the at least one defect can cause the at least one defect to have substantially no effect when exposing a wafer using the mask blank that has been provided with the pattern element.

Locally modifying the contour of the at least one pattern element to be produced can substantially not change the contours and/or the positions of adjacent pattern elements to be produced, the contours of which are not modified. This ensures that the local modification of a contour of the pattern element to be produced has substantially no effects on adjacent pattern elements to be produced.

The local modification of the contour of at least one pattern element to be produced may comprise: increasing and/or reducing the contour of the at least one pattern element to be produced.

Determining the at least one modification of the at least one pattern element to be produced may comprise: determining parameters for an imaging transformation relative to the design data of the pattern elements to be produced and locally modifying a contour of at least one pattern element to be produced.

It is possible to combine carrying out a global imaging transformation and locally modifying the contour of at least one pattern element of a pattern to be produced on a mask blank.

Determining the parameters of the imaging transformation, the parameters of a displacement of the at least one defect and the parameters for locally modifying a contour of at least one pattern element to be produced can be implemented in a common optimization process.

The advantages of a common optimization process have already been explained above. These advantages will be further increased when determining the parameters for three compensation measures for defects of mask blanks together.

The method according to the invention may further include the step of: locally modifying at least one pattern element produced on the mask blank such that the at least one defect has substantially no effect when exposing a wafer using the mask blank that has been provided with the produced pattern element.

Determining the parameters of the imaging transformation, the parameters of a displacement of the at least one defect, the parameters for locally modifying a contour of at least one pattern element to be produced and the parameters for locally modifying at least one pattern element produced on the mask blank can be implemented in a common optimization process.

The pattern elements to be produced on the mask blank can have absorbing pattern elements that substantially completely absorb electromagnetic radiation at an actinic wavelength.

The mask blank may comprise a mask blank of a photolithographic mask for the extreme ultraviolet (EUV) wavelength range.

Preferably, the above-defined method is applied for compensating defects of mask blanks that are used for producing EUV masks. As explained in the introductory part, the most stringent requirements in respect of printable defects exist for these masks. However, the method explained above can also be used for compensating defects for mask blanks that lead to transmitting photomasks. When compensating defects of a transmitting photomask, the transmission change of the mask that is caused by the introduction of a pixel arrangement for displacing the at least one defect must be compensated for by additionally writing one or more pixel arrangements. Details in this respect are explained in the patent document of the applicant cited above (U.S. Pat. No. 9,658,527 B2).

A computer program may contain instructions which, when executed by a computer system, prompt the computer system to carry out the method steps of the aspects specified above.

According to a second aspect of the present invention, the problem specified above is solved by an apparatus for compensating at least one defect of a mask blank. The apparatus has: (a) means for obtaining data in respect of a position of the at least one defect of the mask blank; (b) means of obtaining design data for pattern elements which should be produced on the mask blank; (c) means for determining whether the at least one defect is arranged relative to a pattern element to be produced in such a way that it has substantially no effect when exposing a wafer using the mask blank that is provided with the pattern element to be produced; and (d) means for displacing the at least one defect on the mask blank in such a way that it has substantially no effect when exposing the wafer using the mask blank that is provided with the pattern element to be produced.

The apparatus may be embodied to carry out the method steps of the above-described aspects.

DESCRIPTION OF DRAWINGS

The following detailed description describes currently preferred exemplary embodiments of the invention, with reference being made to the drawings, in which:

FIG. 3 schematically shows four examples of pattern elements from the prior art, the pattern size and pattern density of which are very different;

DETAILED DESCRIPTION

Below, a few explanations in respect of the prior art are provided first so that a few of the currently preferred embodiments of a method according to the invention and of an apparatus according to the invention for compensating defects of mask blanks for producing photolithographic masks for the extreme ultraviolet (EUV) wavelength range can be subsequently discussed in more detail. However, the method according to the invention for compensating defects of a mask blank is not restricted to the examples discussed below. Rather, said method can be used for compensating the defects of reflecting and transmitting photomasks. Moreover, the method described below can be combined without problems with the currently known methods for compensating defects of mask blanks with the aid of pattern elements.

Figure 1:
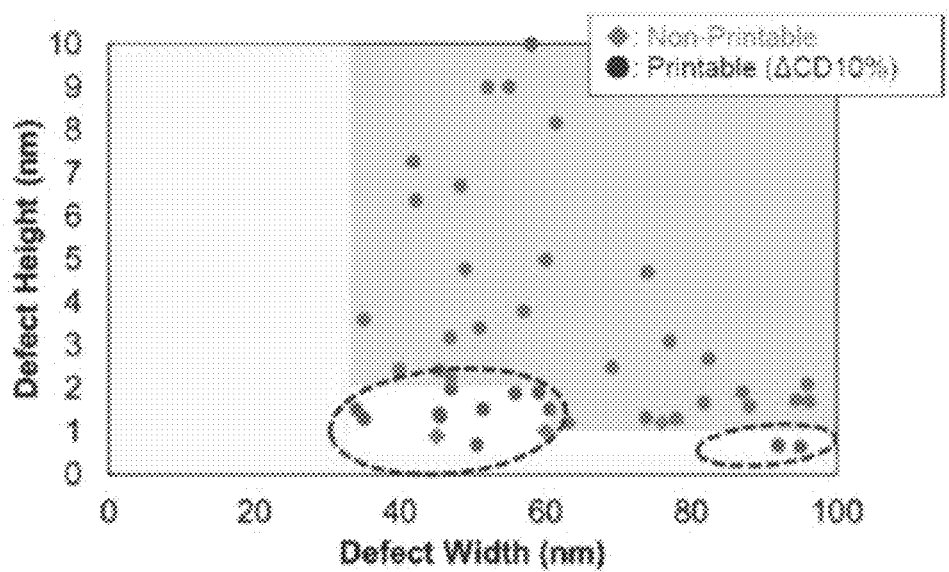
FIG. 1 presents an example of a size distribution of the defects of a mask blank for the extreme ultraviolet (EUV) wavelength range from the prior art.

FIG. 1 (from the prior art) has been gathered from the conference contribution "Endeavour to Understand EUV Buried Defect Printability," K. Seki et al., Proc. SPIE 9658, Photomask Japan 2015: Photomask and Next Generation Lithographic Mask Technology XXII, July 2015. It shows that defects with a height deviation of approximately 1 nm and a lateral extent of less than 40 nm already can lead to printable defects in wafers in the EUV wavelength range. A variation, caused by a defect, of the critical dimension (CD) of 10% is defined as a criterion for a printable defect in FIG. 1.

Figure 2A:
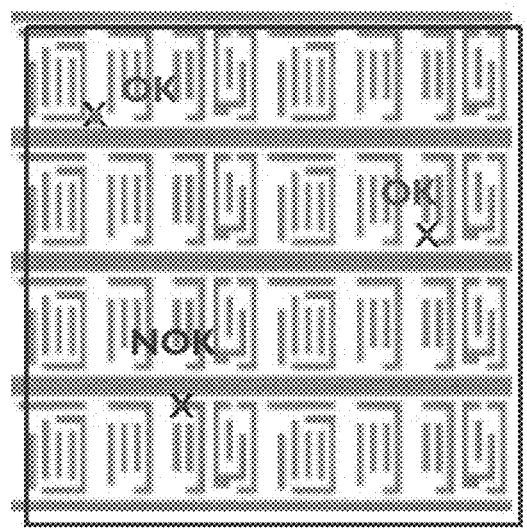
FIGS. 2A-2C show an example of a displaced pattern from the prior art (light background), a pattern rotated by 90° and a pattern rotated through a small angle on a mask blank which has three defects.
Figure 2B:
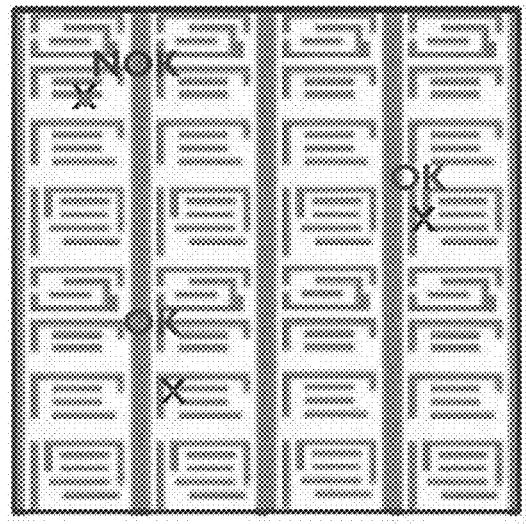
Figure 2C:
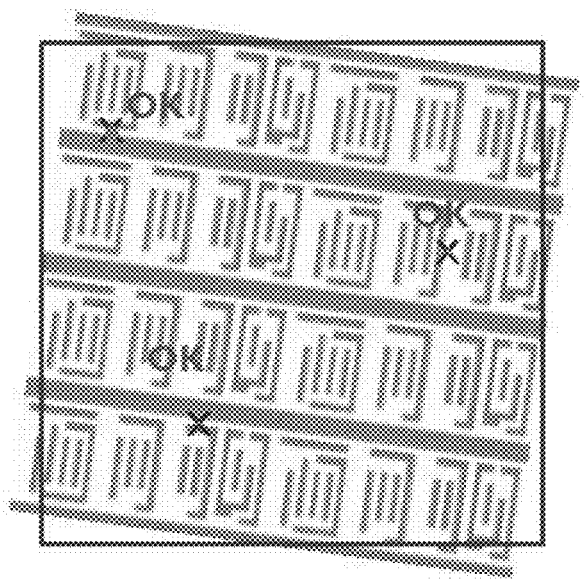

FIGS. 2A-2C and FIGS. 3 to 5 have been gathered from the conference contribution "Overcoming EUV mask blank defects: what we can, and what we should" by R. Jonckheere et al., Apr. 5-7, 2017, Photomask Japan 2017. In FIGS. 2A to 2C, three defects are present in a mask blank (illustrated by crosses), the intention being to cover said defects by pattern elements in such a way that these defects are not visible when exposing the mask. In FIGS. 2A to 2C, the white areas are absorbing pattern elements and the dark areas are regions of the multilayer structure of an EUV mask. FIG. 2A shows a displacement of the pattern elements relative to a reference frame (illustrated in black), which is set by marks (fiducial marks) on the mask blank. By a displacement in the −x and +y direction of the pattern to be produced, it is possible to displace the absorbing pattern in such a way that two of the three defects come to rest under pattern elements.

As specified in FIG. 2B, two of the three defects of the mask blank are covered by pattern elements and compensated thereby by way of a rotation of the pattern to be produced through 90° relative to the marks of the mask blank about an axis perpendicular to the multilayer structure of the mask blank. As a comparison with FIG. 2A shows, however, the compensated defects are not identical to the defects that were compensated by the displacement of the pattern elements.

FIG. 2C presents a rotation of the pattern to be produced through a few degrees about an axis that is perpendicular to the surface of the multilayer structure of the mask blank. As a result of the rotation specified in FIG. 2C, it is possible to hide all three defects of the mask blank under pattern elements. By rotating the mask by way of the scanner in the opposite direction before carrying out an exposure process, the imaging transformation in the form of the pattern rotation in respect of the mark system of the mask blank or the mask is undone.

Like all other imaging transformations discussed below, the various imaging transformations of the pattern elements in FIGS. 2A to 2C are subject to the constraint that the deliberately introduced change(s) of the pattern elements on the mask in respect of the design data can be compensated for by a stepper of the lithography system.

FIG. 3 (likewise prior art) features four different patterns whose pattern elements have very different pattern sizes and pattern densities. Like in FIG. 2, the bright regions represent absorbing pattern elements and the dark regions show the multilayer structure of EUV masks. A defect of a mask blank to be compensated for is specified in an exemplary manner in each partial image. The two right-hand partial images in FIG. 3 show patterns whose pattern elements are, firstly, large in comparison with the size of the defect to be compensated. Secondly, the area of the pattern elements is significantly larger than the area in which the multilayer structure is visible. As a result, it is easily possible, for both patterns of the right-hand partial images of FIG. 3, for the pattern to be produced on the mask blank to be arranged in such a way that the defect shows no effect, i.e., the defect is covered by a pattern element.

In the left-hand partial images, the pattern elements are, on average, significantly smaller and the area of the mask in which the reflecting or transmitting regions are exposed has become significantly larger in comparison with the right-hand partial images of FIG. 3. As a result, the compensation of the defects becomes significantly more difficult. From the partial image top left, in particular, it is possible to gather that the most difficult conditions for compensating a defect occur in a pattern which has uniform linear pattern elements (L/S (line/space) arrangement) that are arranged with a regular spacing, with the width of a pattern element and the distance thereof from an adjacent pattern element being identical. In relatively large regions of a pattern with an L/S arrangement, a completed defect compensation is restricted to defects whose smallest lateral dimension are no greater than the width of an absorbing pattern element.

Figure 4A:
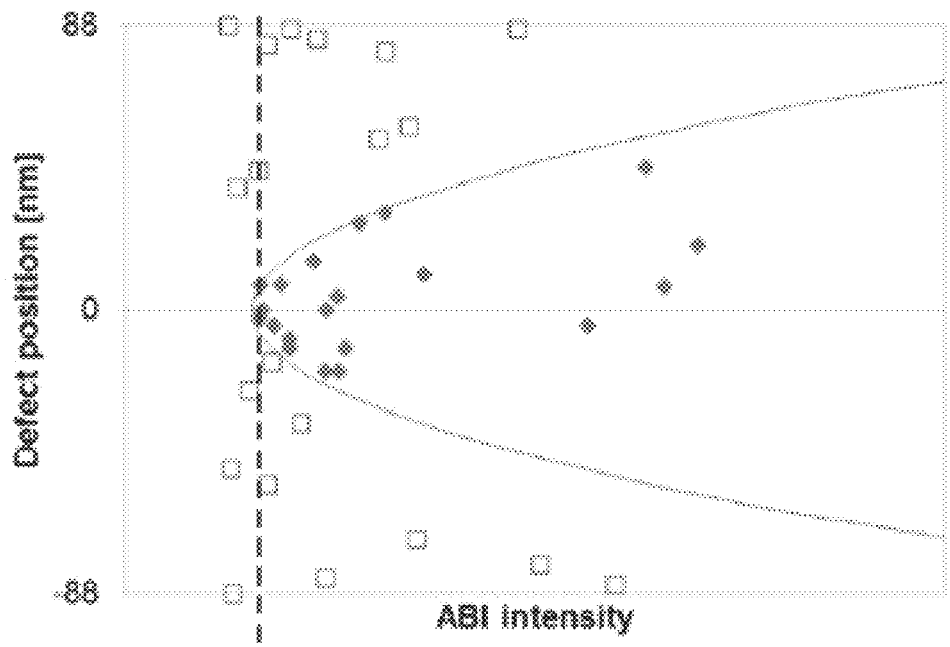
FIGS. 4A-4C show three examples of defect distributions from the prior art for linear pattern elements arranged at regular distances (L/S (line/space) arrangement) with a reducing width and spacing of the pattern elements, i.e., with a decreasing half pitch.
Figure 4B:
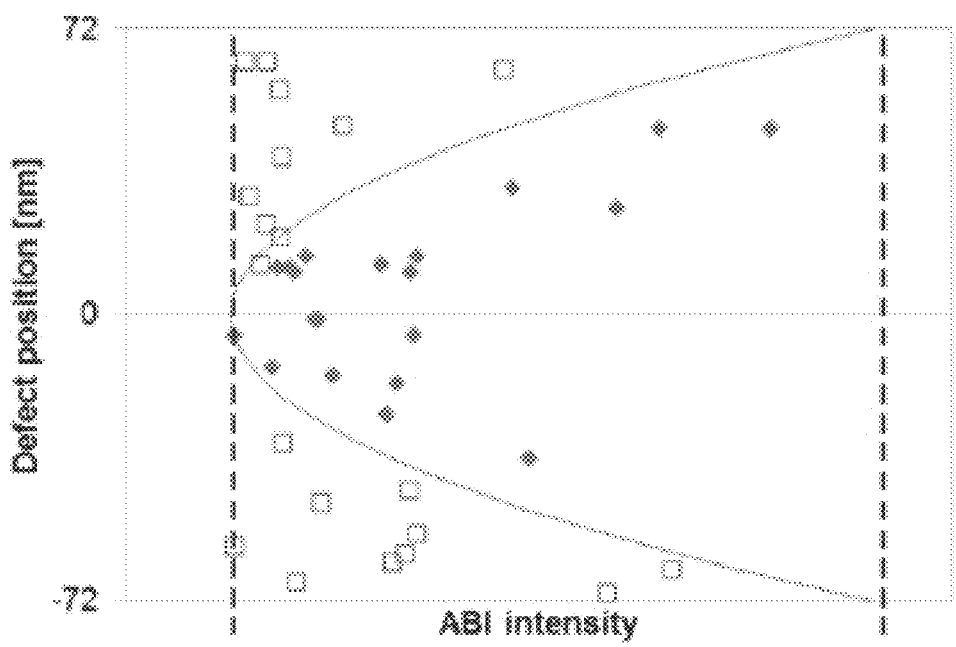
Figure 4C:
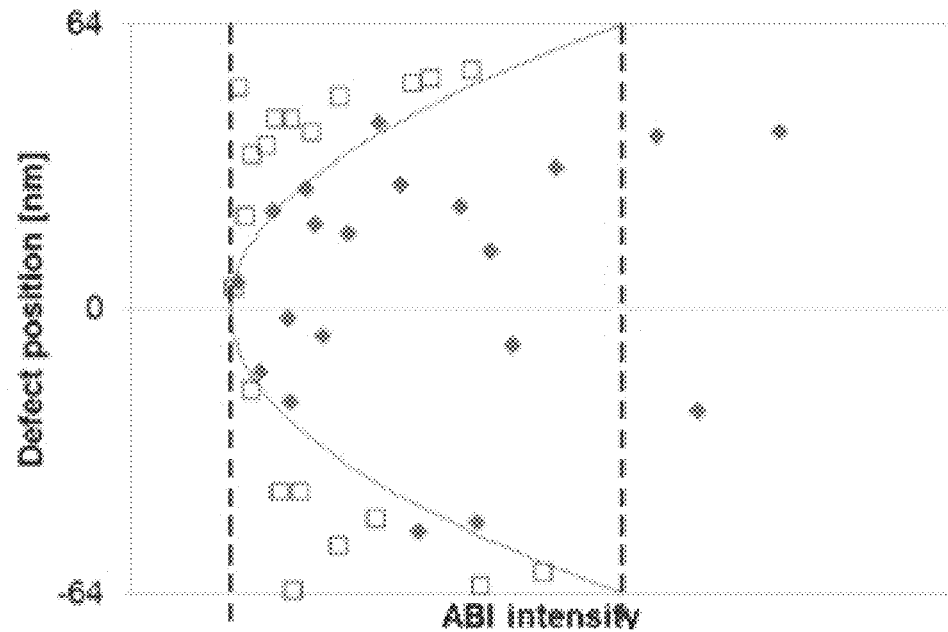

In FIGS. 4A to 4C, defect distributions are illustrated as a function of the ABI (Actinic Blank Inspection) intensity for different L/S arrangements, with the width of the individual pattern elements or the spacing thereof being the parameter of the individual figures. The width of the individual pattern elements or the spacing thereof is specified as half pitch in the art. Here, the half pitch denotes half the distance of a pattern element and half the distance to the adjacent pattern element. Consequently, the expression half pitch likewise describes the width of a pattern element and the distance of a pattern element to the adjacent pattern element in an L/S arrangement. The expression half pitch relates to the L/S structure that a mask produces on a wafer. Since the projection lens between the mask and the wafer projects the structure element or the pattern of the mask with the reduction in size by, typically, a factor of 4 or 5, the pattern elements of a mask are larger by the factor of 4 or 5. In an anamorphic projection, the reduction in one direction (for example, the x-direction) can have a factor of 4 and, in a direction perpendicular thereto (for instance, the y-direction), it can have a factor of 8, for example.

In the diagrams of FIGS. 4A to 4C, the zero point of the ordinate denotes the center between two elements of the L/S arrangement. The largest and the smallest numerical value of the ordinate specifies the distance to the centers of adjacent elements of the L/S arrangement and accordingly describes a distance corresponding to twice the half pitch.

FIG. 4A shows a defect distribution in respect of an L/S arrangement with a half pitch of 22 nm. All defects illustrated in the distribution of FIGS. 4A to 4C have lateral dimensions that are smaller than the half pitch. In the region to the left of the vertically dashed line, the ABI intensity of the detected defects is too low to lead to printable defects on a wafer. The defects illustrated as white squares in FIGS. 4A to 4C lie under a pattern element or lie in the direct vicinity of a pattern element and likewise do not lead to effects that are visible on a wafer. Defects that lead to changes visible on a wafer lie within the parabola in FIGS. 4A to 4C. In FIGS. 4A to 4C, these defects are illustrated by black squares. By way of example, these defects can be compensated by displacing a pattern to be produced on a mask blank. Further, these defects can be compensated with the aid of the method according to the invention without modifying the pattern to be produced. In FIG. 4A, all defects of the defect distribution that require a compensation, i.e., the defects that lie within the parabola and that are illustrated by black squares, can be compensated.

FIG. 4B reproduces a defect distribution of a mask blank on which an L/S arrangement with a half pitch of 18 nm is intended to be produced. In addition to what is plotted in FIG. 4A, FIG. 4B plots a second right-hand dashed vertical line, which specifies a region to the right of this line in which the defects present on the mask blank no longer can be compensated for on account of their size. No defect lies in this region for a half pitch of 18 nm, and so all defects can be compensated for with the aid of a method according to the invention.

FIG. 4C presents a defect distribution of a mask blank on which an L/S arrangement with a half pitch of 16 nm is intended to be manufactured. The right-hand dashed line has been clearly displaced to the left in relation to FIG. 4B. Now, three defects which, on account of the size, can no longer be compensated for completely with imaging transformation of the pattern lie in this region of the ABI intensity for the L/S arrangement with a half pitch of 16 nm. Further, on account of their size, these defects likewise can no longer be compensated for completely by a method according to the invention. Below, in the context of the discussion of FIGS. 30 to 35, there are explanations as to how the effect of these three defects nevertheless can be largely avoided when exposing the wafer.

Figure 5:
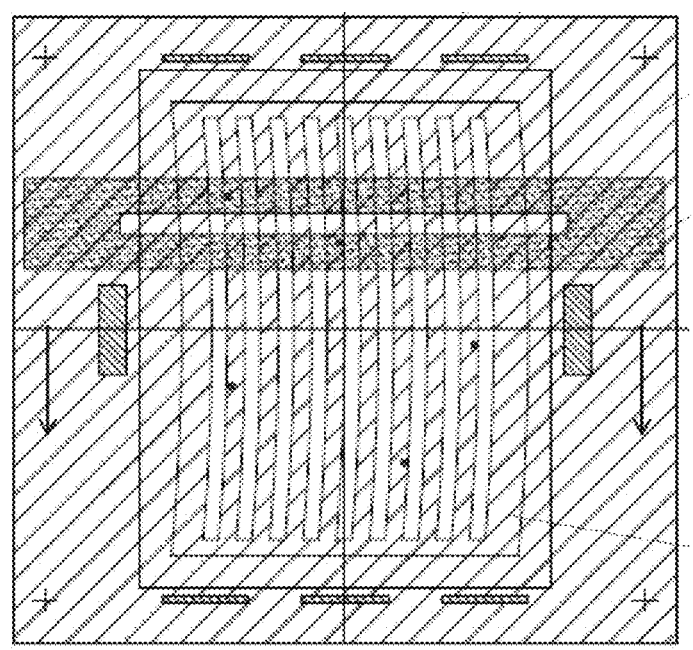
FIG. 5 reproduces a mask with a deformed L/S arrangement from the prior art.

FIG. 5 shows a photomask for the EUV wavelength range from the prior art. The regions of the mask that have an absorbing layer are denoted by diagonal hatching in FIG. 5. The exposure slot of the scanner is indicated above the mask by the dark-grey region, said exposure slot being moved over the mask for the purposes of exposing the wafer. Marks in the form of crosses are applied to the four corners of the mask, said marks serving to align the mask in relation to a wafer to be exposed.

Further, five defects are present on the mask of FIG. 5, said defects being presented by black dots. The mask of FIG. 5 has a vertical L/S arrangement. In order to simultaneously hide all five defects under the pattern elements of the L/S arrangement and thereby compensate these, the pattern of the mask has been subjected to a nonlinear imaging transformation or a second-order distortion, which is described by the following equations: $dx=k \cdot y^2$ and $dy=0$. Before exposing the wafer by the scanner, appropriately setting the parameters of the scanner ensures that the imaging transformation of the mask is not reproduced on the wafer. The possibilities for correcting distortions of the mask of the scanner used for exposing a wafer consequently sets the extent of the deliberate imaging transformation that is possible for compensating defects that are present on mask blanks. As already explained above, the gravest disadvantage of this compensation method is that a majority of the parameter settings of the scanner are already set when manufacturing the mask. Originally, these parameters settings were provided for optimizing the exposure process of a wafer. As a result, the process window of the exposure process for wafers is drastically reduced.

Figure 6:
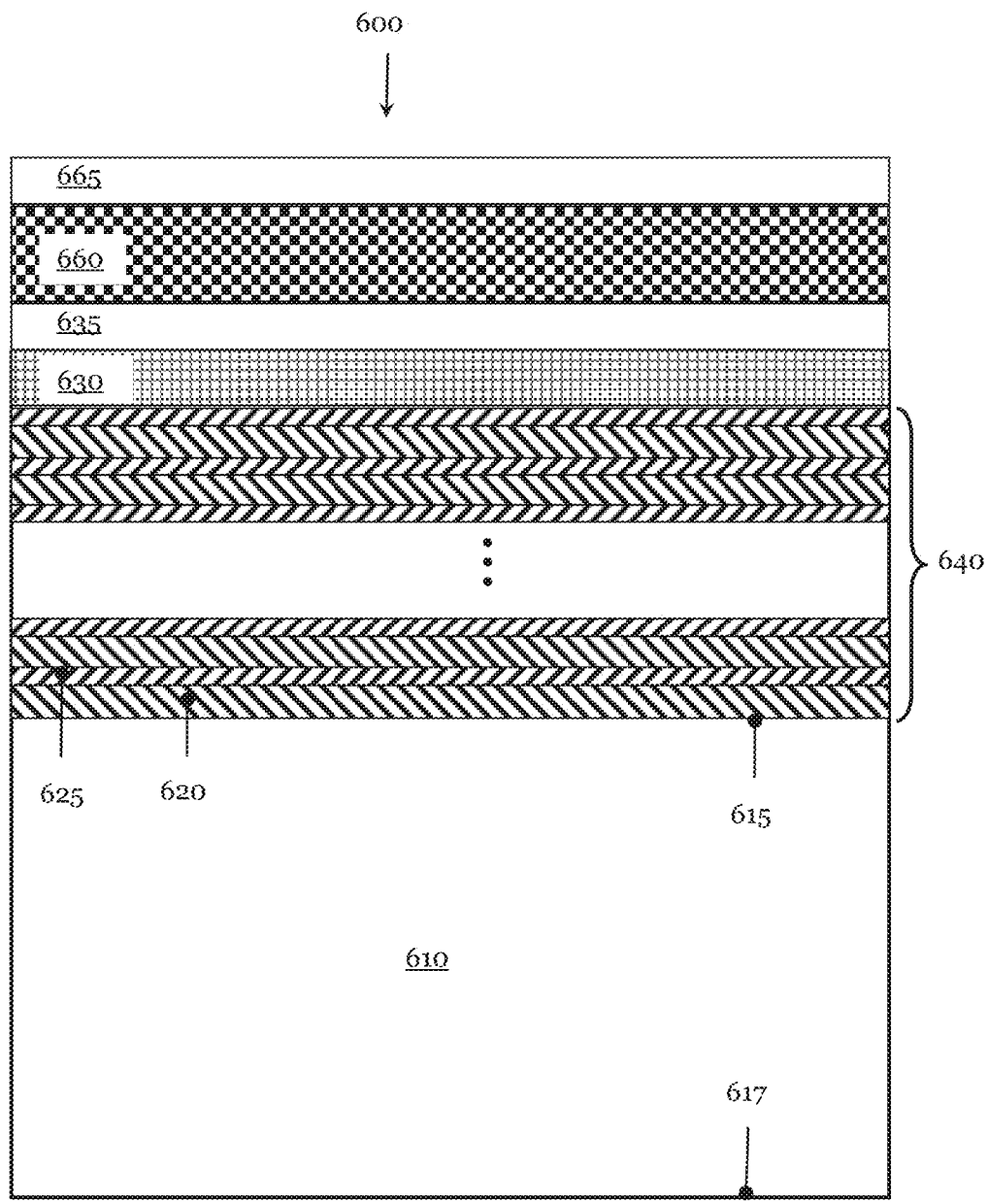
FIG. 6 shows a schematic section through the layer structure of a mask blank for the EUV wavelength range.

FIG. 6 shows a schematic section through an ideal, i.e., defect-free, EUV mask blank 600 for an exposure wavelength in the region of 13.5 nm. The EUV mask blank 100 has a substrate 610 made of a material with a low coefficient of thermal expansion, such as quartz, for example. Other dielectrics, glass materials or semiconducting materials likewise can be used as substrates for EUV masks, such as ZERODUR®, ULE® or CLEARCERAM®, for instance. The rear side 617 of the substrate 610 of the EUV mask blank 160 serves to hold the substrate 610 during the production of the EUV mask blank 600, the subsequent production of an EUV mask and during the operation of said EUV mask.

Typically, an optically partly transparent and/or electrically conductive layer (not illustrated in FIG. 6) is applied to the rear side 617 of the substrate 610 for holding the substrate 610 during the production of a mask blank 600 or a photomask. This thin (of the order of 20 nm), rear-side layer may comprise indium tin oxide (ITO), for example.

A multilayer film or a multilayer structure 640 comprising 20 to 80 pairs of alternating molybdenum (Mo) 620 and silicon (Si) layers 625, which are also denoted MoSi layers below, is deposited onto the front side 615 of the substrate 610. The thickness of the Mo layers 620 is 4.15 nm and the Si layers 625 have a thickness of 2.80 nm. In order to protect the multilayer structure 640, a capping layer 630 made of silicon dioxide, for example, typically having a thickness of preferably 7 nm, is applied on the topmost silicon layer 625. Other materials such as ruthenium (Ru), for example, can likewise be used for forming a capping layer 630. Instead of molybdenum, in the MoSi layers it is possible to use layers composed of other elements having a high mass number, such as cobalt (Co), nickel (Ni), tungsten (W), rhenium (Re) and iridium (Ir), for instance. The deposition of the multilayer structure 640 can be effectuated by ion beam deposition (IBD), for example.

A buffer layer 635 is deposited on the capping layer 630. Possible buffer layer materials are quartz ($SiO_2$), silicon oxygen nitride (SiON), Ru, chromium (Cr) and/or chromium nitride (CrN). An absorption layer 660 is deposited on the buffer layer 635. Materials suitable for the absorption layer 660 are, inter alia, Cr, titanium nitride (TiN) and/or tantalum nitride (TaN). An antireflection layer 665, for example composed of tantalum oxynitride (TaON), can be applied on the absorption layer 660.

Figure 7:
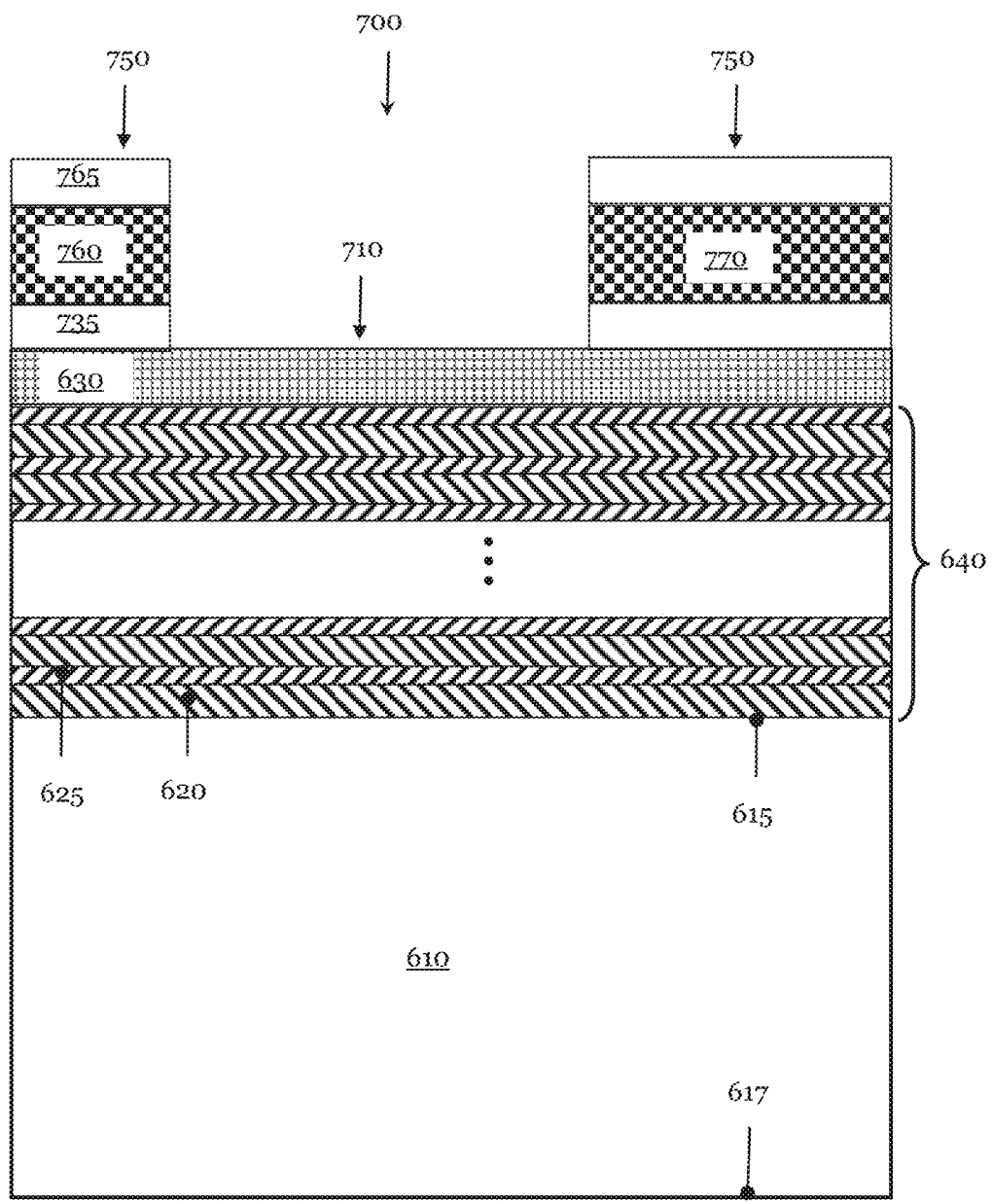
FIG. 7 presents a schematic section through an EUV mask produced from the mask blank of FIG. 6.

FIG. 7 presents a schematic section through an EUV mask 700 that was produced from the mask blank 600 of FIG. 6. To this end, the absorption layer 660 is structured, with the aid of an electron beam or a laser beam, for example, such that pattern elements 60, 770 of an absorbing pattern 750 are produced from the whole-area absorption layer 660. The buffer layer 635 serves to protect the multilayer structure 640 when structuring the absorption layer 660 for producing the pattern 750.

EUV photons (not illustrated in FIG. 7) are incident on the EUV mask 700. These are absorbed in the regions of the mask 700 that have the pattern elements 760, 770 of the pattern 750 and the EUV photons are reflected by the multilayer structure 640 in the regions 710 that are freed from the pattern elements 760, 770 of the pattern 750.

Figure 8:
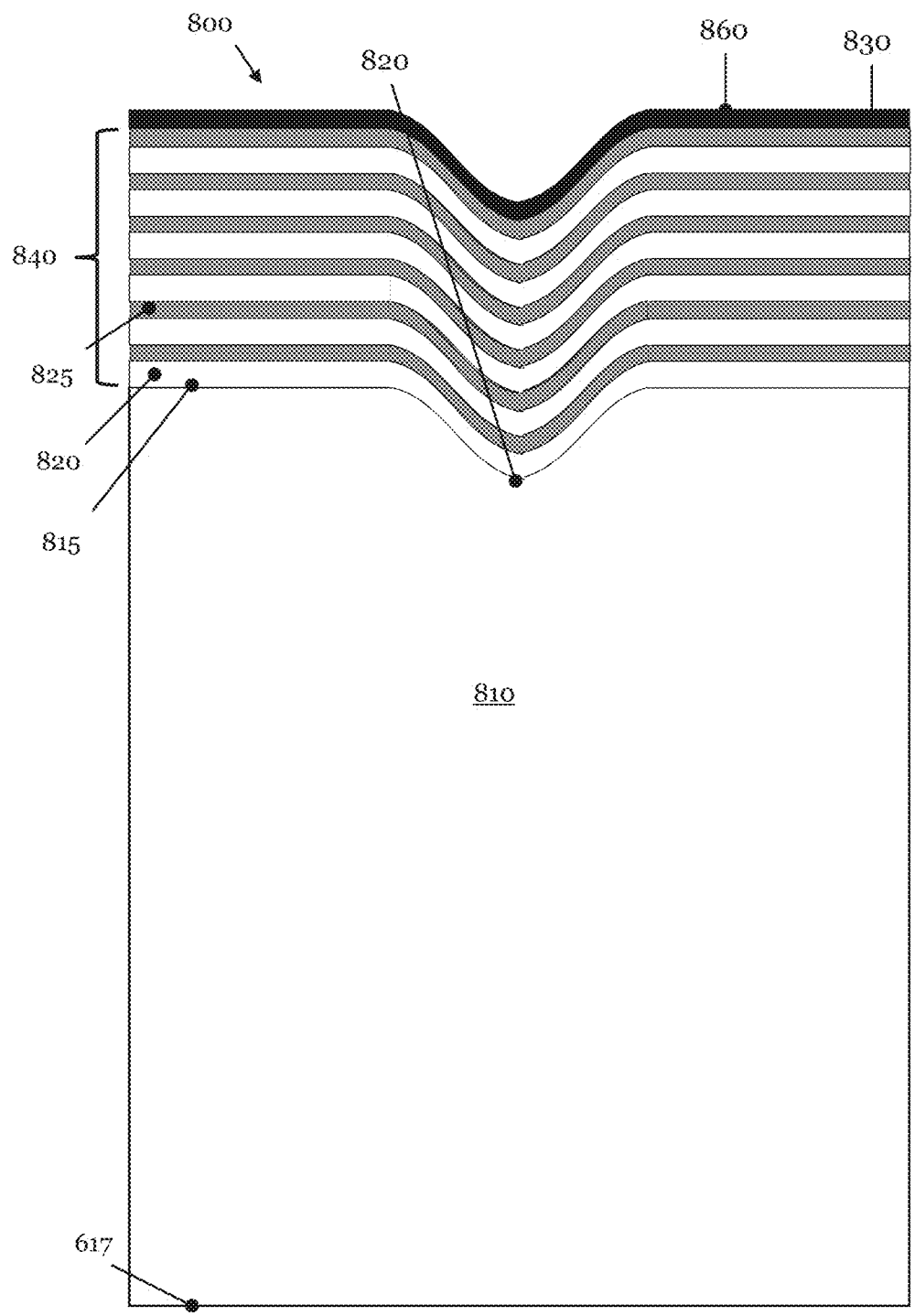
FIG. 8 shows a schematic section through a mask blank, the substrate of which has a defect in the form of a local depression (pit) at the surface on which the multilayer structure is applied.

As already explained above, FIG. 6 presents an ideal EUV mask blank 600. FIG. 8 elucidates a mask blank 800 whose substrate 810 has a local defect 820 in the form of a local depression (pit). The local pit may have arisen for example during the polishing of the front side 815 of the substrate 810. In the example elucidated in FIG. 8, the defect 820 propagates substantially in unchanged form through the multilayer structure 840.

Figure 9:
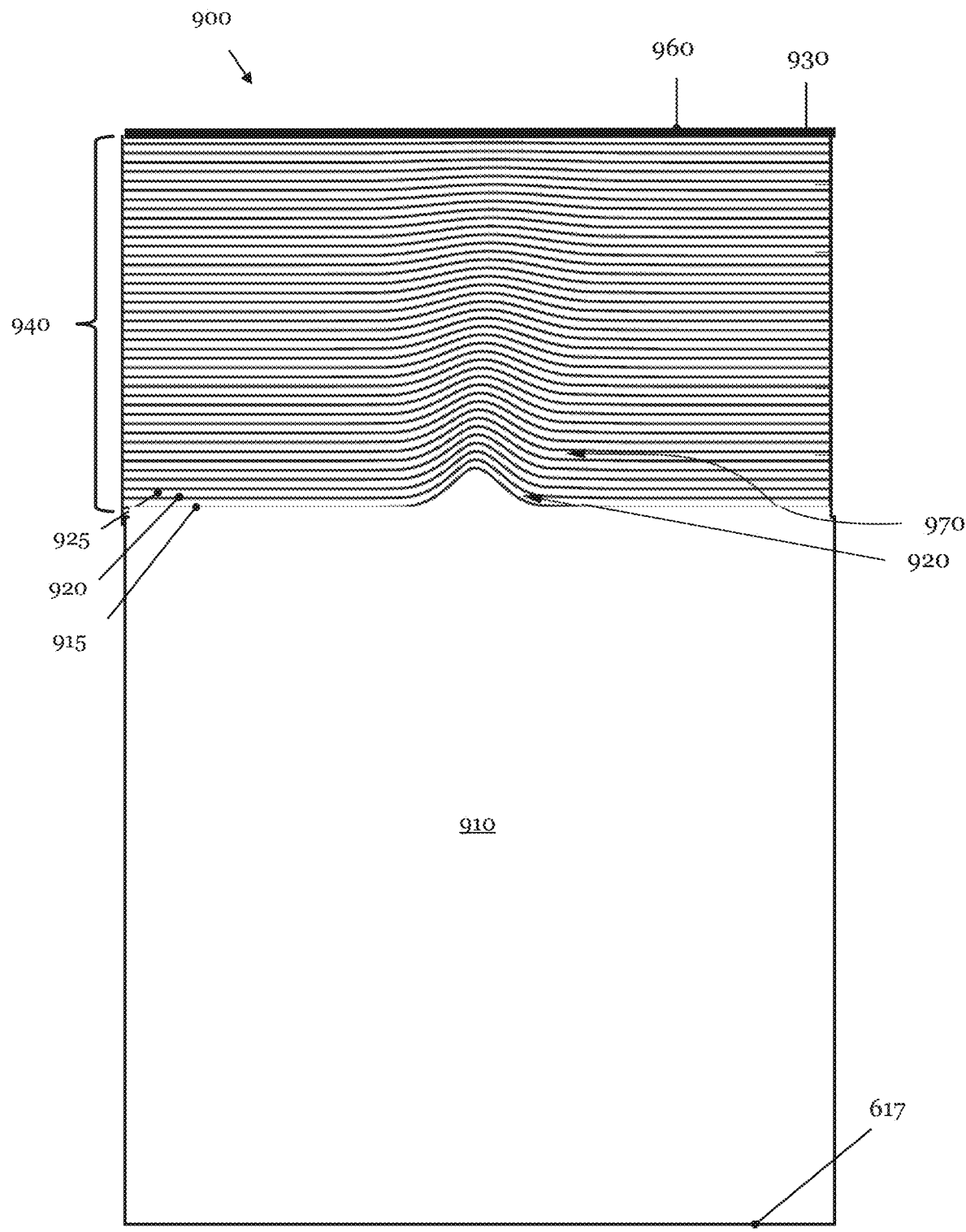
FIG. 9 shows a schematic section through a mask blank, the substrate surface of which has a defect in the form of a local elevation (bump), wherein the defect in the multilayer structure increases in terms of lateral extent and loses height.

FIG. 8 shows one example of a defect 820 of a mask blank 800. As already mentioned in the introductory part, various further types of defect may be present in a mask blank 600, 800. Alongside pits 820 in the substrate 810, local bulges (bumps) may occur on the surface 615, 815 of the substrate 610, 810 (see subsequent FIG. 9).

Further, tiny scratches may arise when polishing of the surface 615, 815 of the substrate 610, 810 (not illustrated in FIG. 8). As already discussed in the introductory part, during the deposition of the multilayer structure 640, 840, particles on the surface 615 of the substrate 610, 810 may be overgrown or particles may be incorporated into the multilayer structure 640, 840 (likewise not shown in FIG. 8).

Defects of the mask blank 600, 800 may have their starting point in the substrate 610, 810, at the front side or the surface 615, 815 of the substrate 810, in the multilayer structure 640, 840 and/or on the surface 830 of the absorption layer 660, 860 of the mask blank 600, 800 (not shown in FIG. 8). Defects 820 that are existent on the front side 615, 815 of the substrate 610, 810 may, as illustrated schematically in FIG. 9, change both their lateral dimensions and their height during the propagation in the multilayer structure 940. This may occur in both directions, i.e. a defect may grow or shrink in the multilayer structure 840 and/or may change its form. The defect 920 of the mask blank 900 grows in the lateral directions when passing through the multilayer structure 940, with its height reducing at the same time. At the surface 930 of the absorption layer 960, the defect 920 has substantially no height deviation from the undisturbed mask blank 900. Nevertheless, an EUV mask that is produced from the mask blank 900 exhibits a buried phase defect on account of the curved layers 915, 920 of the multilayer structure 940 of the mask blank 900.

Defects 820, 920 which do not originate exclusively on the surface 830, 930 of the absorption layer 660, 960 are also referred to hereinafter as buried defects. Buried defects can lead to amplitude and/or phase errors when exposing wafers. The defect 820 results in an amplitude error and a phase error, whereas the defect 920 primarily leads to a phase error.

Ideally, the lateral dimensions and the height of a defect 820, 920 should be determined with a resolution of less than 1 nm. Furthermore, the topography of a defect 820, 920 should be determined independently of one another by different measurement methods. In order to measure the contour of the defect 820, 920 and the position thereof on the surface 830, 930 of the absorption layer 860, 960, use can be made of laser radiation in the ultraviolet wavelength range which is radiated into the mask blank 800, 900 from the rear side 617. Further, X-rays can be used to this end, in particular for establishing the extent of a defect 820, 920 in the multilayer structure 840, 940.

The detection limit of surface-sensitive methods relates to the detectability or the detection rate of the defect position (i.e. its centroid) by use of these methods. Scanning probe microscopes, scanning particle microscopes and optical imaging are examples of surface-sensitive methods. A defect 920 intended to be detected by such techniques must have a specific surface topography or a material contrast. The resolvable surface topography or the required material contrast depends on the performance of the respective measuring instrument, such as, for instance, the height resolution thereof, the sensitivity thereof and/or the signal-to-noise ratio thereof.

Figure 10:
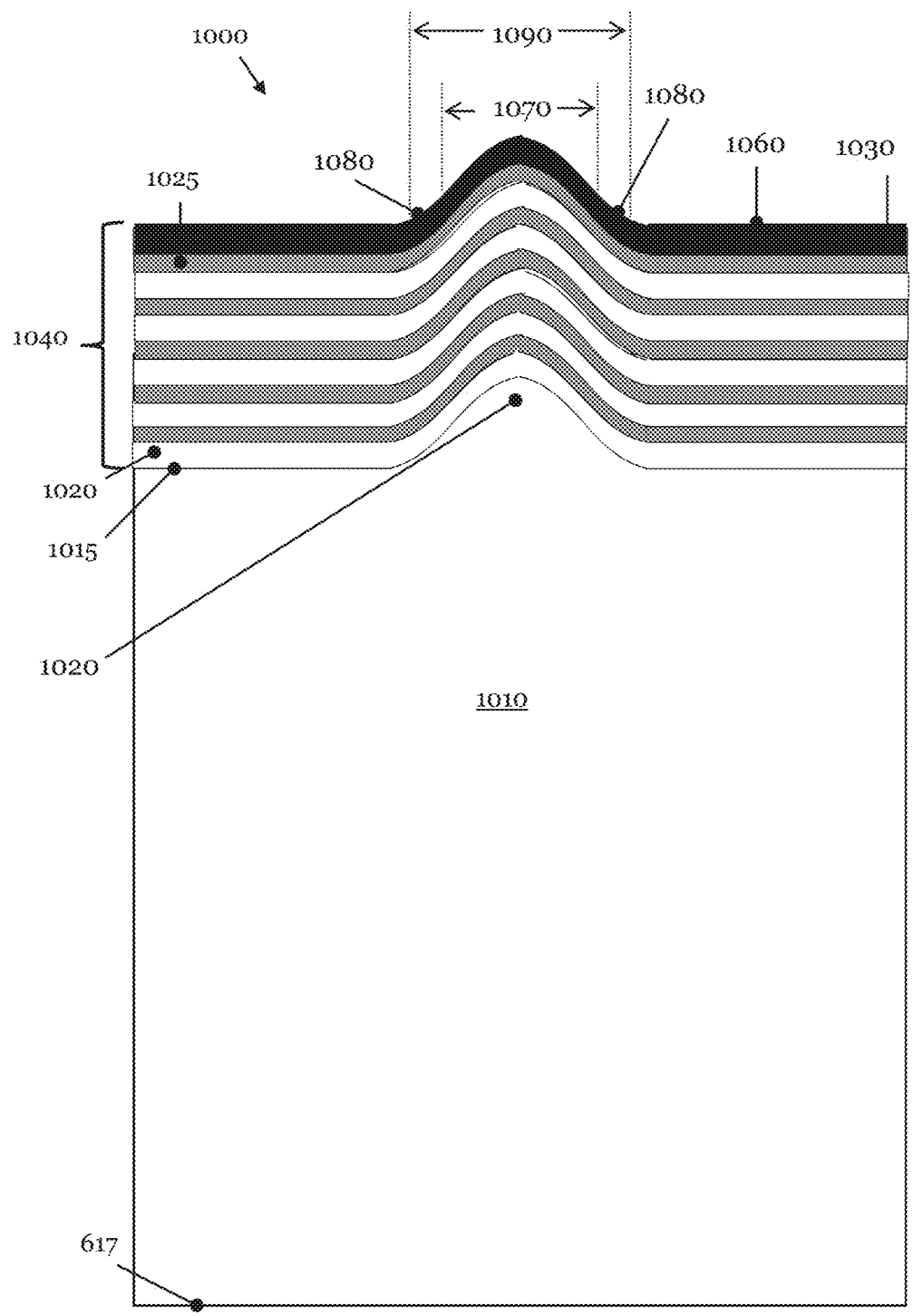
FIG. 10 shows a schematic section through a mask blank, the substrate of which has a defect in the form of a local bump at the surface on which the multilayer structure is applied.

The mask blank 1000 in FIG. 10 is used to elucidate the concept of the effective defect size of a defect. The example in FIG. 10 represents a section through the local defect 1020 having the form of a bump of the front side 1015 of the substrate 1010. In a manner similar to the defect 820 in FIG. 8, the local defect 1020 propagates substantially unchanged through the multilayer structure 1040. The region 1070 of the surface 1030 of the absorption layer 1060 represents the effective defect size of the defect 1020. Said size relates to the lateral dimensions of the defect 1020 which are used for compensation of the defect 1020. As symbolized in FIG. 10, the effective defect size 1070, as a rule, is smaller than the real lateral dimensions of the defect 1020. For a defect 1020 having a Gaussian profile, the effective defect size could correspond to once or twice the full width at half maximum (FWHM) of the defect 1020.

If the region 1070 of the effective defect size is compensated, then the remaining residues 1080 of the defect 1020 no longer lead to a fault that is visible on a wafer during the exposure of an EUV mask produced from the mask blank 1000. The concept of the effective defect size, by virtue of minimizing the size of the individual defects 820, 1020, enables an efficient utilization of mask blanks 800, 1000 during the production of EUV masks. Moreover, this concept allows a resource-efficient compensation of the defects 820, 1020.

The region 1090 indicates a safety margin that can be taken into account when determining the position of the defect 1020 and the contour thereof. With the additional safety margin, the effective defect size 1070 of the defect 1020 can be smaller, equal to or larger than the lateral dimensions of the real defect 1020. In addition, further viewpoints can be taken into account when determining the effective defect size 1070, which relate to, inter alia, unavoidable errors when determining the position of the real defect 1020, and also the non-telecentricity of a light source used for the exposure of the mask.

Figure 11:
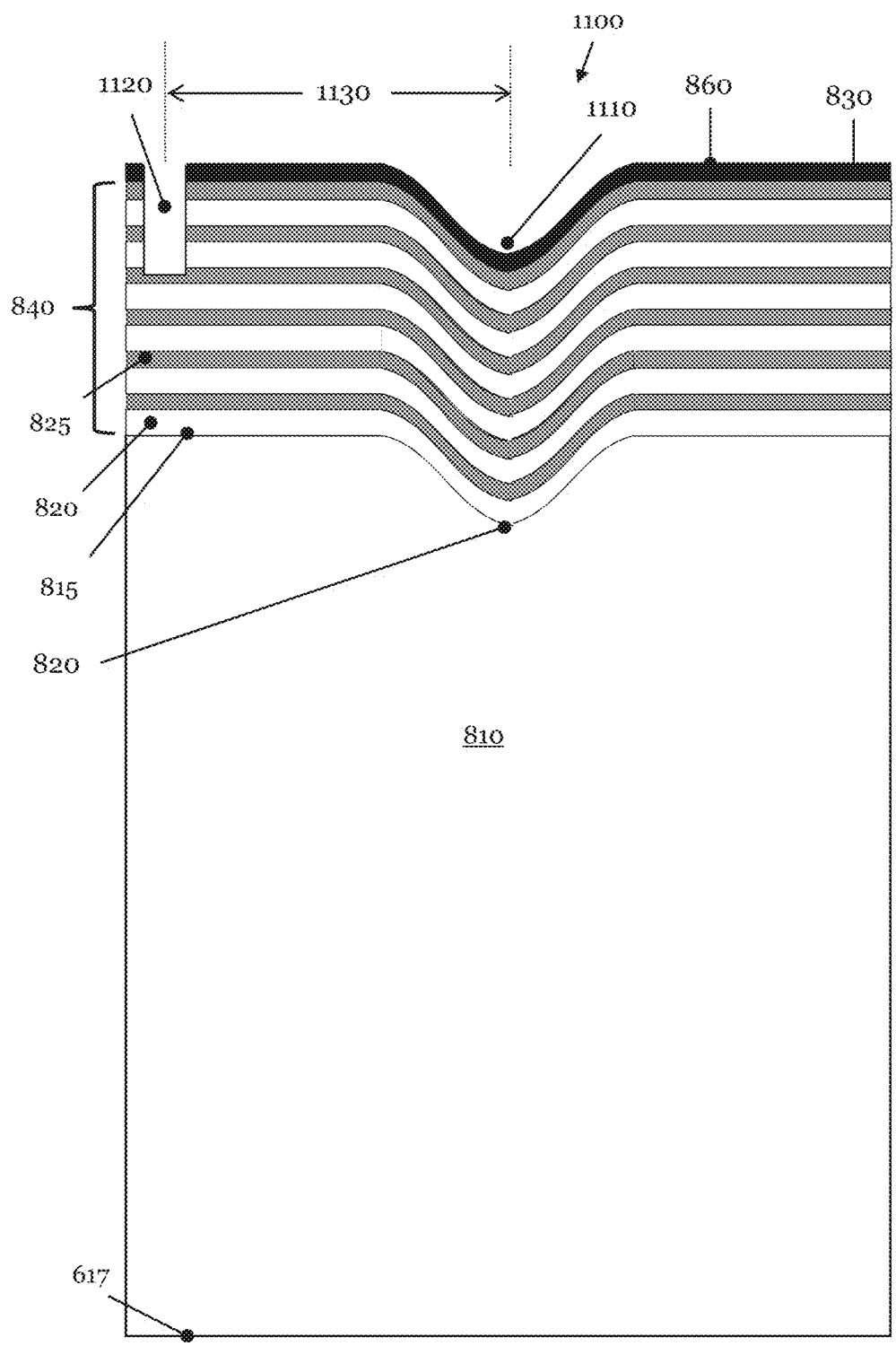
FIG. 11 reproduces the mask blank of FIG. 8 which, additionally, has a fiducial mark in the vicinity of the defect.

The mask blank 1100 in FIG. 11 elucidates the localization of the centroid 1110 of the defect 820 from FIG. 8 with respect to a coordinate system of the mask blank 1100. A coordinate system is produced on the mask blank 1100 for example by etching a regular arrangement of reference markings 1120 into the multilayer structure 840 of said mask blank. The section of the mask blank 1100 in FIG. 11 represents one reference mark 1120. The positional accuracy of the distance 1130 between the centroid 1110 of the defect 820 and the reference marking 1120 should be better than 30 nm (with a deviation of 3σ), preferably better than 5 nm (with a deviation of 3σ), in order that a compensation of the defect 820 by displacing the defect and/or by an imaging transformation of the pattern 750 to be produced from the mask blank 1100 becomes possible. Currently available measuring instruments have a positional accuracy in the region of 10 nm to 20 nm (with a deviation of 3σ).

In a manner similar to the determination of the topography of the defect 820, 920, 1020, the determination of the distance 1130 of the centroid 1110 with respect to one or more reference marks 1120 should be determined independently with the aid of a plurality of measurement methods. By way of example, actinic imaging methods such as, for instance, an AIM™ (Aerial Image Messaging System) for the EUV wavelength range and/or an apparatus for ABI (Actinic Blank Inspection), i.e., a scanning dark-field EUV microscope for detecting and localizing buried defects of EUV mask blanks 600, 800, 900, 1000, are appropriate for this purpose. Furthermore, surface-sensitive methods can be used for this purpose, for example a scanning probe microscope, a scanning particle microscope and/or optical imagings outside the actinic wavelength. Moreover, methods which measure the defect 820, 920, 1020 at its physical position within the mask blank 800, 900, 1000, 1100, such as X-rays, for instance, can also be used for this purpose.

It is complicated to detect defects of the multilayer structure 940 which do not stand out at the surface 930 of the absorption layer 960, such as a defect 920, for instance, but nevertheless lead to visible faults during the exposure of the EUV mask. In particular, it is difficult to define the exact position of such defects.

However, for the compensation and/or repair methods described below, it is necessary to establish with the greatest possible accuracy the position at which the compensation and/or the repair should be carried out.

Figure 12:
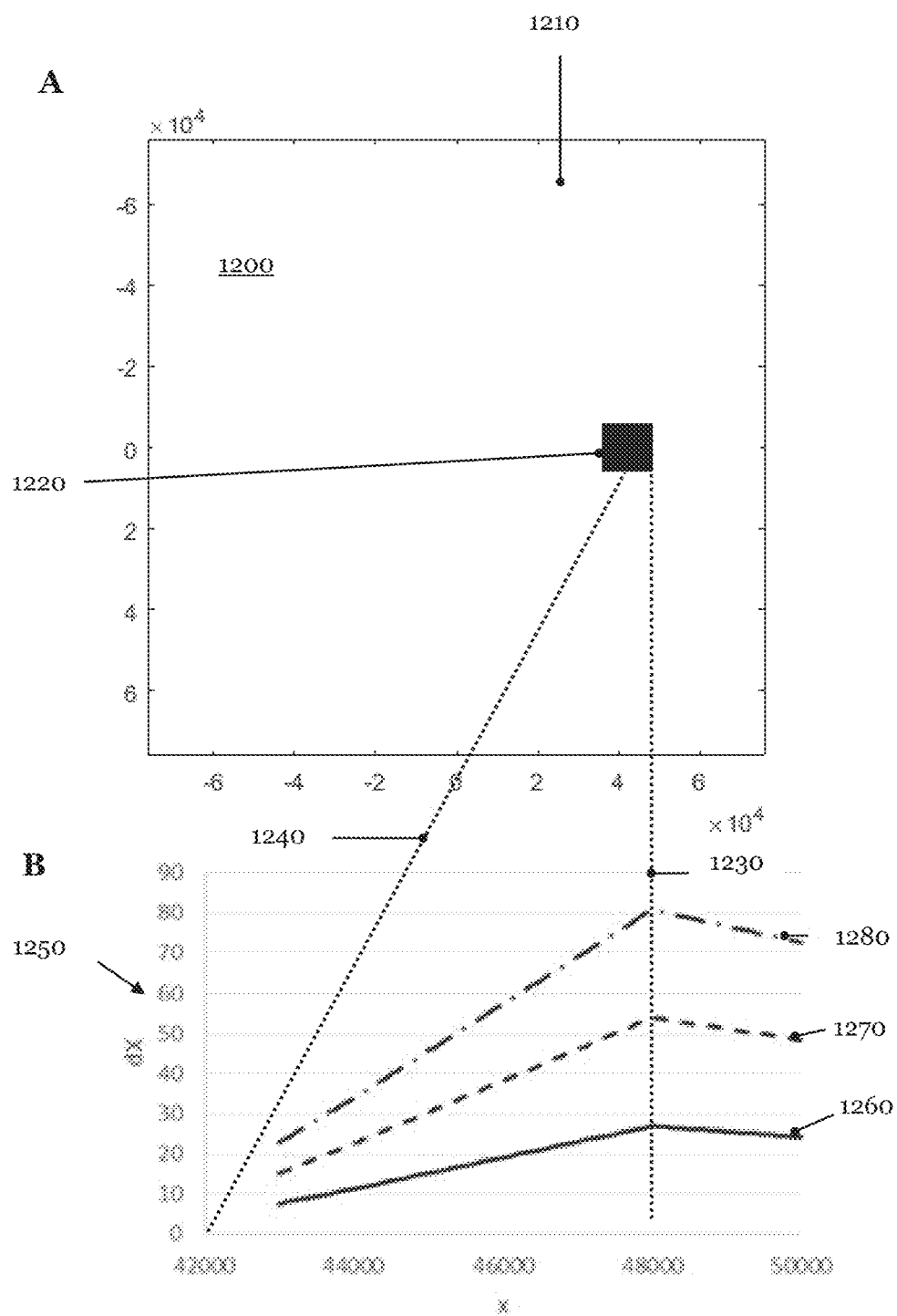
FIG. 12 schematically elucidates a simulation of the introduction of a pixel arrangement with an area of 12 mm×12 mm and three different uniform pixel densities in an EUV mask in partial image A and presents the displacement at the edge of the pixel arrangement caused by the various pixel densities of the pixel arrangement in partial image B.

How a defect 820, 920, 1020 of a mask blank 800, 900, 1000 can be displaced on the surface 830, 930, 1030 of the absorption layer 860, 960, 1060 of the mask blank 800, 900, 1000 is explained on the basis of the following figures. Here, the goal is to displace the defect 820, 920, 1020 in such a way that the latter is hid under a pattern element 760, 770 when producing the pattern 750 and therefore unable to develop a disadvantageous effect. The upper partial image A of FIG. 12 shows a plan view of an EUV mask blank 1200 with dimensions of 152 mm×152 mm, i.e., the specifications in the upper partial image are specified in micrometers, with the origin of the coordinate system lying at the centroid of the EUV mask 1200. The introduction or writing of pixel arrangements with different pixel densities is simulated in an area 1220 with a size of 12 mm×12 mm. The effects of the various pixel arrangements are illustrated in the diagram 1250 of the lower partial image B of FIG. 12. The abscissa of the diagram 1250 is specified in micrometers and the ordinate is specified in nanometers.

As already explained above, a pixel in a substrate of a mask blank 800, 900, 1000 produces a small deformed region which is referred to as a deformation element. Typically, the material in the center of a deformation element caused by a pixel has a lower density than was present before the pixel was introduced into the material. As a result, writing a pixel leads to a local expansion of the material of the substrate 810, 910, 1010. A pixel can be designed in such a way that the local expansion of the material around the deformation element is substantially isotropic. However, it is also possible to design a pixel in such a way that the local extent in the vicinity of the deformation element is primarily in one direction in a plane of the substrate 810, 910, 1010, i.e., in the xy-plane. The second embodiment of writing a pixel is preferable because this allows the direction of the local expansion in the region of a deformation element to be set. The effects of a plurality of pixels that were produced spatially close together, or of the deformation elements thereof, are cumulative. This means that introducing or writing a pixel arrangement into the substrate 810, 910, 1010 allows the surface 830, 930, 1030 of the absorption layer 860, 960, 1060 of a mask blank 800, 900, 1000 to be displaced in a targeted manner in one direction. In addition to the density, introducing a pixel into the substrate of a mask blank 800, 900, 1000 also locally changes the optical transmission of the substrate 810, 910, 1010 of the mask 800, 900, 1000. The two-dimensional density of a pixel arrangement is specified below in percent of the optical absorption change produced by the pixel arrangement.

Figure 13:
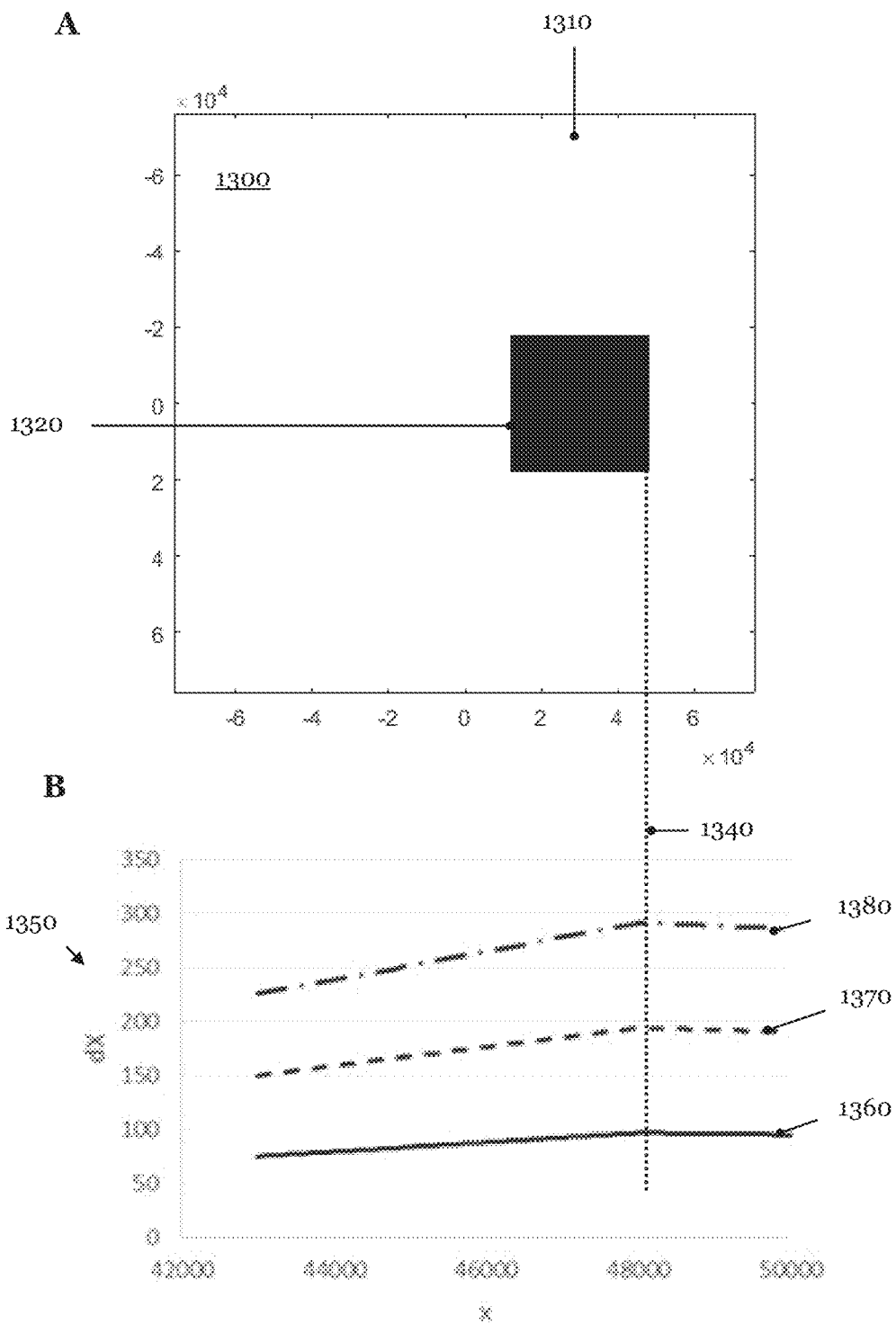
FIG. 13 reproduces the simulation of FIG. 12 for a pixel arrangement with an area of 36 mm×36 mm.

The pixels of the pixel arrangement of FIGS. 12 and 13 are designed in such a way that the expansion of the material of the substrate by the deformation elements and hence the expansion of the surface of the mask blank 1200 is brought about predominantly in the horizontal direction (x-direction). In the diagram 1250 of partial image B of FIG. 12, the introduction of a pixel arrangement 1220 with a pixel density that is homogeneous within the pixel arrangement 1220, said density corresponding to an optical absorption change of the substrate of the mask blank 1200 by 10%, is illustrated by the solid curve 1260. At the left edge thereof, the pixel arrangement 1220 with a pixel density which corresponds to a change in the optical transmission of the substrate by 10% leads to a displacement of the surface of the mask blank 1200 by 27 nm. In the center of the pixel arrangement, the displacement of the surface 1210 of the mask blank 1200 has substantially decayed to zero. This is indicated by the dotted straight line 1240. At the left end of the pixel arrangement 1220, the latter results in a displacement in the −x-direction by likewise 27 nm. Strictly speaking, these statements only apply to writing the pixel arrangement 1220 into the center of the substrate of the mask blank 1200. The asymmetry of the selected configuration prevents the curves from intersecting exactly at the origin of the coordinate system of the diagram 1250 of partial image B in FIG. 12.

The dashed curve 1270 in the diagram 1250 in the lower partial image B in FIG. 12 reproduces a change in the surface 1210 of a mask blank 1200, caused by a pixel density in the 12 mm×12 mm large area that corresponds to a 20% change in the optical transmission in the region of the pixel arrangement 1220. As may be gathered from the curve 1270, this pixel density of the pixel arrangement 1220 at the positions of the medians of the sides of the pixel arrangement 1220 leads to a local displacement of the surface 1210 of the mask blank 1200 by 54 nm.

The dash-dotted curve 1280 in the diagram 1250 in the lower partial image B in FIG. 12 shows a displacement of the surface 1210 of the mask blank 1200, brought about by a pixel density in the 12 mm×12 mm large area of the mask blank 1200 of partial image A that corresponds to a pixel density that causes a 30% change in the optical transmission of the substrate 610 in the region of the pixel arrangement 1220. The regions of the surface 1210 of the mask blank 1200 over the vertical median of the pixel arrangement are displaced by 81 nm relative to the initial situation, i.e., without the pixel arrangement 1220. As may be gathered from curves 1260, 1270 and 1280, the displacement of the surface 1210 of the mask blank caused by the pixel arrangement 1220 increases linearly with the pixel density of the pixel arrangement 1220.

For an L/S arrangement with a half pitch of 22 nm, the maximum necessary displacement of a defect 820, 920, 1020 in the case of a displacement of the defect 820, 920, 1020 perpendicular to the pattern elements of the L/S arrangement lies in the region of approximately 45 nm if the projection lens of the lithography apparatus carries out a reduction by a factor of 4. These displacements should be able to be achieved by the pixel arrangements of the curves 1270 and 1280.

The displacements of the surface 1210 of the mask 1200 described by the curves 1260, 1270 and 1280 reduce with increasing distance from the pixel arrangement 1220. However, the reduction to the right of the vertical line in the diagram 1250 of partial image B in FIG. 12 is significantly lower than the increase within the pixel arrangement 1220. Since the defects 820, 920, 1020 to be compensated for have lateral dimensions in the two digit or low three digit nanometer range, the displacement of these defects over distances which do not exceed a few diameters of the defects 820, 920, 1020 with pixel arrangements 1220, which are spatially restricted to a part of the mask blank 1200, does not lead to noteworthy distortions of the defects.

FIG. 13 reproduces FIG. 12 with the difference that the pixel arrangement 1320 assumes an area of 36 mm×36 mm in the substrate 610 of a mask blank 600. The positions of the left sides of the pixel arrangements 1220 and 1320 of FIGS. 12 and 13 correspond in respect of the EUV mask blank 1200, 1300. As may be gathered from curves 1360, 1370 and 1380, the displacement on the surface 1310 of the mask blank 1300 is 97 nm, 194 nm and 291 nm for pixel densities of the pixel arrangement 1320 that correspond to the attenuations of 10%, 20% and 30% of the optical transmission of the substrate of the mask blank 1300. This means that a displacement of a defect 820, 920, 1020 and/or of a local pattern element 760, 770 by several hundred nanometers can be achieved by writing a single pixel arrangement 1320 into the substrate of a mask blank 1300. As a result, it is also possible to displace defects situated far away from a pattern element 760, 770 in such a way that these have substantially no effect after the production of the pattern 750. Moreover, the displacement of the surface 1310 of the mask blank 1300 still is linear in respect of the pixel density of the pixel arrangement 1320, even when writing the pixel arrangement 1320 in FIG. 13. In respect of the surface of the pixel arrangement 1220, 1320, the displacement grows stronger than a linear dependence but weaker than the quadratic dependence of the area of the pixel arrangement 1220, 1320.

Figure 14:
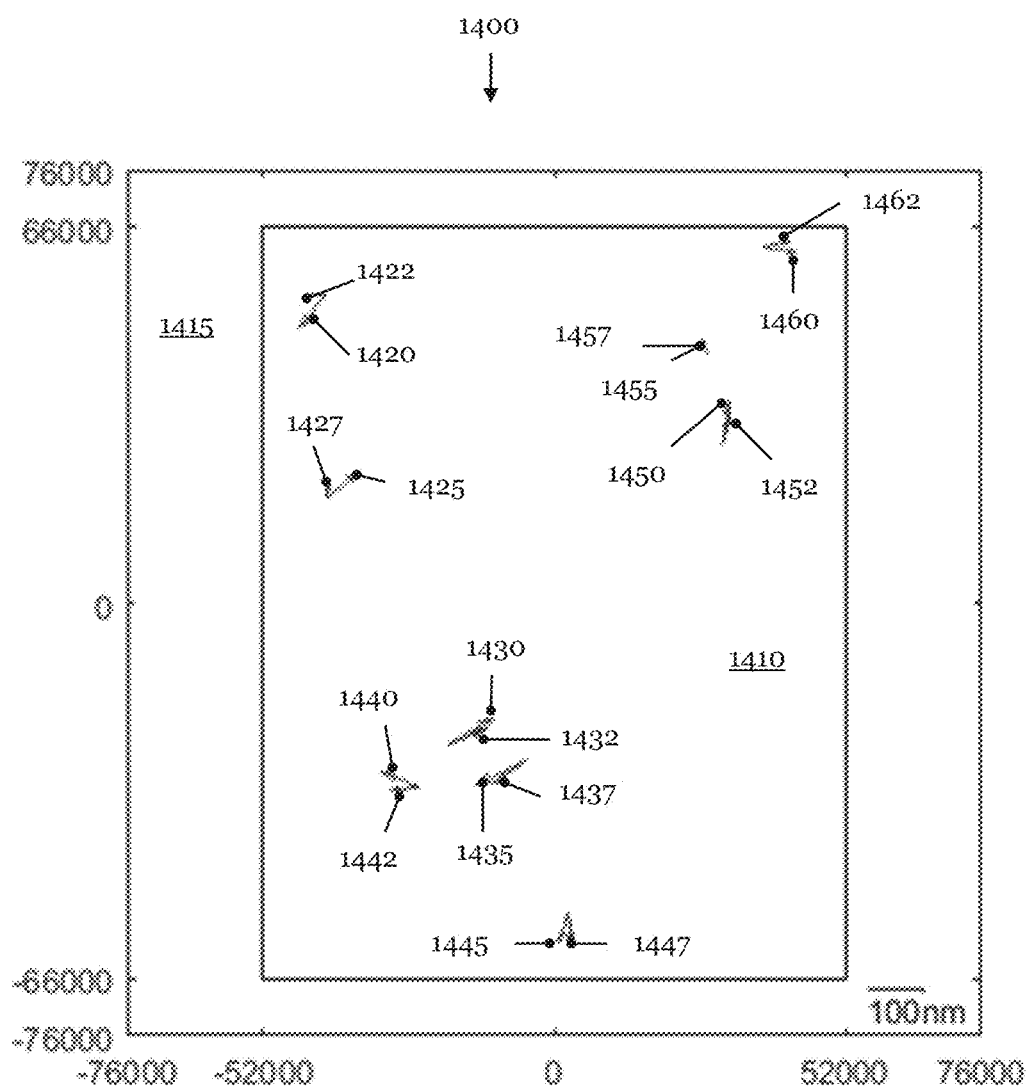
FIG. 14 shows a plan view of a mask blank, which, in the active region thereof, has nine defects present with a random distribution, said defects having a randomly distributed deviation from their target position, and reproduces the approach of the defects to their target positions by the introduction into the substrate of the active region of the mask blank of four pixel arrangements with a pixel density that varies over the active region.

In FIGS. 14 to 19, below, simulation results are presented, said simulation results showing that a plurality of defects can be displaced and hence compensated for simultaneously in a common optimization process on the surface 830, 930, 1030 of the absorption layer 860, 960, 1060 of a mask blank 800, 900, 1000. The simulations explained below do not refer to a pattern 750 to be produced on a mask blank. Instead, a random statistical distribution of defects within an active region of a mask blank to be produced are predetermined as input data for the simulation. FIG. 14 shows an EUV mask blank 1400 with an active surface 1410 to be produced and with a non-active surface 1415 or an edge 1415. In FIG. 14, the numerical values are once again specified in micrometers.

In the example of FIG. 14, nine defects have been produced with a random statistical distribution in the subsequently active region 1410 of the EUV mask 1400. Further, deviations Δx, Δy from the predetermined target positions, likewise with a random statistical distribution, are assigned to the nine defects. The arrowheads of the arrows 1420, 1425, 1430, 1435, 1440, 1445, 1450, 1455, 1460 specify the deviations of the positions of the individual defects from their target position. By way of example, |Δr|, |y|≤20 nm or 100 nm can be chosen. In the example illustrated in FIG. 14, |Δr|, |y|≤100 nm. In the initial state, the mean deviation of the nine defects (N=9) is:

$$\Delta_{pre} = \frac{1}{N} \cdot \sum_{i=1}^{N} \sqrt{dx_{i,pre}^2 + dy_{i,pre}^2} = 72 \text{ nm.}$$

Here, $\Delta_{pre}$ denotes the length of the averaged displacement vector of the nine defects in respect of their target positions.

Figure 27:
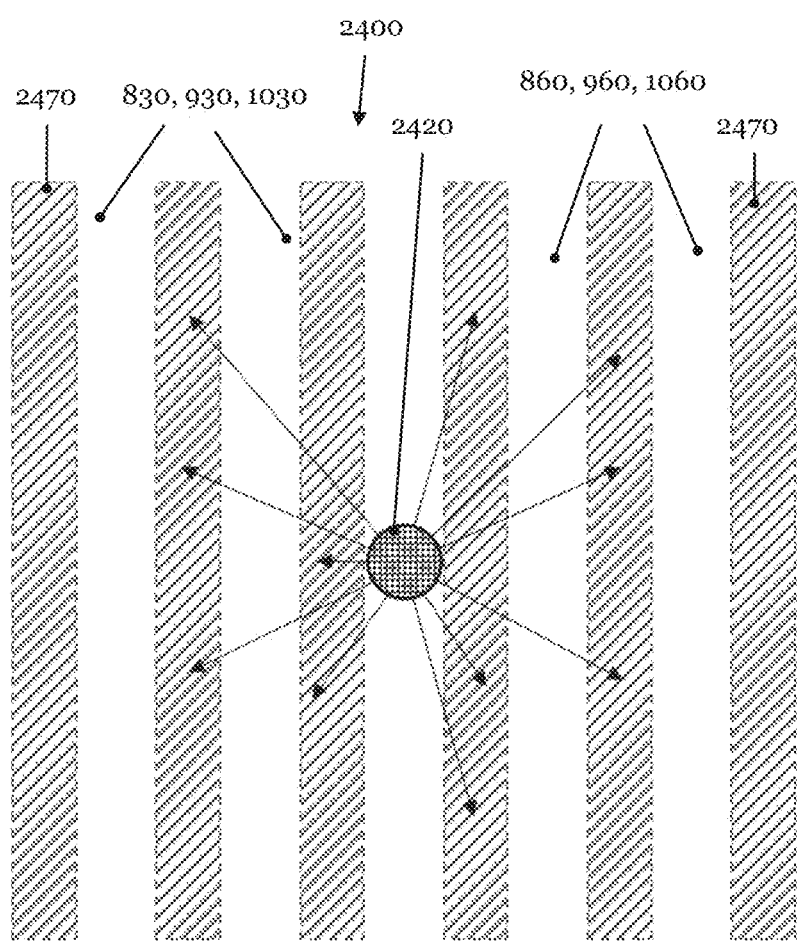
FIG. 27 shows the section of the mask blank of FIG. 24 in which arrows symbolize the region in which the position of the defect can be modified.

In FIG. 14, it should be noted that the two defects whose deviations from the target position are denoted by arrows 1430 and 1435 lie close together and they are displaced in the opposite directions. On account of contradictory requirements on the displacement, these two defects can only be corrected with difficulties and this thereby shows the limitation of the approach explained in the context of FIGS. 14 to 19. An extended approach which facilitates a significantly improved compensation of the defects underlying the arrows 1430 and 1435 is discussed on the basis of FIG. 27.

Now, for the initial situation described above, pixel arrangements which to the greatest possible extent correct the deviations of the defects from their target positions by displacing the defects in the direction of the target positions are established in a simulation process. To this end, four pixel arrangements are predetermined for the simulation, said pixel arrangement extending over the entire active region 1410 of the mask blank 1400. Each of the four pixel arrangements has a maximum pixel density which, in the example specified in FIG. 14, corresponds to a change in the optical transmission of the substrate of 4%. The density of the pixels in the respective pixel arrangements is variable within the pixel arrangement, i.e., within the active region.

The first pixel arrangement leads to predominant expansion of the active region in the horizontal direction (i.e., in the x- and −x-direction), wherein, as illustrated in FIG. 14, the coordinate origin lies at the centroid of the mask blank 1400. The parameters of the second pixel arrangement are set in such a way that this pixel arrangement stretches the active region 1410 of the mask blank 1400 variably in the vertical direction. The parameters of the third pixel arrangement are designed in such a way that this pixel arrangement variably stretches the active region 1410 of the mask blank 1400 over the active region 1410 in a direction of +45° in relation to the horizontal direction. Finally, a fourth pixel arrangement, whose change direction is aligned in the −45° direction in respect of the horizontal direction, locally expands the active region 1410 of the mask blank 1400 in this direction in a variable manner.

This means that the displacements of the nine defects of FIG. 14 in the direction of their target positions are determined in a common optimization process. Details of this optimization process are explained in the patent document U.S. Pat. No. 9,658,527 B2 of the applicant.

The result of the common optimization process for displacing the nine defects of FIG. 14 are specified by the arrows or vectors 1422, 1427, 1432, 1437, 1442, 1447, 1452, 1457, 1462. Here, the initial point of the vector 1422, 1427, 1432, 1437, 1442, 1447, 1452, 1457, 1462 specifies the target location of the respective defect and the tip of the arrows or vectors specifies the actual position of the respective defect. That is to say, the shorter the length of the vector 1422, 1427, 1432, 1437, 1442, 1447, 1452, 1457, 1462, the smaller the deviation of the defect from its target location or target position. In the example specified in FIG. 14, the mean length of the vectors 1422, 1427, 1432, 1437, 1442, 1447, 1452, 1457, 1462 after the common optimization process is:

$$\Delta_{post} = \frac{1}{N} \cdot \sum_{i=1}^{N} \sqrt{dx_{i,post}^2 + dy_{i,post}^2} = 46 \text{ nm}.$$

The improvement obtained is measured by the following formula:

$$\text{improvement} = 100\% \cdot \left(1 - \frac{\Delta_{post}}{\Delta_{pre}}\right)$$

and it is 36.1% in the example specified in FIG. 14.

Figure 15:
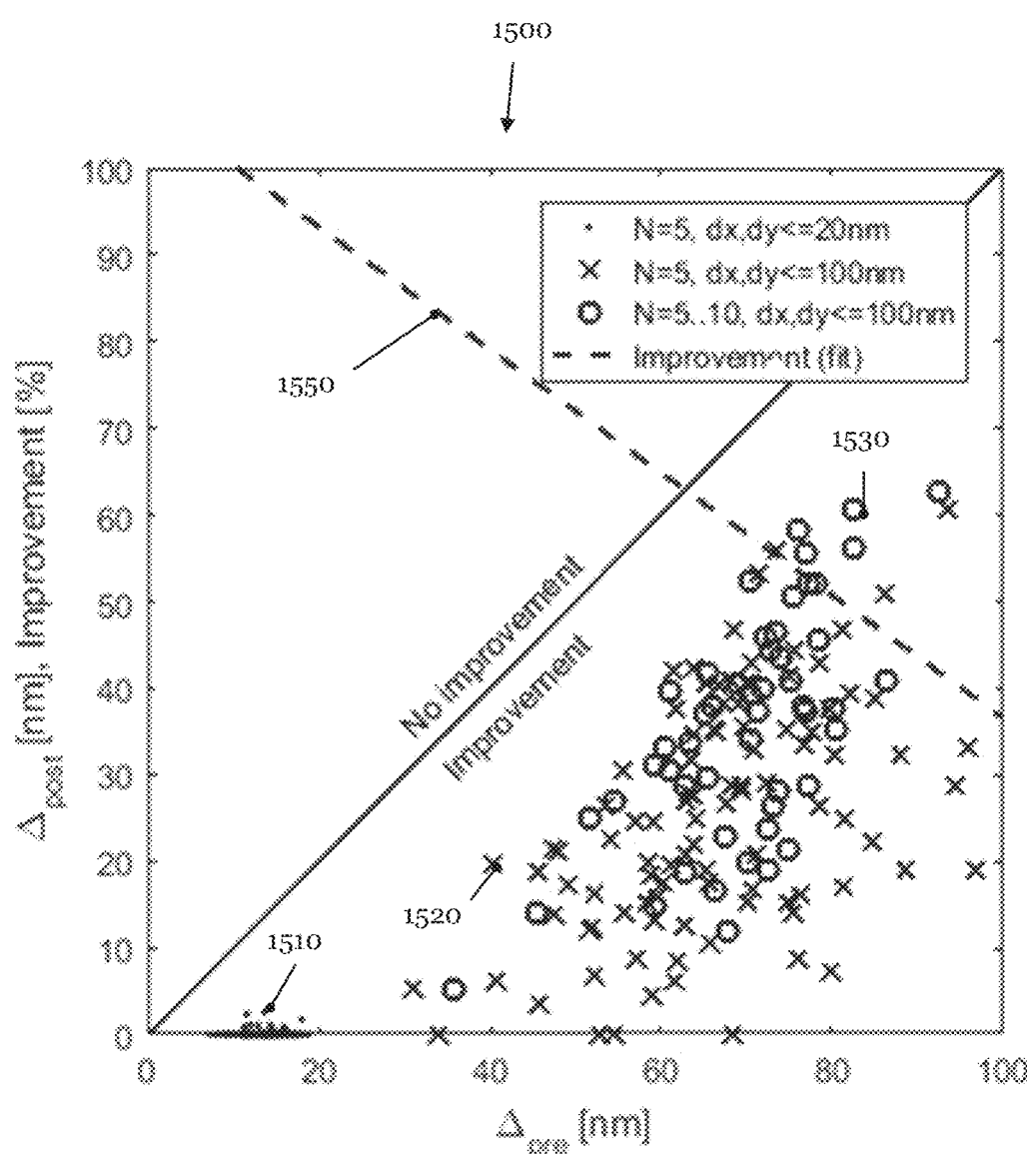
FIG. 15 shows the reduction of a distance of a number of defects from their target positions for three initial configurations by the simulated writing of four pixel arrangements into the active region of a mask blank, wherein, for each of the three initial configurations, 100 random distributions of the defects and random deviations of the defects from their target positions were simulated.

The diagram 1500 in FIG. 15 shows the accumulation of in each case 100 simulation processes for three different initial configurations, i.e., the diagram is based on one hundred initial configurations being randomly selected three times. In the initial configuration 1510 illustrated by points, the assumption is made of five defects that are randomly distributed on a mask blank. The five defects of the initial configuration 1510 have random deviations from their target positions within a region $|\Delta x|$, $|\Delta y|$20 nm. The initial configuration 1520, which is reproduced by crosses in FIG. 15, likewise has five defects that are randomly distributed in the active surface 1410 of the mask blank 1400. However, the deviations thereof from their target positions comprise the interval $|\Delta x|$, $|\Delta y| \leq 100$ nm. Finally, the number of defects of a mask blank 1400 varies randomly in the range from five to ten in the initial configuration 1530 represented by white circles. The deviations of the defects from their target positions is $|\Delta x|$, $|\Delta y| \leq 100$ nm, like for the initial configuration 1520.

As described in the context of FIG. 14, the effect of four pixel arrangements, whose directions of expansion point in four different directions on the surface of a mask blank, is simulated. The maximum admissible pixel density within the active region 1410 corresponds to an optical transmission change of the substrate of the mask blank 1400 of 4%. For the four overlaid pixel arrangements, this may lead to a maximum local optical transmission change of the substrate of the mask blank 1400 of up to 16%.

In the diagrams of FIGS. 15 to 19, the distributions of the deviations of the defects from their target positions in the initial configuration are plotted on the abscissa. The ordinate shows the distributions of the deviations from the target positions after the introduction of the four pixel arrangements into the substrate of the mask blank 1400.

What can be gathered from the diagram 1500 in FIG. 15 is that the introduction of the pixel arrangements into the substrate of the mask blank 1400 leads to the defects significantly approaching their target positions for all initial configurations 1510, 1520, 1530. For the initial configuration 1510 with a deviation $|\Delta r|$, $|\Delta y| \leq 20$ nm from the target positions of the defects, the combined effect of the four pixel arrangements largely corrects the discrepancies of the defects from their target positions. The dashed straight line 1550 specifies the improvements achieved by the combined effect of the four pixel arrangements according to the following formula that was already specified above:

$$\text{improvement} = 100\% \cdot \left(1 - \frac{\Delta_{post}}{\Delta_{pre}}\right).$$

Up to a deviation of $|\Delta x|$, $|\Delta y| \cong 10$ nm, the pixel arrangements substantially compensate the defects perfectly in respect of their target positions. Up to a deviation of $|\Delta r|$, $|\Delta y| \leq 30$ nm, the pixel arrangements largely compensate the position deviations of the defects. Even for a large deviation of the defects from their targets positions of $|\Delta t|$, $|\Delta y| = 100$ nm, an improvement in respect of the initial configuration of between 35% and 40% still is achieved on average by displacing the defects.

Figure 16:
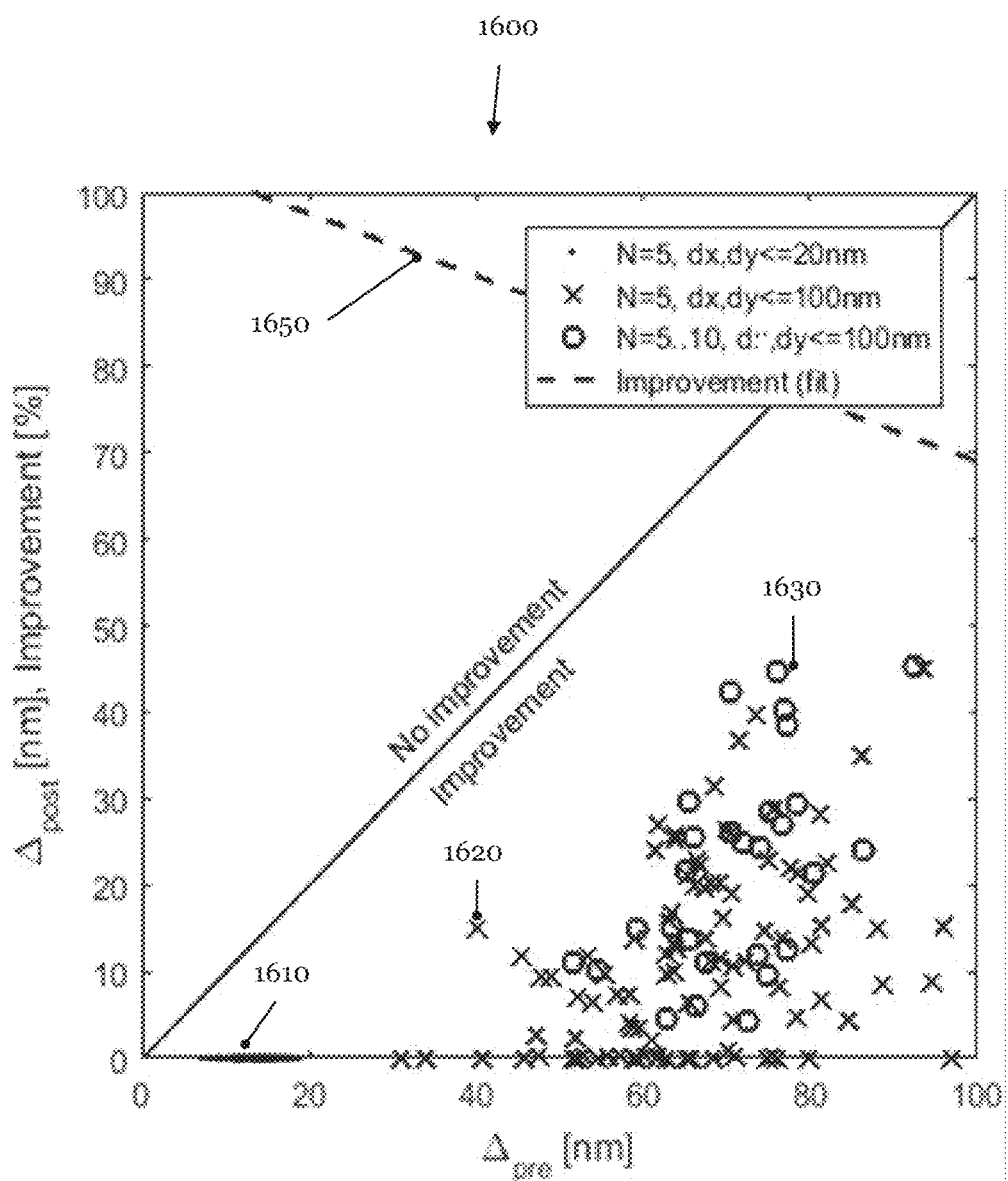
FIG. 16 repeats FIG. 15, wherein the admissible maximum pixel density of the pixel arrangements is doubled in relation to FIG. 15.

The diagram 1600 in FIG. 16 reproduces the diagram 1500 in FIG. 15, with the difference that the maximum admissible pixel density of a pixel arrangement now corresponds to an optical transmission change of the substrate of the mask blank 1400 of 8%. The four pixel arrangements, which may cause a local optical transmission change of up to 32%, are now able to substantially displace the defects with deviations of $|\Delta r|$, $|\Delta y| \leq 20$ nm perfectly onto their target positions, i.e., able to substantially compensate these perfectly. Up to a deviation of $|\Delta r|$, $|\Delta y| \leq 50$ nm, the pixel arrangements largely compensate the position deviations of the defects. Even for a large deviation of $|\Delta r|$, $|\Delta y| = 100$ nm, the combined effect of the four pixel arrangements on average still compensates approximately 70% of the deviations of the defects relative to their target positions.

Figure 17:
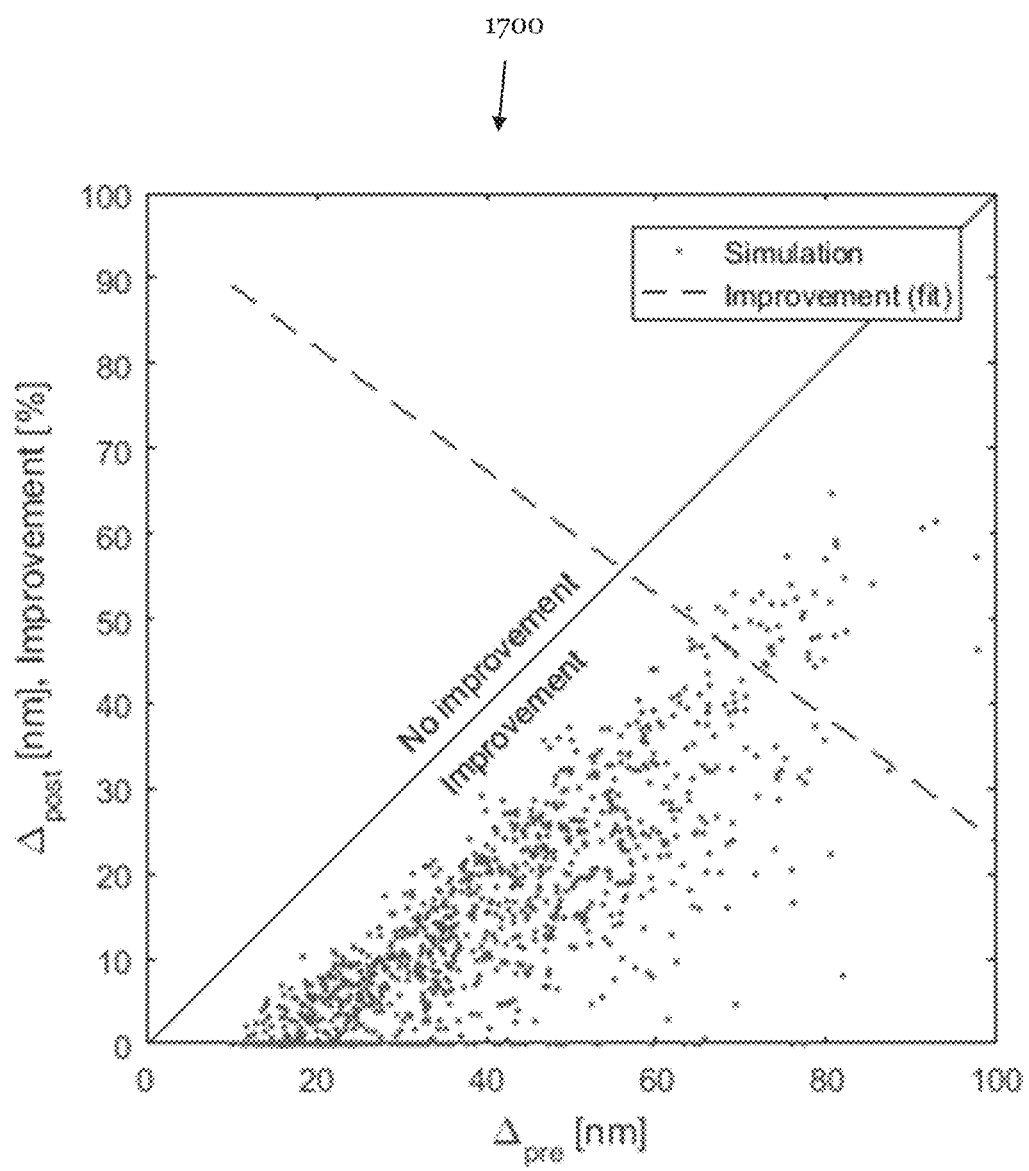
FIG. 17 repeats FIG. 15, wherein a Poisson distribution with an average of 7.5 was assumed for the number of defects present within the active region of the mask blank and a random distribution was assumed for the deviation from the target position.
Figure 18:
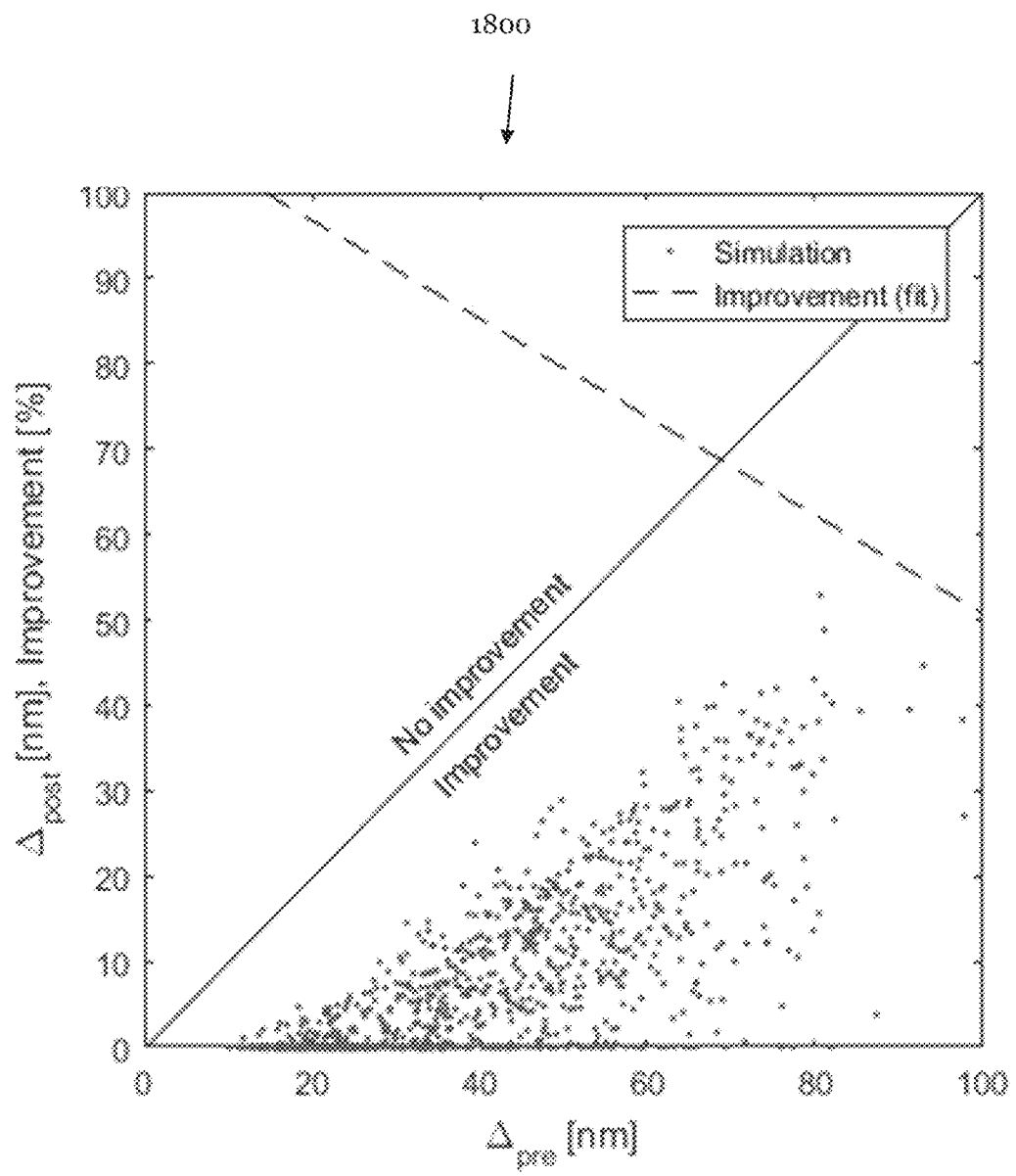
FIG. 18 reproduces FIG. 17 with a maximum admissible pixel density that has been doubled.
Figure 19:
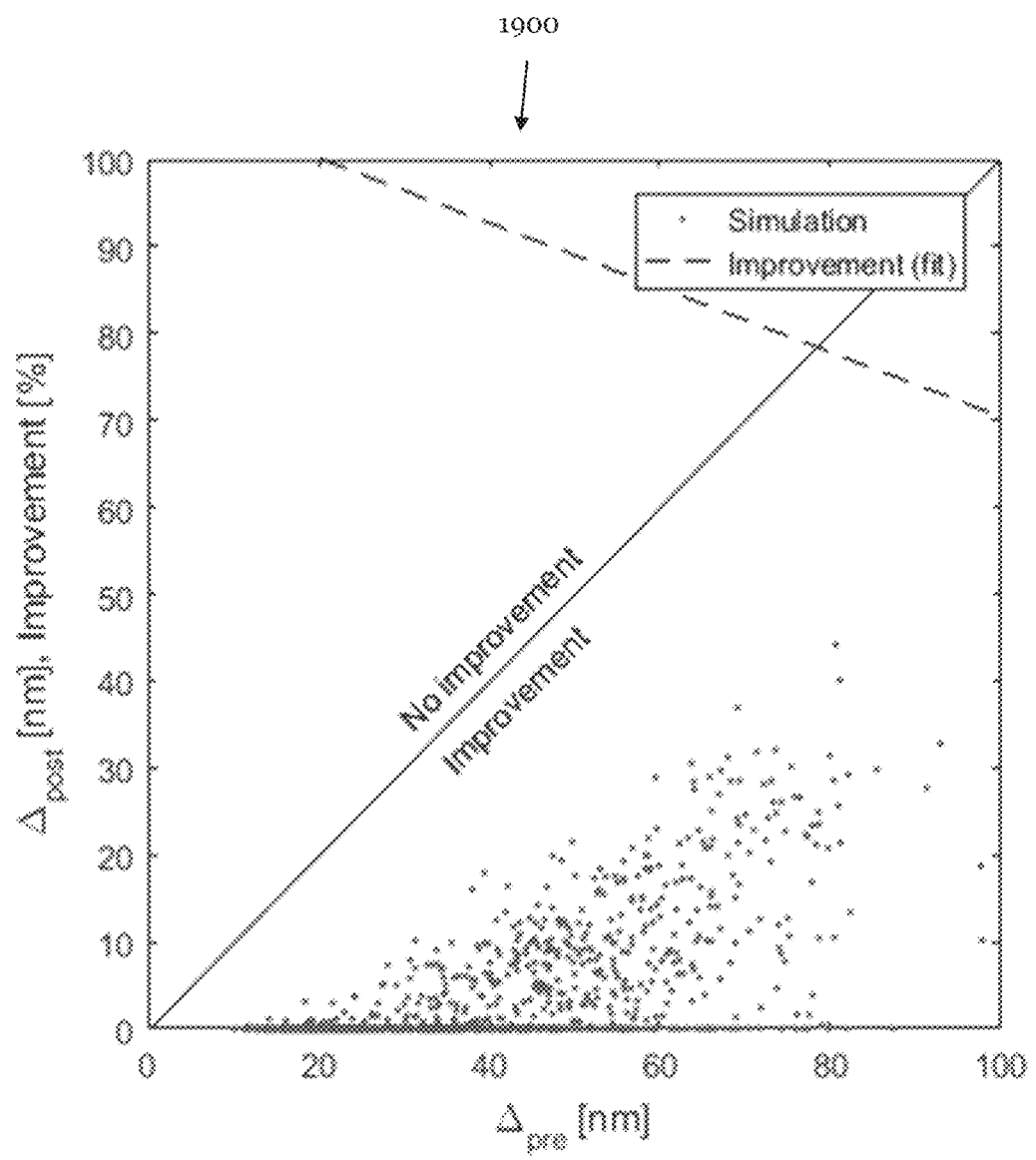
FIG. 19 presents FIG. 17 with a maximum admissible pixel density that has been tripled.

In FIGS. 17 to 19, the restriction of the number of defects 820, 920, 1020 of a mask blank 1400 has been lifted. A Poisson distribution with an average of 7.5 is assumed for the number of defects 820, 920, 1020. Additionally, initial configurations with only one defect are not taken into account. The displacement of a defect in respect of its initial position is randomly chosen from an interval between 40 nm and 100 nm for each initial configuration, i.e.: 40 nm$\leq |\Delta r|$, $|\Delta y| \leq 100$ nm.

In the diagram 1700 in FIG. 17, the maximum pixel density of the four pixel arrangements is restricted to a density of the pixels that corresponds to a change in the optical absorption of the substrate of the mask blank 1400 of 4% per pixel arrangement. This upper limit lies at 8% per pixel arrangement in the diagram in 1800 in FIG. 18 and it lies at 12% per pixel arrangement in the diagram 1900 in FIG. 19.

As may be gathered from the diagram 1700 in FIG. 17, already a low pixel density of the pixel arrangements leads to an improvement, i.e., the defects approaching their target positions, for all initial configurations. The dashed line—similar to in FIGS. 15 and 16—specifies the improvement obtained by the combined effect of the four pixel arrangements, averaged over all randomly selected initial configurations. For an original deviation of the position of a defect from its target position of |Δx|, |Δy|=100 nm, a mean improvement of 25% is achieved with the low pixel density in FIG. 17.

The diagram 1800 in FIG. 18 shows that the last-mentioned improvement increase to approximately 50% if a maximum local doubling of the pixel density in respect of FIG. 17 is admitted. Defects which have a deviation from their target position in the region |Δx|, |Δy|≤15 nm are compensated for almost perfectly. If local tripling of the maximum pixel density in relation to FIG. 17 is permitted, defects which have a deviation from their target position in the region |Δx|, |Δy|≤20 nm can be shifted almost completely to their target position. This is illustrated in FIG. 19. A mean improvement in respect of the target position of approximately 70% can be achieved, even for defects whose position deviates by 100 nm from the target position.

Figure 20:
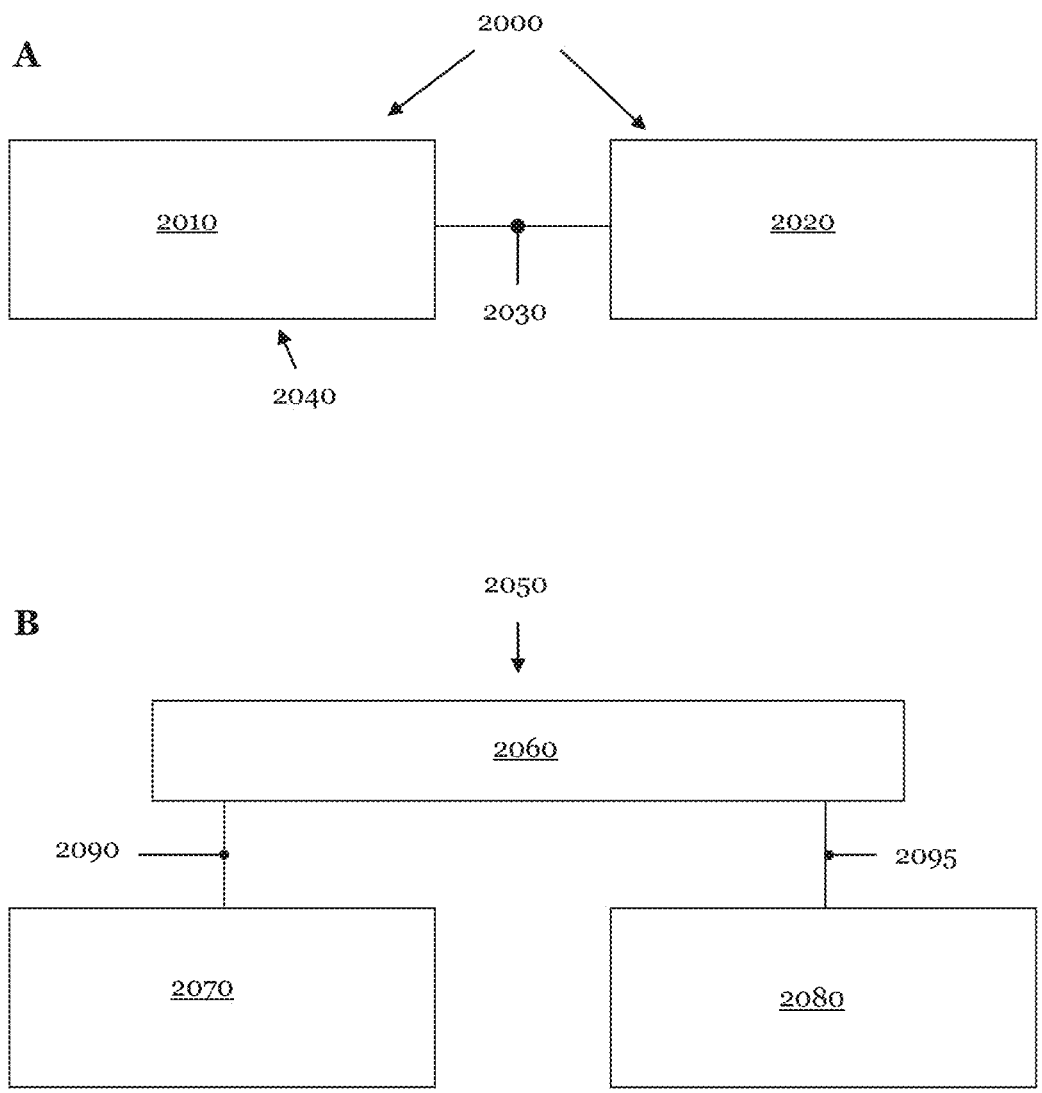
FIG. 20 schematically illustrates two embodiments of an apparatus for compensating defects of a mask blank.

FIG. 20 shows two embodiments of an apparatus that can be used to compensate defects of a mask blank 800, 900, 1000. The upper partial image A schematically illustrates an apparatus 2000, the parts 2010 and 2020 of which are linked by a communications link 2030. The individual parts 2010 and 2020 of the apparatus 2000 are explained below on the basis of FIGS. 21 and 22. The lower partial image B in FIG. 20 reproduces a second embodiment 2050 of the apparatus 2000. In the embodiment 2050, the two parts 2070 and 2080 have a common control device 2060, which is linked to both parts 2070 and 2080 by way of communication links 2090 and 2095.

Figure 21:
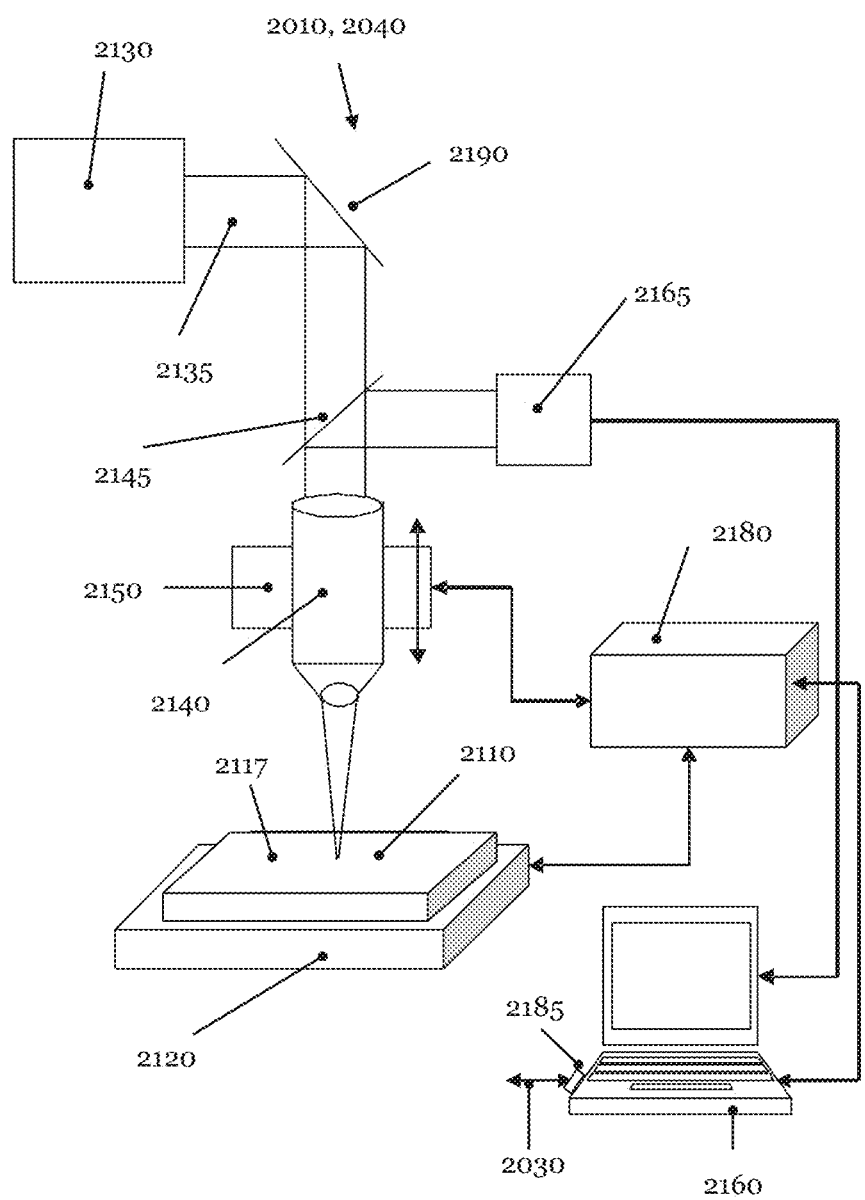
FIG. 21 schematically shows a block diagram of a first part of the apparatus of FIG. 20.

FIG. 21 shows the part 2010 of the apparatus 2000 as a schematic block diagram. The part 2010 of the apparatus 2000 can be used to compensate for defects 820, 920, 1020 of the mask blanks 800, 900, 1000. The part 2010 of the apparatus 2000 comprises a tensioning apparatus 2120, which can be movable in three dimensions. The mask blank 2110 can be fastened to the tensioning apparatus 2120 using various techniques, for example by clamping. The mask blank 2110 can be one of the mask blanks 800, 900 or 1000, which is mounted upside down such that its rear-side substrate surface 2117 points toward the lens 2140.

The part 2010 of the apparatus 2000 comprises a pulse laser source 2130, which produces a beam or a light beam 2135 of pulses or light pulses. The laser source 2130 produces light pulses with a variable duration. The laser source 2130 can produce ultrashort laser pulses, i.e., laser pulses with pulse lengths in the femtosecond range. However, the pulse length of the laser pulses can also be increased continuously to approximately 100 ps. The pulse energy of the light pulses that are produced by the pulsed laser source 2130 can further be tuned over a huge range reaching from 0.01 μJ per pulse to 10 mJ per pulse. Further, the repetition rate of the light pulses can comprise a range from 1 Hz to 100 MHz. In a preferred embodiment, the light pulses can be produced by Ti:sapphire laser, which operates at a wavelength of 800 nm. However, the methods described below are not restricted to this type of laser; in principle, it is possible to use all laser types that have a photon energy which is smaller than the bandgap of the substrate of the mask blank 2110 and that are able to produce pulses with durations in the femtosecond range. By way of example, use can likewise be made of Nd-YAG laser systems or dye laser systems.

Further, the part 2010 of the apparatus 2000 may comprise more than one pulse laser source 2130 not shown in FIG. 21).

The controllable mirror 2190 directs the pulsed laser beam 2135 into the focusing lens 2140. The lens 2140 focuses the pulsed laser beam 2135 into the substrate of a mask blank 2110 through the rear-side substrate surface 617. The NA (numerical aperture) of the applied lens depends on the predetermined spot size of the focal spot and on the position of the focal spot in the substrate of the mask blank 2110 relative to the rear-side substrate surface 2117. The NA of the lens can be up to 0.9, resulting in a focal spot diameter of substantially 1 μm and in a maximum intensity of substantially $10^{20}$ W/cm$^2$.

The part 2010 of the apparatus 2000 comprises a controller 2180 and a computer system 2160, which controls the displacements of the two-axis positioning system of the sample holder 2120 in the xy-plane, i.e., perpendicular to the laser beam 2135 of the laser source 2130. The controller 2180 and the computer system 2160 further control the displacement of the lens 2140 perpendicular to the plane of the tensioning apparatus 2120 (z-direction) by way of a single-axis positioning stage 2150, at which the lens 2140 is fastened. It should be noted that, in other embodiments of the part of the apparatus 2000, the tensioning apparatus 2120 can be equipped with a three-axis positioning system in order to move the mask blank 2110 to the target position and the lens 2140 can be stationary, or the tensioning device 2120 can be stationary and the lens 2140 can be movable in three dimensions. Further, it is conceivable to equip both the lens 2140 and the tensioning apparatus 2120 with three-axis positioning systems.

The computer system 2160 can be a microprocessor, a general-purpose processor, a special-purpose processor, a CPU (central processing unit), a GPU (graphics processing unit) or the like. It can be arranged in the controller 2180 or embodied as a separate unit, for instance as a PC (personal computer), a workstation, a mainframe, etc. Further, the computer system 2160 can comprise input/output units, such as, for instance, a keyboard, touchpad, mouse, a video/graphics display, printer, etc. Additionally, the computer 2160 can further comprise a volatile and/or non-volatile memory. The computer system 2160 can be implemented in hardware, software, firmware or a combination thereof. Moreover, the computer system 2160 may control the laser source 2130 (not shown in FIG. 21).

The computer system 2160 can comprise one or more algorithms that are designed to determine one or more pixel arrangements from the positions of the defects 800, 900, 1000 of the mask blank 2110 and the design data for the pattern 750 of the mask blank 2110 such that the defects 800, 900, 1000 on a mask, which is produced from the mask blank 2110, have substantially no effect.

Further, the computer system 2160 has at least one interface 2185, with the aid of which the part 2010 of the apparatus 2000 can be linked via the link 2030 to the part 2020 of the apparatus 2000 and/or to an external network.

Moreover, the part 2010 of the apparatus 2000 can be operated autonomously as an independent apparatus 2040, i.e., without the part 2020 of the apparatus 2000. The independent apparatus 2040 only requires an interface 2185 to an external network. The apparatus 2000 and/or the apparatus 2040 obtains data in respect of the positions of the defects 820, 920, 1020 and the design data for the mask blank 2110 via the interface 2185.

Finally, the apparatus 2000, 2040 may comprise an observation system including a CCD camera (charge-coupled device circuit), which receives light of an exposure source arranged in the tensioning apparatus 2120 via the dichromatic mirror 2145. The observation system 2145 simplifies navigating the mask 2110 to the target position.

Figure 22:
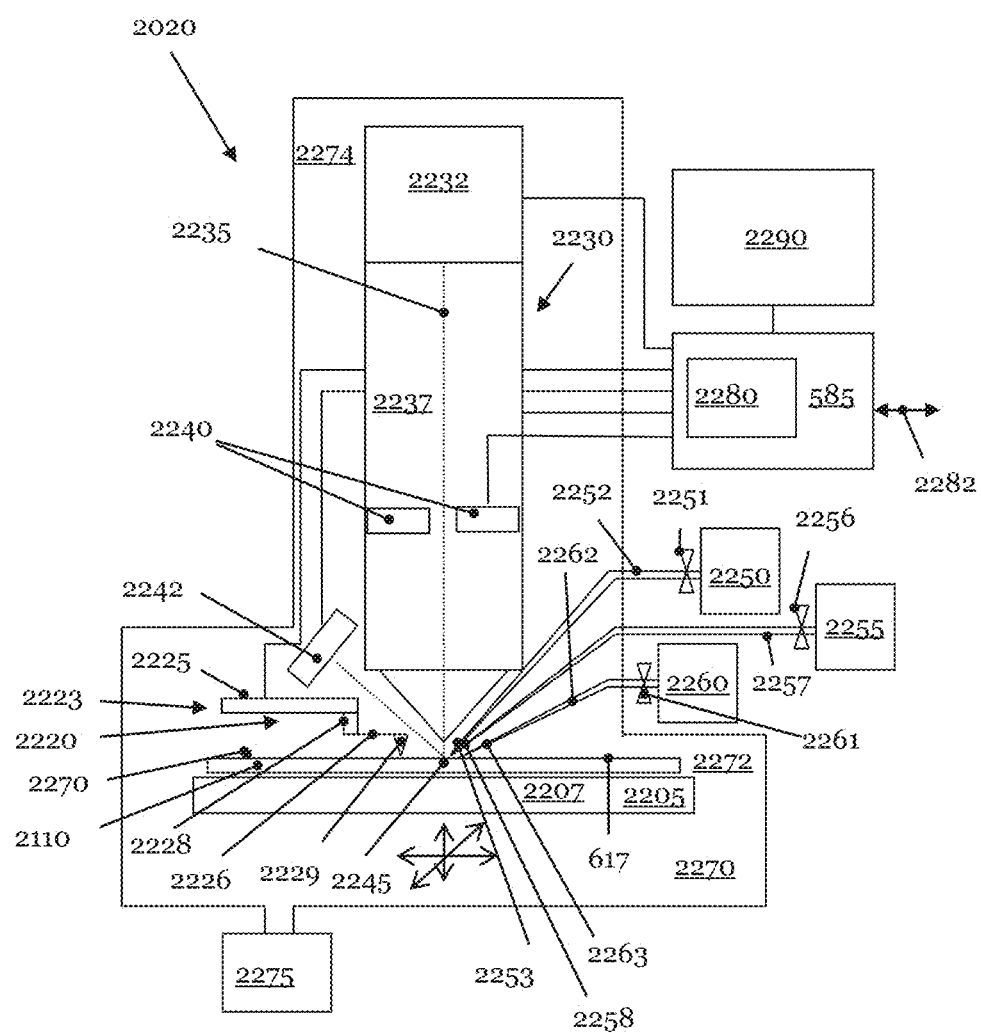
FIG. 22 reproduces a schematic section through a second part of the apparatus of FIG. 20.

FIG. 22 shows a schematic section through some important components of the part 2020 of the apparatus 2000. Like the apparatus 2040, the part 2020 of the apparatus 2000 can be operated as an independent unit. The part 2020 of the apparatus 2000 can be used for carrying out a change in at least one pattern element 760, 770 of the pattern 750 of the photomask 700. The partial apparatus 2020 illustrated in FIG. 22 comprises a scanning probe microscope 2220 which, in an exemplary partial apparatus 2020, is embodied in the form of a scanning force microscope 2220 or an atomic force microscope (AM) 2220. The scanning probe microscope 2220 is an optional component of the partial apparatus 2020. The contour of the defects 820, 920, 1020 of the mask blanks 800, 900, 1000 can be analyzed by the scanning probe microscope 2220. Further, the exemplary partial apparatus 2020 of FIG. 22 comprises a modified scanning particle microscope 2230, which is realized as a modified scanning electron microscope (SEEM) 2230.

The measuring head 2223 of the scanning probe microscope 2220 is illustrated in the partial apparatus 2020 of FIG. 22. The measuring head 2223 comprises a holding apparatus 2225. The measuring head 2223 is fastened to the frame of the partial apparatus 2020 by use of the holding apparatus 2225 (not shown in FIG. 22). A piezo-actuator 2228 which facilitates a movement of the free end of the piezo-actuator 2228 in three spatial directions (not illustrated in FIG. 22) is attached to the holding apparatus 2225 of the measuring head 2223. A bending bar 2226 or a cantilever 2226 is fastened to the free and of the piezo-actuator 2228. The cantilever 2226 has a holding plate for attachment to the piezo-actuator 2228. The free end of the cantilever 2226 has a measuring tip 2229.

In the partial apparatus 2020 of FIG. 22, a sample 2210 to be examined, for example, the mask blank 800, 900, 1000 or the photomask 700, is fastened to a sample stage 2205. The sample surface 2212 of the sample 2210 to be examined points away from the sample stage 2205. By way of example, the sample 2210 can be fixed by placing the sample 2210 on the bearing points of the sample stage 2205 in a vacuum or high vacuum environment or by an electrostatic interaction between the sample stage 2205 and an electrically conductive rear side of the sample 2210. Moreover, the sample 2210 can be held on the sample stage 2205 by clamping (not shown in FIG. 22).

As symbolized by arrows in FIG. 22, the sample stage 2205 can be moved by a positioning system 2207 in three spatial directions relative to the measuring head 2223 of the AFM 2220 and/or the point of incidence of an electron beam 2235. In the example in FIG. 22, the positioning system 2207 is embodied in the form of a plurality of micromanipulators or displacement elements. The movement of the sample stage 2205 in the sample plane, i.e., in the xy-plane, can be controlled by two interferometers (not shown in FIG. 22). In an alternative embodiment, the positioning system 2207 may additionally contain piezo-actuators (not illustrated in FIG. 22). The positioning system 2207 is controlled by signals of a control device 2280. In an alternative embodiment, the control device 2280 does not move the sample stage 2205, but rather the holding apparatus 2225 of the measuring head 2223 of the AFM 2220. It is furthermore possible for the control device 2280 to perform a coarse positioning of the sample 2210 in height (z-direction) and for the piezo-actuator 2215 of the measuring head 2223 to perform a precise height setting of the AFM 2220. The control device 2280 can be part of a computer system 2285 of the partial apparatus 2020.

As already mentioned, the exemplary scanning particle microscope 2230 of FIG. 22 contains a modified SEM 2230. An electron gun 2232 produces an electron beam 2235, which is directed as a focused electron beam 2235 onto the sample 2210 at the location 2245 by the imaging elements, not illustrated in FIG. 5, arranged in the column 2337, said sample being arranged on a sample stage 2205. Further, the imaging elements of the column 2237 of the SWM 2230 can scan at the electron beam 2235 over the sample 2210.

The electrons backscattered from the electron beam 2235 by the sample and the secondary electrons produced by the electron beam 2235 in the sample 2210 are registered by the detector 2240. A detector 2240 that is arranged in the electron column 2237 is referred to as an "in lens detector." The detector 2240 can be installed in the column 2237 in various embodiments. The detector 2240 is controlled by the control device 2280. Further, the control device 2280 of the SPM 2230 receives the measurement data of the detector 2240. The control device 2280 can produce images from the measurement data and/or the data of the measuring head 2223 or the measuring tip 2229, said images being presented on the monitor 2290.

Further, the control device 2280 and/or the computer system 2285 can comprise one or more algorithms that cause the partial apparatus 2020 to modify at least one pattern element 760, 770 of the pattern 750 of the photomask 700. Further, the algorithm or the algorithms can act on the apparatus 2020 in order to examine a mask blank 800, 900, 1000 and/or photomask 700 by use of the measuring tip 2229 of the AFM 2220 or the electron beam 2235 of the SEM 2230.

As an alternative or in addition thereto, the scanning probe microscope 2230 may have a detector 2242 for backscattered electrons or for secondary electrons, said detector being arranged outside of the electron column 2237. The detector 2242 is likewise controlled by the control device 2280.

In addition to imaging the sample 2210, the electron beam 2235 of the SEM 2230 also can be used for modifying at least one pattern element 760, 770 of the pattern 750. For the purposes of changing pattern elements 760, 770 of the EUV mask 700 or, in general, of the photomask 700, the partial apparatus 2020 in FIG. 22 has three different supply containers 2250, 2255 and 2260.

The first supply container 2250 stores a first precursor gas, for example a metal carbonyl, for instance chromium hexacarbonyl ($Cr(CO)_6$), or metal alkoxide, such as TEOS, for instance. With the aid of the precursor gas stored in the first supply container 2250, material of a pattern element 760, 770 missing in a local chemical reaction can be deposited on the capping layer 630 of the photomask 700, with the electron beam 2235 of the SEM 2230 acting as an energy supplier in order to split the precursor gas stored in the first supply container 2250 at the position at which material should be deposited on the capping layer 630 of the multilayer structure 840, 940, 1040 of the mask 700. This means that an EBID (electron beam induced deposition) process for local deposition of absorbing material is carried out by the combined provision of an electron beam 2235 and a precursor gas.

An electron beam 2235 can be focused onto spot diameter of a few nanometers. As a result, an EBID process allows the local deposition of absorbing material with a spatial resolution in the low two digit nanometer range.

The second supply container 2255 stores an etching gas, which makes it possible to perform a local electron beam induced etching (EBIE) process. Excess absorbing material of one or more pattern elements 760, 770 can be removed from the photomask 700 with the aid of an electron beam induced etching process. An etching gas can comprise xenon difluoride ($XeF_2$), chlorine ($Cl_2$), oxygen ($O_2$), ozone (O3), water vapor ($H_2O$), hydrogen peroxide ($H_2O_2$), dinitrogen monoxide ($N_2O$), nitrogen monoxide (NO), nitrogen dioxide ($NO_2$), nitric acid ($HNO_3$), ammonia ($NH_3$) or sulfur hexafluoride ($SF_6$), for example.

An additive gas can be stored in the third supply container 2260, said additive gas being added to the etching gas kept available in the second supply container 2255 or to the precursor gas stored in the first supply container 2250 where necessary. Alternatively, the third supply container 2260 can store a second precursor gas or second etching gas.

In the partial device 2020 of FIG. 22, each of the supply containers 2250, 2255 and 2260 has its own control valve 2251, 2256 and 2261 in order to monitor or control the amount of the corresponding gas that is provided per unit time, i.e., the gas volumetric flow at the location 2245 of the incidence of the electron beam 2235 on the sample 2210. The control valves 2251, 2256 and 2261 are controlled and monitored by the control device 2280. Using this, it is possible to set the partial pressure conditions of the gases provided at the processing location 2245 for changing one or more pattern elements 760, 770 in a broad range.

Furthermore, in the exemplary partial apparatus 2020 in FIG. 22, each supply container 2250, 2255 and 2260 has its own gas feedline system 2252, 2257 and 2262, which ends with a nozzle 2253, 2258 and 2263 in the vicinity of the point of incidence 2245 of the electron beam 2235 on the sample 2210.

The supply containers 2250, 2255 and 2260 can have their own temperature setting element and/or control element, which enables both cooling and heating of the corresponding supply containers 2250, 2255 and 2260. This makes it possible to store and in particular provide the precursor gas(es) and/or the etching gas(es) at the respectively optimum temperature (not shown in FIG. 22). The control device 2280 can control the temperature setting elements and the temperature control elements of the supply containers 2250, 2255, 2260. When processing the sample 2210 by use of EBID and/or EBIE processes, the temperature setting elements of the supply containers 2250, 2255 and 2260 can further be used to set the vapor pressure of the precursor gases stored therein by way of the selection of an appropriate temperature.

The partial apparatus 2020 illustrated in FIG. 22 can be operated under ambient conditions or in a vacuum chamber 2270. Modifying a pattern element 760, 770 necessitates a reduced pressure in the vacuum chamber 570 relative to the ambient pressure. For this purpose, the partial apparatus 2020 in FIG. 22 comprises a pump system 2275 for producing and for maintaining a reduced pressure required in the vacuum chamber 2270. With closed control valves 2251, 2256 and 2261, a residual gas pressure of $<10^{-4}$ Pa is achieved in the vacuum chamber 2270. The pump system 2275 can comprise separate pump systems for the upper part 2274 for providing the electron beam 2235 of the SEM and for the lower part 2272 or the reaction chamber 2272 (not shown in FIG. 22).

Figure 23:
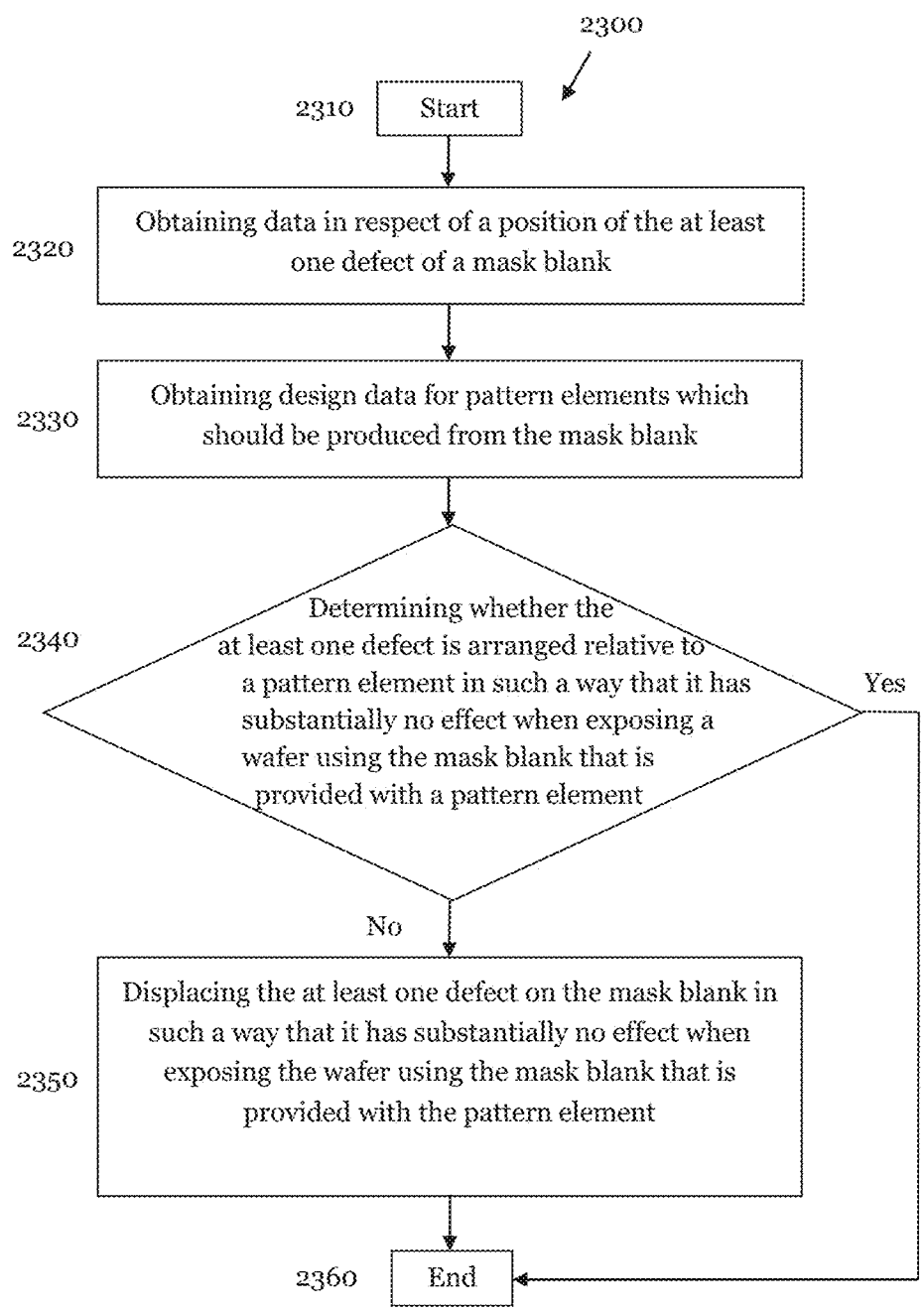
FIG. 23 presents a flowchart of a method according to the invention for compensating at least one defect of a mask blank.

FIG. 23 reproduces a flowchart 2300 of a method according to the invention. The method begins with step 2310. In the first step 2320, data are obtained in respect of a position of at least one defect 820, 920, 1020 of a mask blank 800, 900, 1000. By way of example, the computer system 2160 of the apparatus 2000, 2040 can obtain the position data of one or more defects 820, 920, 1020 from an inspection tool via the interface 2185. As explained in the context of FIGS. 14 to 19, the active surface 1410 of a mask blank typically has more than one defect 820, 920, 1020.

In the step 2330, design data for pattern elements 760, 770 of a pattern 750, which should be produced on the mask blank 800, 900, 1000, are obtained. By way of example, the design data may have been obtained from the computer system 2160 of the apparatus 2000, 2040 via the interface 2185.

In the decision block 2340, it is determined whether the at least one defect 820, 920, 1020 comes to rest relative to a pattern element 760, 770 in such a way that it has substantially no effect when exposing a wafer using the mask blank 800, 900, 1000 that is provided with the pattern element 760, 770. If this is the case, the method ends at step 2360. Determining the position of a defect 820, 920, 1020 relative to a pattern element to be produced can be carried out, for example, using the controller 2180 and/or the computer system 2160 of the apparatus 2000, 2040.

Figure 24:
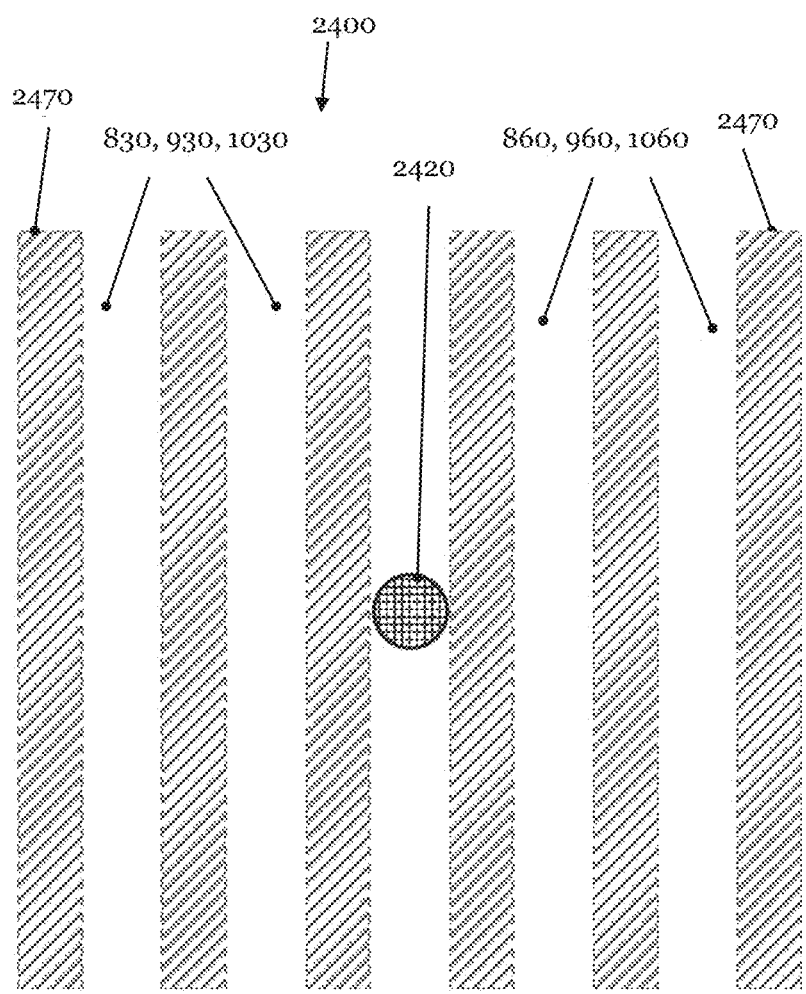
FIG. 24 shows a section of a plan view of a mask blank, on which a pattern in the form of a line/space (L/S) arrangement should be produced, wherein the mask blank has a defect in the illustrated section.

FIG. 24 schematically shows a section 2400 of a plan view of a mask blank 800, 900, 1000. The mask blank 800, 900, 1000 has a defect 2420 in the section 2400, said defect becoming apparent on the surface 830, 930, 1030 of the absorption layer 860, 960, 1060 of the mask blank 800, 900, 1000. The defect 2420 can be one of the defects 820, 920 or 1020. Pattern elements 2470 of an L/S arrangement, which are intended to be manufactured by structuring the absorption layer 860, 960, 1060 of the mask blank 800, 900, 1000, are overlaid on the section 2400. It is possible to gather from FIG. 24 that the defect 2420 is located between two pattern elements 2470 and it would consequently lead to a printable defect on a wafer after a photomask 700 has been manufactured from the mask blank 800, 900, 1000 by producing the pattern elements 2470 to be produced. This means, FIG. 24 elucidates the negative response to the condition of the decision block 2340 of the flowchart 2300 in FIG. 23.

If the condition of the decision block 2340 of the flowchart 2300 is not satisfied, the at least one defect 2420 of the mask blank 800, 900, 1000 is displaced in step 2350 such that it has substantially no effect when exposing the wafer using the mask blank 800, 900, 1000 that has been provided with the pattern elements 2470. Following this, the method ends in block 2360.

Figure 25:
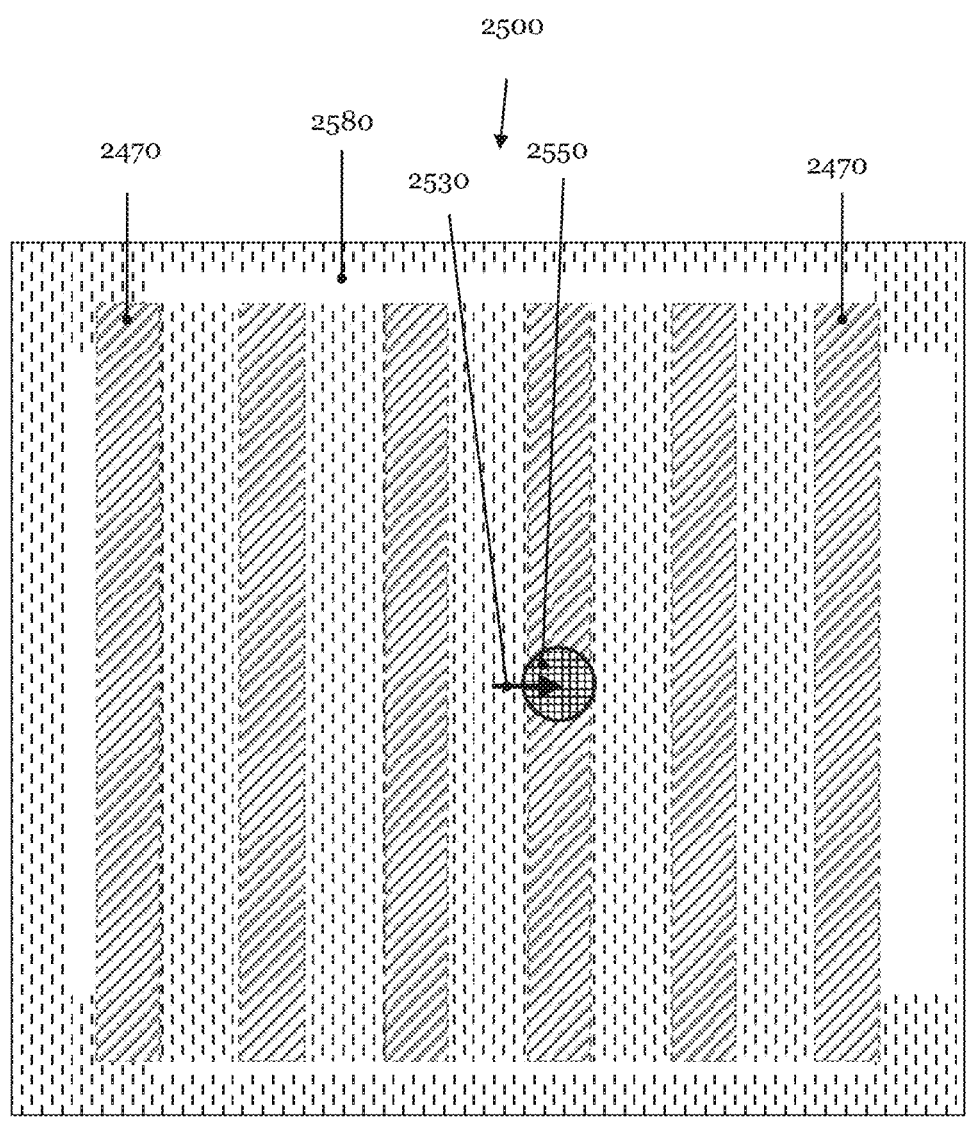
FIG. 25 reproduces the section of the mask blank of FIG. 24 after the introduction of one or more pixel arrangements into the substrate of the mask blank, as a result of which the defect is displaced to a target position.
Figure 26:
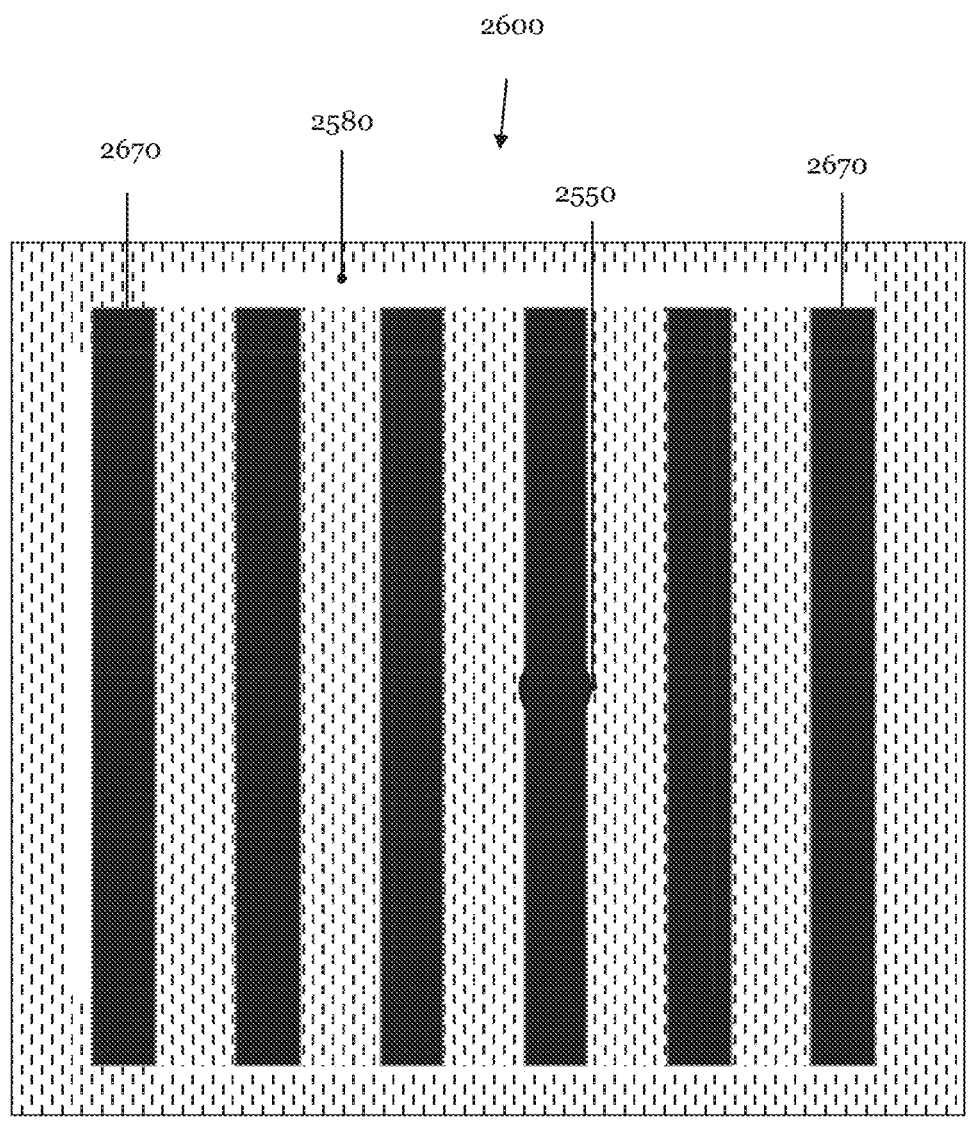
FIG. 26 presents the section of the mask blank of FIG. 25 after the pattern to be produced was produced by structuring the absorption layer.

FIG. 25 illustrates step 2350 of the method illustrated in FIG. 23. In order to displace the defect 2420 by a distance corresponding to the half pitch of the L/S arrangement to be produced, a pixel arrangement 2850 is calculated, said pixel arrangement displacing the defect 2420 in the +x-direction or −x-direction by the width of a pattern element 2470 to be produced. Thereupon, the calculated pixel arrangement 2580 is introduced into the substrate of the mask blank 800, 900, 1000 via the rear side 617 with the aid of the apparatus 2000, 2040. The one pixel arrangement 2580 or the plurality of pixel arrangements 2580 are illustrated by dashed lines in FIG. 25 and the following figures. Writing the pixel arrangement 2580 into the substrate of the mask blank 800, 900, 1000 displaces the defect 2420 on the surface 830, 930, 1030 of the absorption layer 860, 960, 1060 by a distance corresponding to the half pitch. This is indicated by the arrow 2530 in FIG. 25.

Finally, the pattern elements 2470 to be produced, as provided originally by the design data, are manufactured as pattern elements 2670 from the absorption layer 860, 960, 1060 of the mask blank 800, 900, 1000. Consequently, the parameter settings of the scanner are not restricted by the mask production. The displaced defect 2550 is largely hidden under a pattern element 2670 of the L/S arrangement. As explained in the context of the phrase "effective size," which was discussed within the scope of FIG. 10, the still visible peripheral sections of the displaced defect 2550 do not lead to a disadvantageous effect when exposing the photomask produced from the mask blank 800, 900, 1000.

A single pixel arrangement 2580 is sufficient for displacing a single defect present on a mask blank 800, 900, 1000, for instance the defect 2420 in FIG. 24. As indicated in FIG. 25, said pixel arrangement can extend over the entire active region 1410 of a mask blank 800, 900, 1000 and the pixel density of the pixel arrangement 2580 varies over the active region 1410 of the mask 800, 900, 1000. In the case of only one defect 2420 present in the active region 1410 of a mask blank 800, 900, 1000, it is possible to use a spatially restricted pixel arrangement 1220, 1320 with a constant pixel density—as discussed in the context of FIGS. 12 and 13—for the purposes of displacing the defect 2420 by a defined distance.

However, a plurality of defects 2420 are typically present within an active surface 1410 of a mask blank 800, 900, 1000—as explained in conjunction with the discussion of FIGS. 14-19. As explained in the context of FIGS. 14 to 19, the displacement of a defect 2420 by the introduction of one or more pixel arrangements 2580 into the substrate of the mask blank 800, 900, 1000 influences the positions of the remaining defects 2420 of the mask blank 800, 900, 1000. Therefore, one or more pixel arrangements 2580 that extend over the entire active region of the mask blank and whose pixel density is variable over the mask blank 800, 900, 1000 or the active region 1410 thereof are established in a common optimization process, said one or more pixel arrangements leading to displacements of all defects 2420 present that yield a best possible compensation of all defects 2420. In FIGS. 14-19, use is made of four pixel arrangements 2580, the predominant expansion directions of which point in different directions in order to obtain the ideal compensation of the defects 2420 present on the mask blank 800, 900, 1000.

When taking account of all defects of a mask blank 800, 900, 1000 in a common optimization process, it may be expedient to displace an individual defect 2420, not as illustrated in FIGS. 24 and 25, by a minimum distance. As explained in conjunction with FIGS. 12 and 13, a single pixel arrangement 1320 can already displace defects 2420 by several hundred nanometers. By way of arrows, FIG. 27 symbolizes possible positions to which the defect 2420 can be moved in an exemplary manner. As elucidated in FIG. 27 and as discussed above, the area accessible to a displacement of a defect is continuous and it has dimensions of several hundred nanometers. The large solution space in which the position of the defect 2420 can be modified facilitates an extensive compensation of a number of defects in a common optimization process. In particular, this renders possible, for example, the compensation of defects lying close together which should be displaced in different directions. By way of example, this applies by the defects in FIG. 14 symbolized by the arrows 1430 and 1435.

The defects 820, 920, 1020 of a mask blank 800, 900, 1000 may also have a systematic distribution component in addition to a random occurrence over the active region 1410. Under this condition and/or in order to improve the result of the compensation process of the common optimization process even further, it may be expedient, in addition to displacing the defects 820, 920, 1020, to additionally include in the common optimization process the parameters of an imaging transformation of the pattern elements 2470 or of the pattern to be produced. The common variation of the positions of the defects 820, 920, 1020 of the parameters of an imaging transformation are explained below using the example of a displacement of the pattern elements 2470 to be produced in FIGS. 28 and 30.

Figure 28:
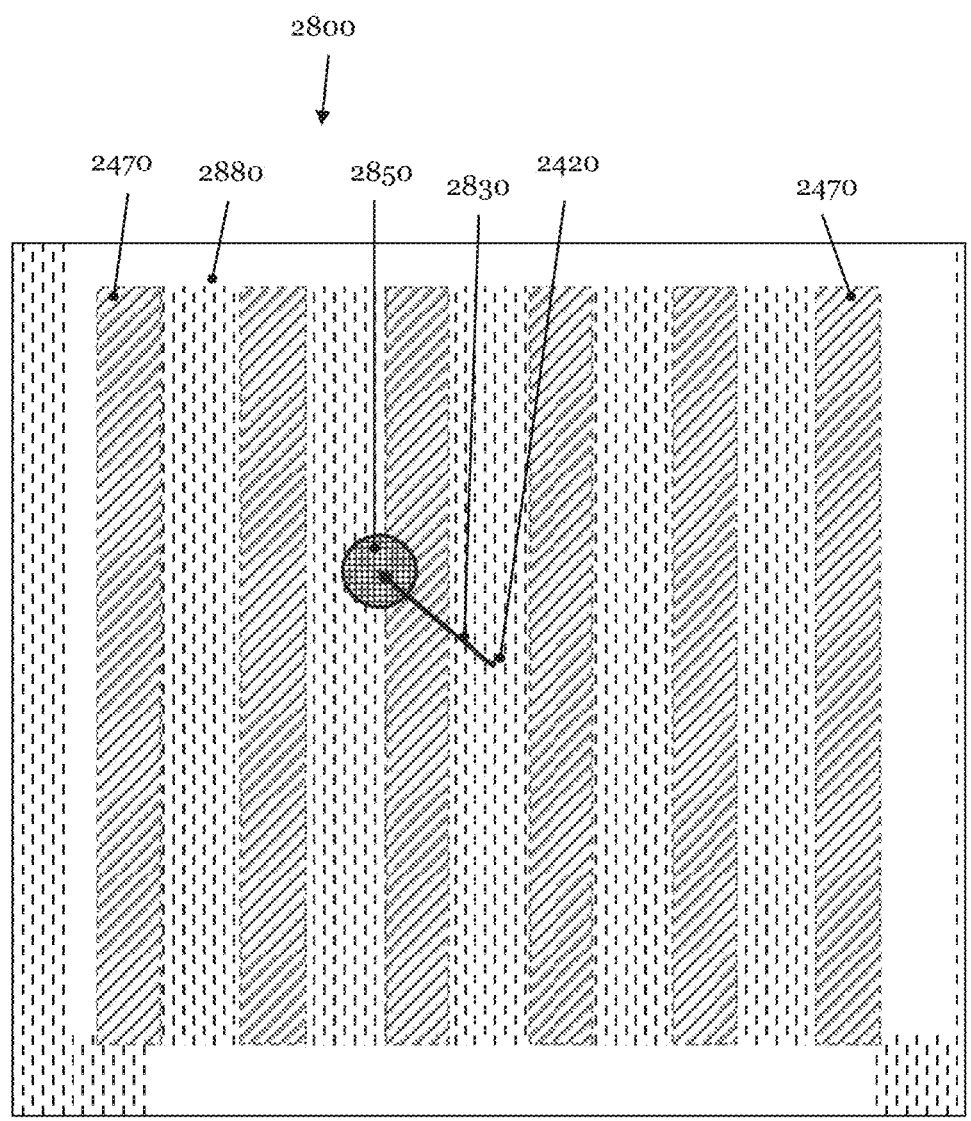
FIG. 28 repeats the section of the mask blank of FIG. 24 after writing one or more pixel arrangements into the substrate of the mask blank has displaced the defect to its target position.

The section 2800 in FIG. 28 shows the initial situation of the section 2400 of FIG. 24 of the mask blank 800, 900, 1000 after introducing a pixel arrangement 2880 or a plurality of pixel arrangements 2880 into the substrate 810, 910, 1010 of the mask blank 800, 900, 1000. The common optimization process of the parameters, which describe the displacement of the defects 820, 920, 1020, and of the parameters, which describe a displacement of the pattern elements 2470 to be produced as a special case of an imaging transformation, has yielded for the example in FIGS. 28-30 that a displacement of the pattern elements 2470 to be produced by the distance of half a half pitch in the x-direction facilitates the best compensation of all defects (not illustrated in FIG. 28). Further, the common optimization process for the discussed example has yielded the result that a displacement of the defect 2420 by a distance of 1.5 half pitch in the −x-direction and by 1.3 half pitch in the y-direction allows the best-possible compensation of all defects for the defect 2420 and the surrounding defects, which are not reproduced in the section 2400 in FIG. 24.

Figure 29:
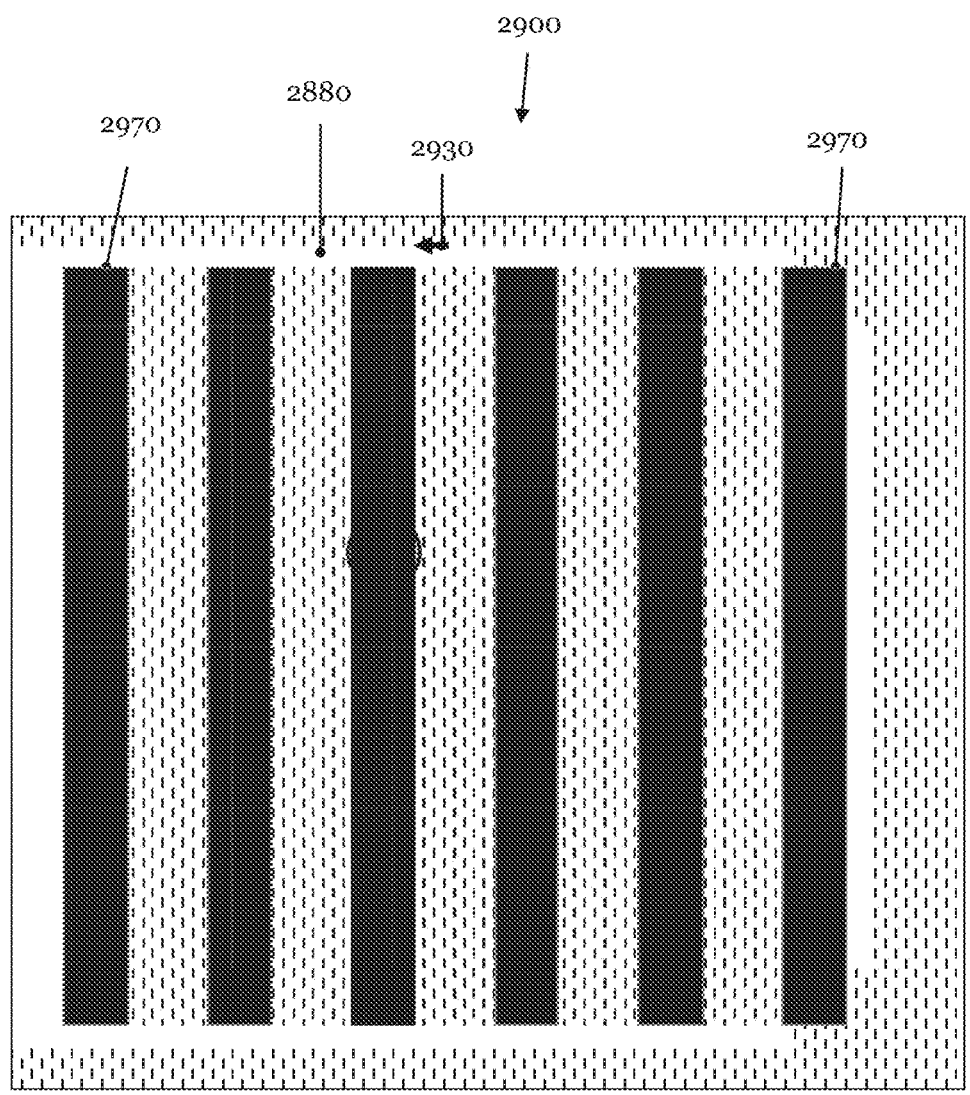
FIG. 29 shows the section of FIG. 28 after the pattern elements of the L/S arrangement, displaced in respect of the design data, were produced by structuring the absorption layer.

The section 2800 in FIG. 28 shows the section 2400 of FIG. 24 after the introduction of the pixel arrangements 2880 into the substrate of the mask blank 800, 900, 1000. The section 2900 in FIG. 29 presents the produced pattern elements 2970 of the L/S arrangement, which were produced in a displaced manner by half of a half pitch, indicated by the arrow 2930 in FIG. 9, in the −x-direction relative to the design data (elucidated in FIG. 28 by the pattern elements 2470 to be produced).

Figure 30:
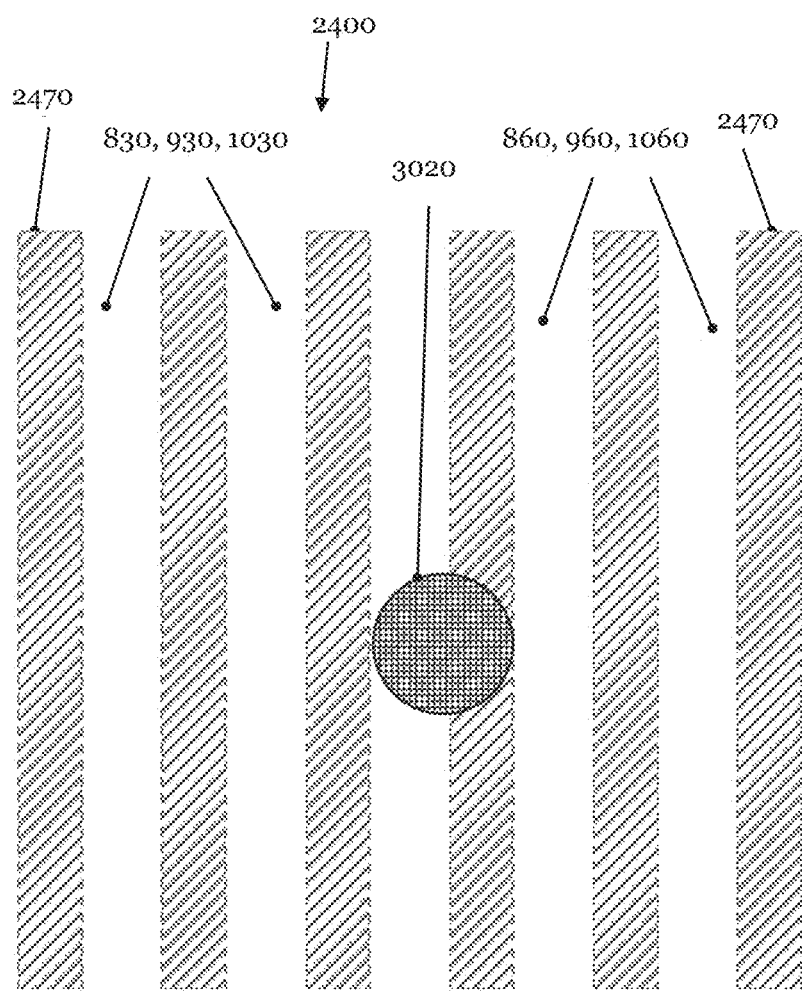
FIG. 30 illustrates the section of the mask blank of FIG. 24 with a defect, the area of which is four times greater than in FIG. 24.

FIG. 30 reproduces the section 2400 of FIG. 24 with the difference that the defect 3020 in the section 3000 has a lateral extent of approximately two times the half pitch. Since the defect 3020 cannot be displaced into a region of the mask blank 800, 900, 1000 that has pattern elements which are larger than the pattern elements 2470 of the L/S arrangement, it is not possible to completely compensate the defect 3020. A first exemplary embodiment of the best possible compensation of the defect 3020 is explained on the basis of FIGS. 31 and 32.

Figure 31:
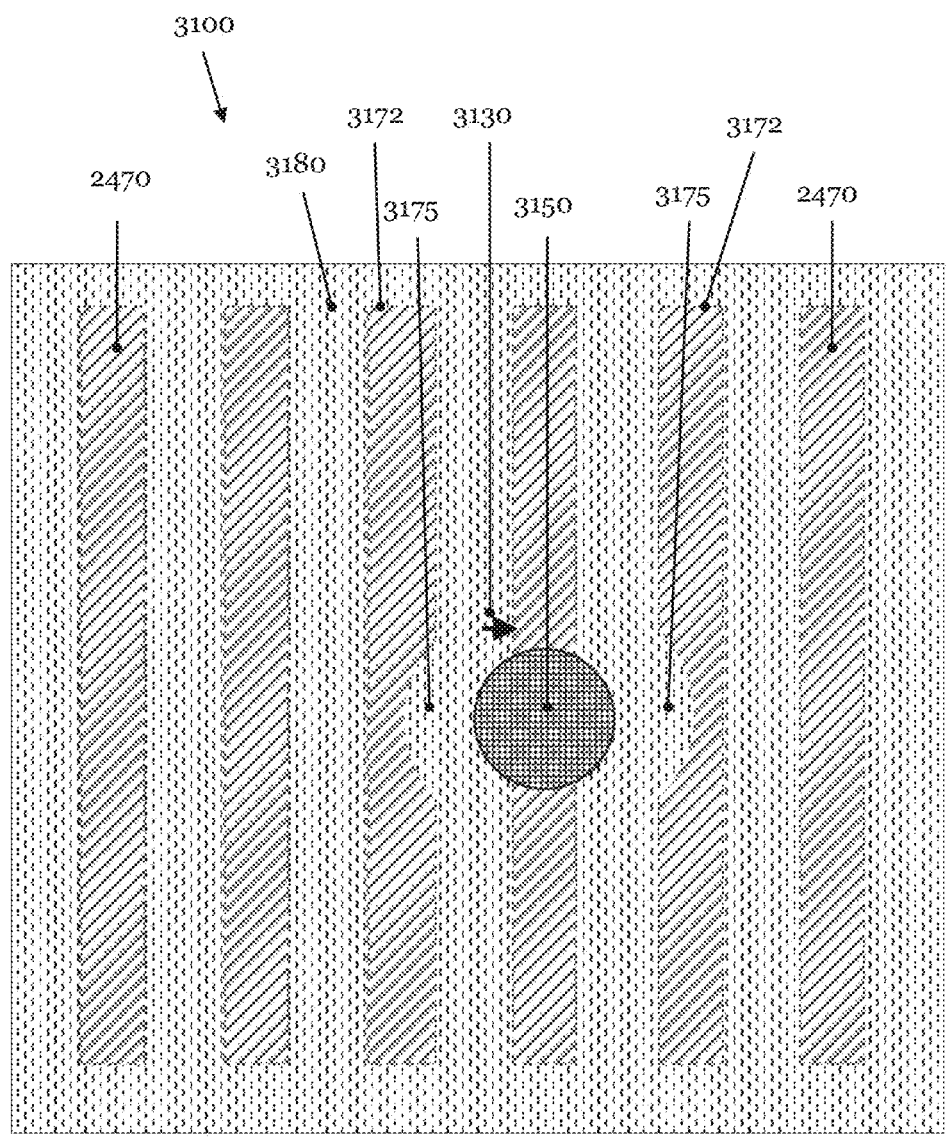
FIG. 31 reproduces the section of FIG. 30, in which the results of a common optimization process are illustrated; firstly, the defect was displaced by the introduction of one or more pixel arrangements and, secondly, in which the contours of two pattern elements were locally modified in comparison with the design data.

The parameters for a best possible compensation, which describe a displacement of the defect 3020 by one or more pattern arrangements 3180 and a local change 3175 of the contour of two pattern elements 3172 to be produced in the vicinity of the defect 3020, are determined in a common optimization process. FIG. 31 shows the defect 3150 displaced by the distance of half a half pitch after writing the pixel arrangement(s) 3180, established in the optimization process, into the substrate of the mask blank 800, 900, 1000. The displacement of the defect 3020 is elucidated by the arrow 3130 in FIG. 31. Further, in FIG. 31, the local changes 3175 of the two pattern elements 3172 of the pattern to be produced surrounding the displaced defect 3150, calculated by use of the common optimization process, are plotted by hatching in FIG. 31. An optimization process which varies both the parameters of the displacement of a defect 3020 and the parameters of the local change 3175 of the pattern elements 3172 to be produced increases the solution space for both compensation measures and thereby facilitates the best possible compensation of the defect 3020. Additionally, the common optimization process can comprise the parameters of an imaging transformation of the pattern 750 (not illustrated in FIG. 31). An optimization process including an imaging transformation in the form of a displacement of a pattern to be produced is explained in conjunction with FIGS. 28 and 29.

Figure 32:
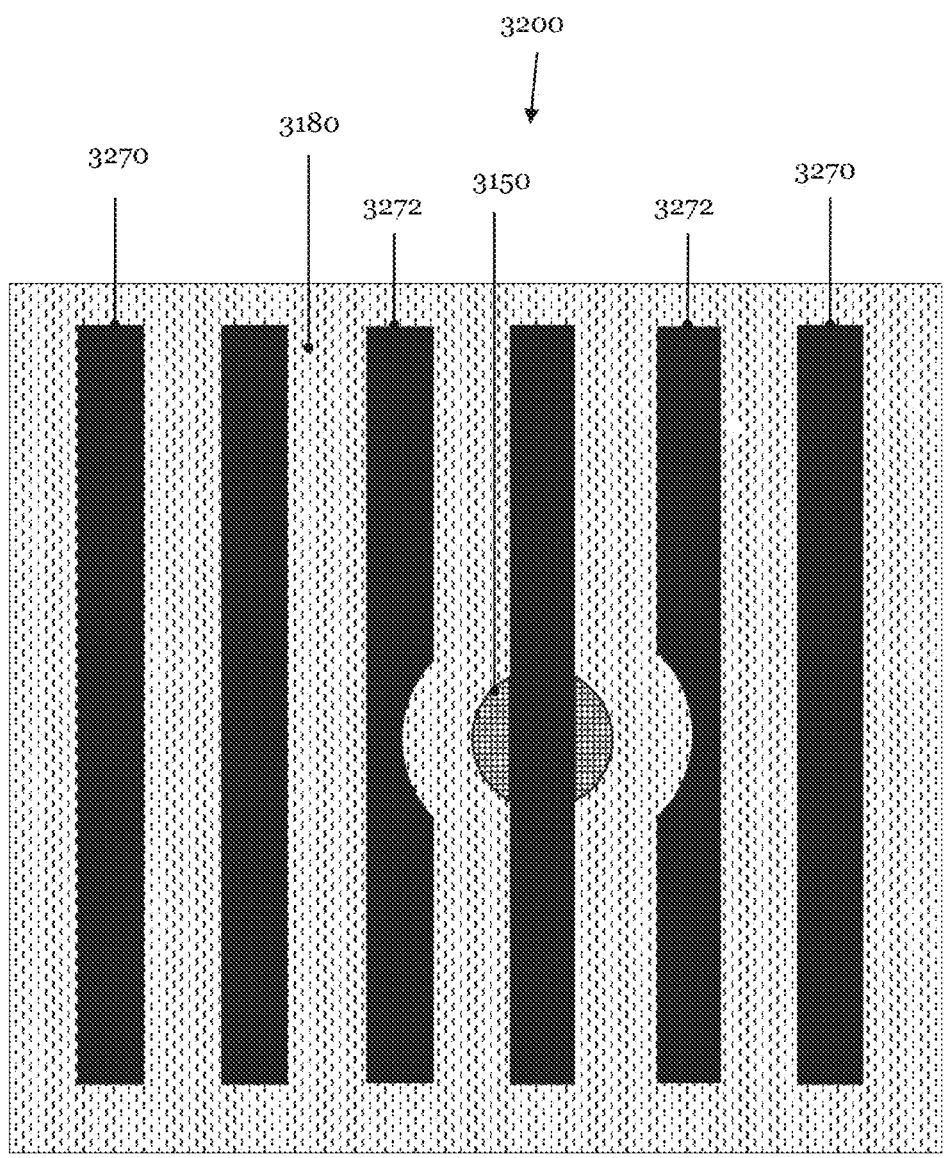
FIG. 32 presents the section of FIG. 31 after producing the locally modified pattern.

The section 3200 in FIG. 32 illustrates the completion of the defect compensation of the defect 3020 after producing the L/S arrangement with the pattern elements and the locally modified pattern elements 3272. Since the described method undertakes local changes to pattern elements 3172 prior to the manufacture thereof, i.e., on the basis of design data, the described compensation method can be considered to be a "pre-compensational repair."

Figure 33:
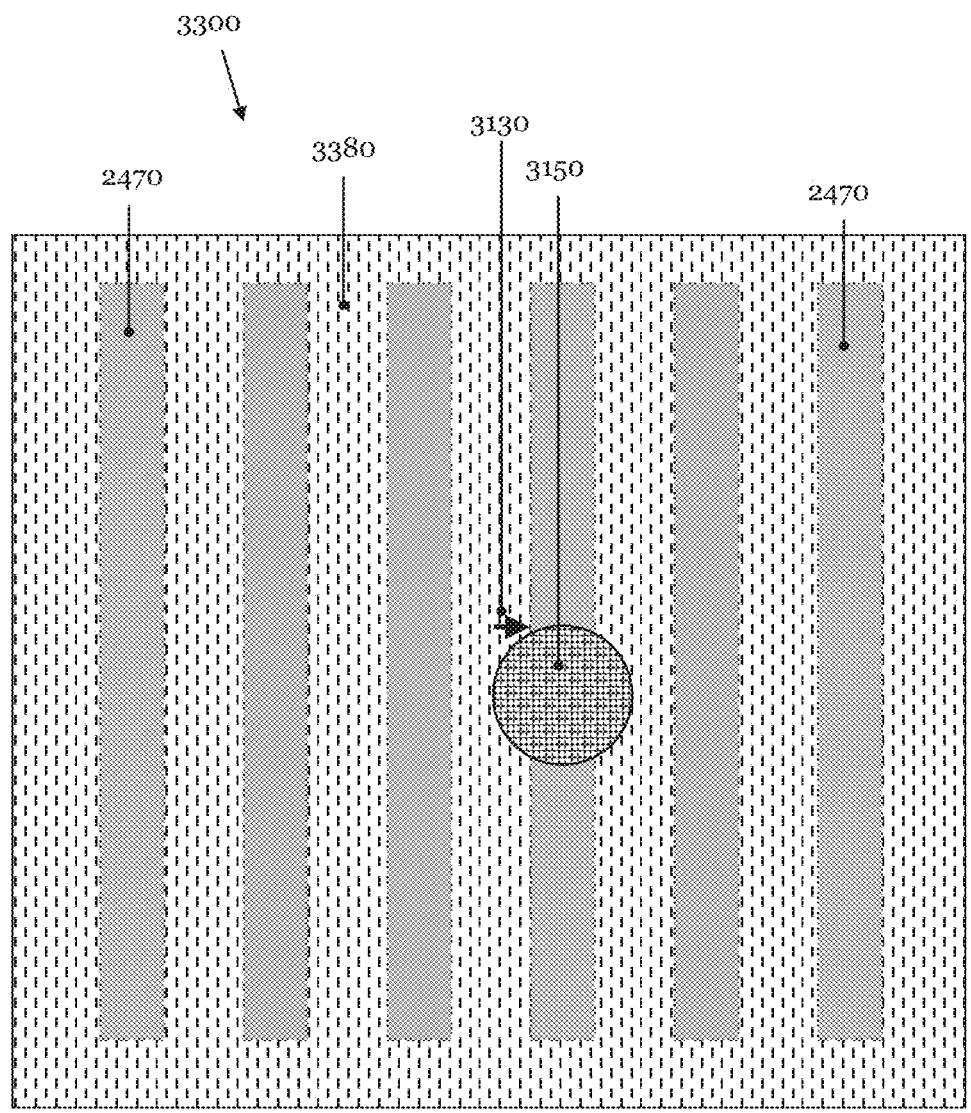
FIG. 33 represents the second of FIG. 30 after displacing the defect.
Figure 34:
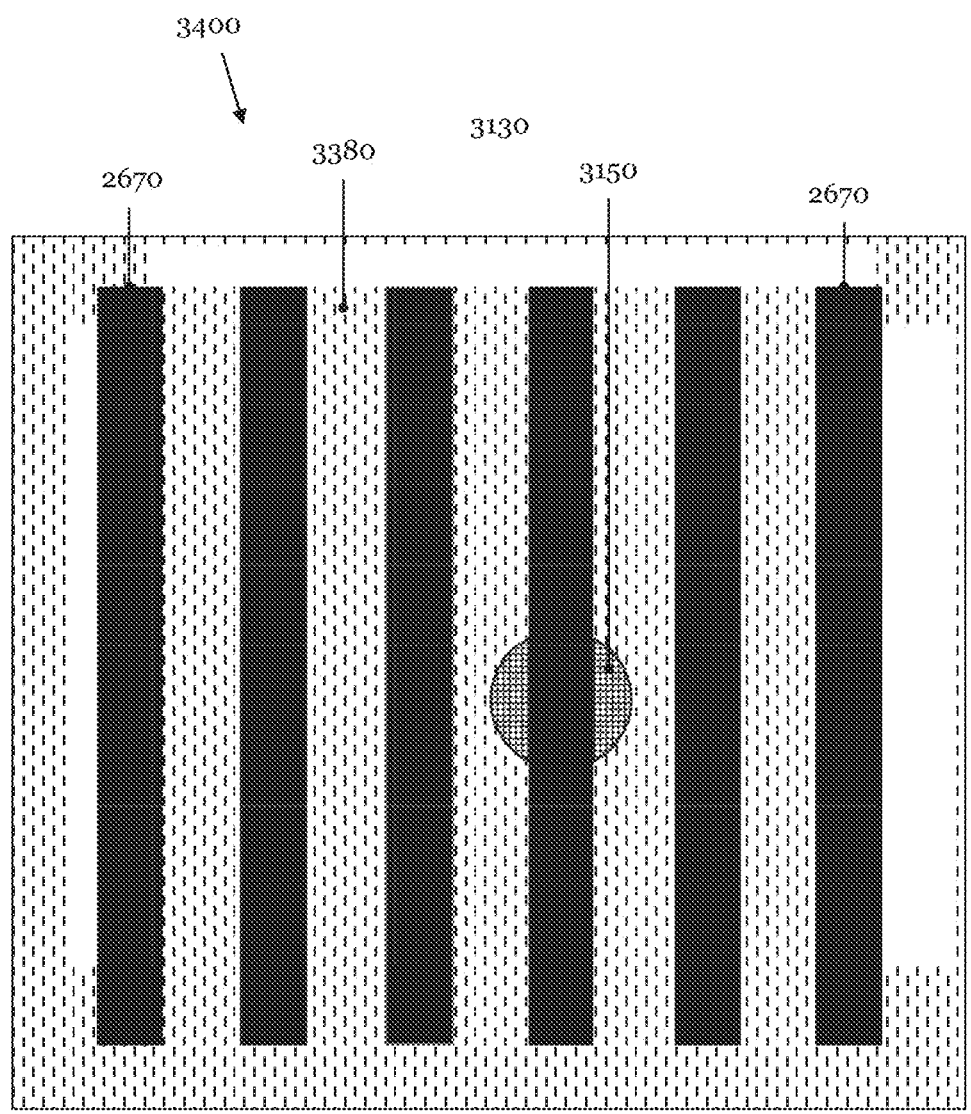
FIG. 34 illustrates the section of FIG. 33 after producing the pattern as provided by the design.
Figure 35:
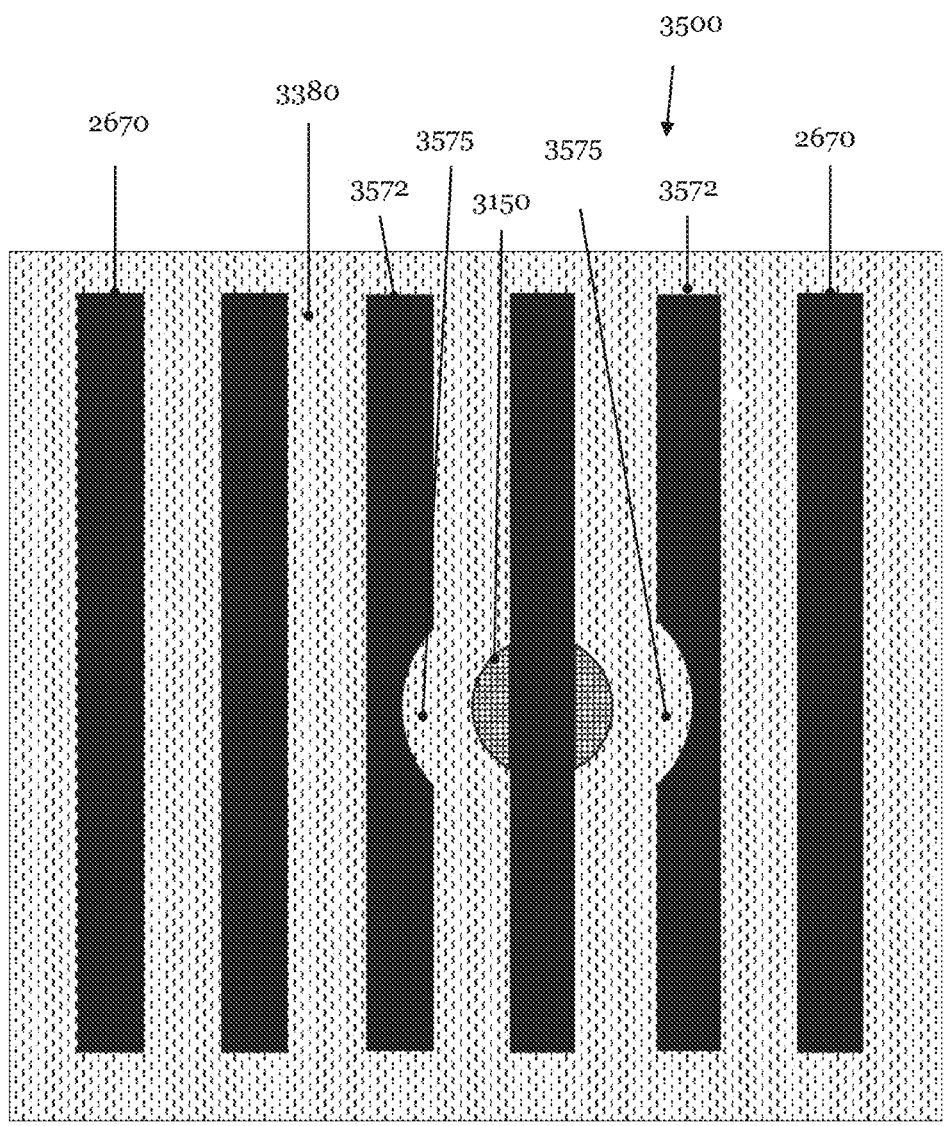
FIG. 35 shows the section of FIG. 34 after carrying out the compensational repair with the apparatus schematically specified in FIG. 22.

A second embodiment for compensating the defect 3020 in FIG. 30 is described on the basis of FIGS. 33 to 35. The compensation process explained in FIGS. 33 to 35 is carried out in two stages. In the first stage, one or more pixel arrangements 3380 are established, said pixel arrangements compensating the defect 3020 to the best possible extent while maintaining the pattern predetermined by the design, i.e., the L/S arrangement with the pattern elements 2470 to be produced. FIG. 33 elucidates the position of the displaced defect 3150 in respect of the L/S arrangement to be produced after introducing the pixel arrangements 3380 into the substrate of the mask blank 800, 900, 1000. The arrow 3130 symbolizes the displacement of the defect 3020 by the distance of half a half pitch in the +x-direction FIG. 34 shows the section 3300 of FIG. 33 after producing the L/S structure, provided by the design, with the produced pattern elements 2670. Since a pattern element 2470 does not completely cover the effective size of the displaced defect 3150, the defect 3150 will lead to a visible error on the wafer.

Therefore, the displaced defect 3150 is subject to a so-called compensational repair in the second step. The latter is carried out with the aid of the partial apparatus 2020 of the apparatus 2000. By use of a local EBIE process, explained in conjunction with the description of FIG. 22, locally absorbing material is removed from the pattern elements 3572 that surround the defect 3150. The reflection of EUV radiation of the parts 3575 of the pattern elements 3572 that have been freed from absorbing pattern material at least partly compensates the absorption of the parts of the displaced defect 3150 which are not covered by the pattern element 2670.

What is claimed is:

1. A method for compensating at least one defect of a mask blank, wherein the method comprises the following steps:
   a. obtaining data in respect of a position of the at least one defect of the mask blank;
   b. obtaining design data for pattern elements which should be produced on the mask blank;
   c. determining whether the at least one defect is arranged relative to a pattern element to be produced in such a way that it has no effect when exposing a wafer using the mask blank that is provided with the pattern element to be produced;
   d. otherwise, prior to forming the pattern elements on the mask blank, displacing on the mask blank the at least one defect in such a way that it has no effect when exposing the wafer using the mask blank that is provided with the pattern element to be produced; and
   e. locally modifying at least one pattern element in relation to design data before producing the modified pattern element on the mask blank.

2. The method of claim 1, wherein obtaining the data in respect of the position of the at least one defect comprises: analyzing the mask blank with a mask blank inspection tool and/or reading the data in respect of the position of the at least one defect from a memory.

3. The method of claim 1, wherein the data in respect of the position of the defect comprise: a position of maximum deviation from a predetermined variable and a lateral extent of the at least one defect.

4. The method of claim 1, wherein determining whether the at least one defect is arranged relative to a pattern element to be produced in such a way that it has no effect when exposing a wafer using the mask blank that is provided with the pattern element to be produced comprises: superimposing the design data of the pattern elements to be produced and the data in respect of the position of the at least one defect.

5. The method of claim 1, wherein displacing the at least one defect on the mask blank comprises: determining parameters of a vector which describes a displacement of the at least one defect in such a way that the latter has no effect.

6. The method of claim 1, wherein displacing the at least one defect comprises: introducing at least one pixel arrangement into a substrate of the mask blank.

7. The method of claim 1, further including the following step: determining at least one change relative to the design data of at least one pattern element to be produced for the purposes of compensating the at least one defect.

8. The method of claim 1, wherein determining the at least one change of the at least one pattern element to be produced comprises: determining parameters for an imaging transformation relative to the design data of the pattern elements to be produced.

9. The method of claim 8, wherein the imaging transformation comprises a linear imaging transformation and the parameters for the linear imaging transformation comprise at least one of: parameters for scaling relative to the design data the pattern elements to be produced, parameters for displacing relative to the design data the pattern elements to be produced, or parameters for rotating relative to the design data the pattern elements to be produced.

10. The method of claim 9, wherein carrying out the imaging transformation and displacing the at least one defect cause the at least one defect to have no effect when exposing a wafer using the mask blank that has been provided with the pattern element to be produced.

11. The method of claim 8, wherein determining the parameters of the imaging transformation and the parameters of a displacement of the at least one defect is implemented in a common optimization process.

12. The method of claim 8, further comprising the step of: producing the pattern elements provided with the imaging transformation on the mask blank after displacing the at least one defect.

13. The method of claim 7, wherein determining at least one change relative to the design data of at least one pattern element to be produced for the purposes of compensating the at least one defect comprises: locally modifying a contour of at least one pattern element to be produced.

14. The method of claim 13, further comprising the step of: producing the pattern elements provided with the imaging transformation on the mask blank before carrying out steps a. to d. of claim 1.

15. The method of claim 7, wherein determining the at least one change of the at least one pattern element to be produced comprises: determining parameters for an imaging transformation relative to the design data of the pattern elements to be produced and locally modifying a contour of at least one pattern element to be produced.

16. The method of claim 15, wherein determining the parameters of the imaging transformation, the parameters of a displacement of the at least one defect and the parameters for locally modifying a contour of at least one pattern element to be produced is implemented in a common optimization process.

17. The method of claim 1, further comprising the step of: locally modifying at least one pattern element produced on the mask blank such that the at least one defect has no effect when exposing a wafer using the mask blank that has been provided with the produced pattern element.

18. A computer program containing instructions which, when executed by a computer system, prompt the computer system to carry out the method steps of claim 1.

19. An apparatus for compensating at least one defect of a mask blank, the apparatus comprising:
  a. means for obtaining data in respect of a position of the at least one defect of the mask blank;
  b. means for obtaining design data for pattern elements which should be produced on the mask blank;
  c. means for determining whether the at least one defect is arranged relative to a pattern element to be produced in such a way that it has no effect when exposing a wafer using the mask blank that is provided with the pattern element to be produced;
  d. means for, prior to forming the pattern elements on the mask blank, displacing on the mask blank the at least one defect in such a way that it has no effect when exposing the wafer using the mask blank that is provided with the pattern element to be produced; and
  e. means for locally modifying at least one pattern element in relation to design data before producing the modified pattern element on the mask blank.

20. The apparatus of claim 19, wherein the apparatus is embodied to carry out a method comprising:
  obtaining data in respect of a position of the at least one defect of the mask blank;
  obtaining design data for pattern elements which should be produced on the mask blank;
  determining whether the at least one defect is arranged relative to a pattern element to be produced in such a way that it has no effect when exposing a wafer using the mask blank that is provided with the pattern element to be produced;
  otherwise, displacing the at least one defect on the mask blank in such a way that it has no effect when exposing the wafer using the mask blank that is provided with the pattern element to be produced; and
  locally modifying at least one pattern element in relation to design data before producing the modified pattern element on the mask blank.

* * * * *

UNITED STATES PATENT AND TRADEMARK OFFICE
CERTIFICATE OF CORRECTION

PATENT NO. : 11,385,539 B2  
APPLICATION NO. : 16/747818  
DATED : July 12, 2022  
INVENTOR(S) : Joachim Welte Page 1 of 2

It is certified that error appears in the above-identified patent and that said Letters Patent is hereby corrected as shown below:

On the Title Page

Column 2
Item (56) (Other Publications), Line 3, delete "Translation0" and insert -- Translation) --.

In the Specification

Column 2
Line 24, delete "782340-1782340-5," and insert -- 782340-1 – 782340-5 --.

Column 15
Line 31, delete "elements 60" and insert -- elements 760 --.

Column 17
Line 39, delete "AIM™" and insert -- AIMS™ --.

Column 20
Lines 30-31, delete "$|\Delta r|,|y| \leq 20$ nm" and insert -- $|\Delta x|,|\Delta y| \leq 20$ nm --.
Line 32, delete "$|\Delta r|,|y| \leq 100$ nm" and insert -- $|\Delta x|,|\Delta y| \leq 100$ nm --.

Column 21
Line 55, delete "$|\Delta x|,|\Delta y|$ 20 nm" and insert -- $|\Delta x|,|\Delta y| \leq 20$ nm --.

Column 22
Line 19 (Approx.), delete "$|\Delta r|,|\Delta y| \leq 20$ nm" and insert -- $|\Delta x|,|\Delta y| \leq 20$ nm --.
Lines 34-35, delete "$|\Delta r|,|\Delta y| \leq 30$ nm" and insert -- $|\Delta x|,|\Delta y| \leq 30$ nm --.
Lines 37-38, delete "$|\Delta t|,|\Delta y| = 100$ nm" and insert -- $|\Delta x|,|\Delta y| = 100$ nm --.
Line 48, delete "$|\Delta r|,|\Delta y| \leq 20$ nm" and insert -- $|\Delta x|,|\Delta y| \leq 20$ nm --.
Line 50, delete "$|\Delta r|,|\Delta y| \leq 50$ nm" and insert -- $|\Delta x|,|\Delta y| \leq 50$ nm --.

Signed and Sealed this  
Eighth Day of November, 2022

Katherine Kelly Vidal  
*Director of the United States Patent and Trademark Office*

CERTIFICATE OF CORRECTION (continued)
U.S. Pat. No. 11,385,539 B2

Line 52, delete "$|\Delta r|,|\Delta y| = 100$ nm" and insert -- $|\Delta x|,|\Delta y| = 100$ nm --.
Line 63, delete "$40\ nm \leq |\Delta r|,$" and insert -- $40\ nm \leq |\Delta x|,$ --.

Column 24
Lines 9-10, delete "not shown in FIG. 21)" and insert -- (not shown in FIG. 21) --.

Column 25
Line 22, delete "(AM)" and insert -- (AFM) --.
Line 29, delete "(SEEM)" and insert -- (SEM) --.

Column 27
Line 14, delete "ozone (03)" and insert -- ozone ($O_3$) --.

Column 31
Line 35, delete "+x-direction" and insert -- +x-direction. --.